(12) United States Patent
Fujita et al.

(10) Patent No.: US 7,105,270 B2
(45) Date of Patent: Sep. 12, 2006

(54) FLUOROALIPHATIC GROUP-CONTAINING COPOLYMER

(75) Inventors: Kazuo Fujita, Shizuoka-Ken (JP); Shiro Tan, Shizuoka-Ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 93 days.

(21) Appl. No.: 10/353,025

(22) Filed: Jan. 29, 2003

(65) Prior Publication Data

US 2003/0207202 A1    Nov. 6, 2003

(30) Foreign Application Priority Data

Jan. 31, 2002  (JP)  ............................ 2002-022756
Feb. 6, 2002   (JP)  ............................ 2002-029284

(51) Int. Cl.
*G03F 7/004*   (2006.01)
*G03F 7/00*    (2006.01)

(52) U.S. Cl. .................. 430/270.1; 430/278.1
(58) Field of Classification Search ................ 526/245, 526/248; 430/270.1–278.1
See application file for complete search history.

(56) References Cited

U.S. PATENT DOCUMENTS

| | | | | |
|---|---|---|---|---|
| 2,642,416 A | * | 6/1953 | Ahlbrecht et al. | 526/245 |
| 3,102,103 A | * | 8/1963 | Ahlrecht et al. | 526/245 |
| 3,458,348 A | * | 7/1969 | Sherman | 428/422 |
| 3,654,244 A | * | 4/1972 | Pittman et al. | 526/243 |
| 4,822,713 A | * | 4/1989 | Nishioka et al. | 430/175 |
| 5,334,681 A | * | 8/1994 | Mueller et al. | 526/243 |
| 6,156,860 A | * | 12/2000 | Tanaka et al. | 526/245 |
| 2002/0055058 A1 | | 5/2002 | Sorori et al. | |

FOREIGN PATENT DOCUMENTS

EP   0114894 A1 *  8/1984
WO   WO 00/41738 A1 * 7/2000

OTHER PUBLICATIONS

McGraw-Hill Dictionary of Scientific and Technical Terms, Fifth Edition, International Edition, Sybil P. Parker, ed in Chief, Unite States, McGraw-Hill, Inc, 1994, p. 1432, "paint base" and "paint".*
"Paint" , Webster's Third New International Dictionary of the English Language Unabridged, Merriam-Webster Inc, Springfield, Massachusetts, USA, 1981, p. 1621.*
Kirk-Othmer Encyclopedia of Chemical Technology, fourth ed, vol. 17,John Wiley & Sons, New York, NY 1996, pp. 1049, 1068-1069 vol. 17 in "Architectural" under "Paint" written by Aurthur A. Leman, Rohm and Haas Company.*
"Word iQ", Photoresist, one page at http://www.wordiq.com/definition/Photoresist , from WIkipedia, printed out before Aug. 5, 2004.*
Taggi et al , "Printing Processes, 7. Image Duplication and Output" from online Article posted Dec. 4, 2000 from Kirk-Othmer Encyclopedia of Chemical Technology, John Wiley & Sons, Inc, 1996, 22 pages.*
"Plate" from The American Heritage Dicitiona, Second College Edition, Houghton Mifflin Company, Boston, MA, 1982, p. 94.*
AN 1991:614919, CAPLUS, Copyright 2004 ACS on STN, Entry for family of documents including US 5334681, 2 pages, entered STN Nov. 15, 1991.*

(Continued)

*Primary Examiner*—Cynthia Hamilton
(74) *Attorney, Agent, or Firm*—Buchanan Ingersoll PC

(57) ABSTRACT

The present invention provides a copolymer comprising repeating units derived from (A) at least one fluoroalkyl (meth) acrylate represented by the following general formula (I) or (II):

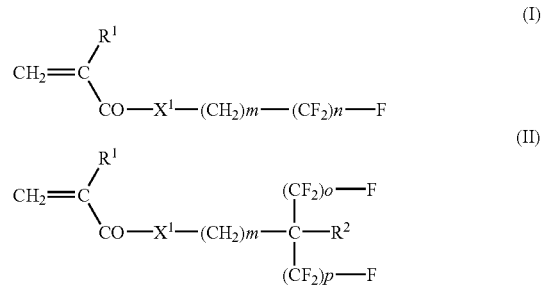

wherein, $X^1$ represents —O— or —$NR^3$—; $R^1$ represents —H or —$CH_3$; $R^3$ represents a hydrogen atom, a substituted or unsubstituted alkyl group having 1 to 12 carbon atoms, a substituted or unsubstituted cycloalkyl group having 3 to 12 carbon atoms, a substituted or unsubstituted aryl group having 6 to 12 carbon atoms or a substituted or unsubstituted aralkyl group having 7 to 24 carbon atoms; $R^2$ represents H or F; m is an integer ranging from 0 to 10; n is an integer of 2 or 3; and o and p each represents an integer of 1 or 2, and (B) at least one polyoxyalkylene group-containing ethylenically unsaturated monomer, and also provides an image-forming composition, a presensitized plate useful for preparing a lithographic printing plate, a paint composition or a photo resist composition comprising the copolymer. The fluoroaliphatic group-containing copolymer can provide a coating composition capable of simultaneously satisfying the requirements for the ability of a coating liquid to wet the base material and the uniform coating ability upon the application of the liquid and the post-processing aptitudes such as the re-coating ability of the coated film and developing ability as well as the foaming ability of the coating liquid.

4 Claims, No Drawings

OTHER PUBLICATIONS

RN 134462-38-7, REGISTRY, copyright 2004 ACS on STN, one page.*

RN 134503-49-4, REGISTRY, copyright 2004 ACS on STN, two pages.*

STN Columbus, 2 page search transcript of Registry file of American Chemical Society of term "Hexafluoroisopropyl methacrylate/cn" yielding RN 3063-94-3 as answer. search performed by Examiner on Aug. 9, 2004.*

Polymer Handbook, 2nd ed., J. Brandrup, Wiley Interscience, (1975), chapter 2, pp. II-139, II-176, II-177 and II-180.*

* cited by examiner

FLUOROALIPHATIC GROUP-CONTAINING COPOLYMER

BACKGROUND OF THE INVENTION

The present invention relates to a high molecular weight compound carrying, on side chains, a fluoroaliphatic group suitably used in fields of coating in which high uniformity is required, for instance, a variety of fields of paints and varnishes in which a coated film comprising several layers should have high surface smoothness, or fields of coating, which require precise application and processing and likewise require the use of a high speed and high shearing-coating method such as a spin coating or spray coating technique, for instance, photolithography processes, which make use of photo resists sensitive to radiant rays such as ultraviolet rays, far ultraviolet rays, excimer laser light and X-rays and more specifically, processes for manufacturing semiconductors such as LSI and IC, processes for producing substrate for liquid crystals and thermal heads, processes for producing PS plates and other photo fabrication processes.

Moreover, the present invention relates to a high molecular weight compound carrying, on side chains, a fluoroaliphatic group suitably used in cosmetics, fiber-processing agents, medical supplies, oxygen-rich films and additives for a variety of lubricants, or as various agents such as paint removers, resist-peeling agents, foaming agents for washing and surface-modifiers.

The present invention further relates to an image-forming composition comprising the foregoing high molecular weight compound carrying, on side chains, a fluoroaliphatic group (hereunder also referred to as "fluorine (atom)-containing polymer") and a novel presensitized plate useful for preparing a lithographic printing plate, whose image-forming layer comprises the foregoing fluorine-containing polymer and more specifically to a presensitized plate useful for preparing a lithographic printing plate, which can provide uniform surface quality without causing any trouble such as foaming during production of lithographic printing plates and which can provide a lithographic printing plate excellent in the developing ability and ink-receptivity.

Recently, there have been required for coated films in a variety of forms from thin films to thick films in a various fields of coating industries and there have thus been remarkable development in techniques for more uniformly and efficiently applying such films and machinery and tools.

In these fields of various coating techniques, there have conventionally been used various kinds of surfactants called leveling agents such as hydrocarbon-type, silicone-type and fluorine atom-containing type surfactants. Among them, the fluorine atom-containing surfactants have widely been used because of their high ability of lowering surface tension and a low probability of staining after the application.

The fluorine atom-containing surfactants can efficiently reduce the surface tension of a coating liquid upon applying the same and they are effective in the improvement of the ability of the liquid to wet substrates and the uniform coating ability. However, they have low surface energy and accordingly reduce the surface energy of the coated layer and as a result, this often leads to uneven distribution of the applied film on the air boundary side. As a result of such tendency of the conventional fluorine atom-containing surfactant to cause uneven distribution of the applied film, the surfactant forms a low surface energy surface to thus inhibit the re-coating properties of the film (the ability of receiving a coating liquid on the existing coated film in layers) and the surfactants make the coated film surface highly water repellent and/or oil repellent to thus considerably inhibit the development with an aqueous liquid or a solvent type liquid or the surface-wetting ability of a washing liquid for partially or completely washing the resulting film (these aptitudes will hereunder be referred to as "aptitude for post-process").

Conventionally, the ability of a coating liquid to wet a substrate and the ability thereof to uniformly coat the surface upon the application of the coating liquid and the aptitudes for post-process such as re-coating properties and the developing ability are considered to be in a reciprocal relationship. More specifically, when using a fluorine atom-containing surfactant ensuring high wettability and uniform coating ability upon the application of a coating liquid, the aptitudes for post-process are often deteriorated.

For this reason, the added amount of such a fluorine atom-containing surfactant is controlled depending on the purposes or surfactants other than the fluorine atom-containing ones are used although they do not provide sufficient wettability and uniform coating ability. However, there has not yet been developed any particularly effective means for eliminating the foregoing reciprocal relation.

Moreover, the conventional fluorine atom-containing surfactant suffers from various problems such that it causes foaming attributable to the surfactant per se. Therefore, it takes a long time period for antifoaming operations and this in turn leads to the deterioration of working efficiency prior to the application of a coating liquid and the surfactant becomes a cause of the formation of craters, pinholes and fish eyes (cissing like fish eyes) because of the foams after the coating operations. On the other hand, the antifoaming ability has been considered to be an important factor from the viewpoint of productivity of photo resists. In general, a photo resist is filled in a bottle through a nozzle. If the resist undergoes vigorous foaming, however, it flows over the opening of the bottle and the charging operation is quite difficult. Accordingly, in case of the conventional photo resist, which is liable to cause foaming, the charging speed thereof should sufficiently be reduced to prevent any foaming of the resist.

Further, a problem arises such that the conventional resist composition is liable to form wet portions remaining on the end face of a wafer as the diameter of the wafer increases, for some years ahead. For this reason, there has been desired for the development of a photo resist composition, which can provide a uniform coated film, has a good antifoaming ability and never leaves any uncoated portion.

Moreover, it is quite important to treat the surface of a variety of materials when processing them in order to protect the quality of the materials. To this end, a variety of varnishes and paints have been developed in the field of construction materials. In addition, cosmetics capable of forming a film having water retention characteristics may be considered to be a kind of surface-treating agents from such a standpoint. Most of materials commonly used in such surface-treatments are high molecular weight compounds and insoluble in water. This is because it is intended to isolate the material from aqueous components by the action of such a coated film in most of cases. For this reason, it is common that a water-insoluble polymer is dispersed in, for instance, an aqueous carrier or dissolved in, for instance, an organic solvent prior to practical use. However, the composition loses its dispersibility due to, for instance, agglomeration in, for instance, dispersions in aqueous carriers and it cannot be used at all, while in the organic solvent systems, there is a restriction in the use of organic solvents per se. In particular, in the field of cosmetics applied to the skin, hair and nails, it is an essential requirement for the cosmetics that they may be applied thereto using an aqueous carrier. More specifically, there has been desired for the development of a polymer, which may uniformly be dissolved in the aqueous carrier and is capable of forming a film having excellent water resistance after the application thereof.

In addition, the following problems have been recognized in the field of lithographic printing plates: The presensitized plate for preparing a lithographic printing plate has a structure, which comprises a substrate provided thereon with an image-forming layer and a typical production process therefor comprises the steps of applying upper layers such as an image-forming layer consisting of an image-forming composition dispersed or dissolved in an organic solvent and, if desired, a protective layer onto the surface of a substrate, which has been subjected to appropriate surface treatments and to which an under coat layer, a back coat layer or the like have been applied in advance; and then drying the upper layers. In addition, a typical plate-making process comprises the steps of surface exposure through an image-carrying mask according to the contact or projection system, or direct exposure by scanning and/or modulation of electromagnetic waves on the basis of the image information outputted from a computer, to thus cause or induce imagewise changes in the physical properties of the image-forming composition on the substrate; removal of the image-forming composition on the non-image areas (development) and optional hydrophilization, conversion into ink receptive areas and/or formation of a protective layer to thus give a lithographic printing plate having non-image areas consisting of the hydrophilic substrate surface layer and image areas consisting of the surface layer of the hydrophobic composition. The lithographic printing plate thus prepared receives dampening water on the hydrophilic non-image areas and receives ink on the lipophilic image areas in the typical printing process to thus form images on the surface. The resulting ink images are directly or indirectly transferred to a desired printing medium to thus give printed matters.

As to the image-forming layer used herein, there have already been known a variety of techniques and examples of such image-forming layers are negative type ones in which soluble components are converted into insoluble ones through the exposure as the physical property change and positive type ones in which insoluble components are converted into soluble ones through the exposure as the physical property change; or image-forming layers, which make use of an optical reaction or a heat mode process for ensuring physical property changes; or those in which images are formed through the thermosensitive recording system. All of these image-forming layers suffer from common technical problems to be solved irrespective of the kinds thereof, in order to obtain a presensitized plate useful for preparing a lithographic printing plate, which is highly useful. More specifically, (1) the image-forming layer should be highly uniform; (2) the image areas should be highly hydrophobic and the non-image areas should easily be removed through the development. The foregoing manufacturing processes mainly determine the uniformity of the image-forming layer from the technical standpoint. In this respect, a presensitized plate insufficient in the uniformity is not preferred since such a presensitized plate never provides any printing plate, which satisfies such an essential requirement that it can stably provide a large number of uniform printed matters carrying images of high quality. Moreover, it is also important that the image area is highly hydrophobic since the high hydrophobicity may improve the resistance to developers in the plate-making process to thus achieve high resolution and it likewise ensures sufficient printing durability and ink-receiving ability of the resulting printing plate in the printing process. In this respect, however, the high hydrophobicity of the image area may result in the reduction of the solubility of the image area in an alkaline aqueous solution, which is a developer currently used in this field and therefore, it may lead to undesirable results such as insufficient development of the non-image areas and formation of sludge components in the developer. More specifically, the hydrophobicity of the image area and the removability of the non-image area are reciprocal to one another. The development of a technique, which can simultaneously satisfy these requirements, is quite difficult, but this is a quite important problem to be solved.

It has been known that it is quite useful to use, as the image-forming composition, one comprising a polymeric compound carrying fluoroaliphatic groups to achieve the foregoing object. For instance, Japanese Un-Examined Patent Publication (hereunder referred to as "J.P. KOKAI") Sho 54-135004 discloses effects attained by the improvement of the uniformity of the image-forming layer. Moreover, J.P. KOKAI Sho 62-170950, Hei 8-15858 and 2000-19724 disclose the usefulness of a copolymer comprising a monomer unit having a fluoroaliphatic group and a monomer unit having a specific functional group. These techniques simply relate to the improvement of the prior arts, which disclose the use of polymeric compounds having fluoroaliphatic groups by further selection of substituents for the polymeric compounds and they relate to techniques for lightening the adverse effects of the fluoroaliphatic group-containing polymer on the plate-making process and/or printing process or conversely techniques for effectively using such a polymer. Specifically, J.P. KOKAI Sho 62-170950 discloses the further improvement of the uniformity-developing function of films due to the improvement of the surface activity; J.P. KOKAI Hei 8-15858 discloses the elimination of the problem concerning the delayed developing ability due to hydrophobicity; and J.P. KOKAI 2000-19724 discloses the effect of high contrast image formation by the simultaneous satisfaction of the requirements for the hydrophobicity of the image area and the removability of the non-image area while making the most use of the hydrophobicity and the force of orientation. Among such effects due to the polymeric compounds having fluoroaliphatic groups, the uniformity-developing ability of a film would be due to the surface activation ability of the fluoroaliphatic group-containing polymeric compound or an ability of the polymeric compound to lower the surface tension of a dispersion of an image-forming composition in an organic solvent used in the presensitized plate manufacturing process. Moreover, other effects of the polymeric compounds having fluoroaliphatic groups may be attributable to the high hydrophobicity of the polymeric compound included in the image-forming layer of a presensitized plate useful for preparing a lithographic printing plate and the ability thereof to cause orientation, uneven distribution and/or localization on the surface of the image-forming layer. In other words, it is possible to make, relatively high, the distribution of the fluoroaliphatic group-containing polymeric compound in the proximity to the surface of the image-forming composition and therefore, it would be recognized that particularly high hydrophobicity can be imparted to the surface while maintaining the removability of the non-image area through development. Furthermore, the fluoroaliphatic group-containing polymeric compound may be improved by various methods other than the selection of copolymerizable components. For instance, J.P. KOKAI 2000-187318 discloses that an image-forming material excellent in the discrimination of the solubility between the image and non-image areas by the use of a polymer prepared using a monomer unit having at least two fluoroaliphatic groups in the molecule.

As has been described above, the use of an image-forming layer containing a fluoroaliphatic compound is effective for eliminating the foregoing technical problems (1) and (2), which are common to the image-forming layers for presensitized plates for lithographic printing plates. However, the effect of the compound is still insufficient and there has been desired for the further improvement of the compound.

For instance, in case where a positive image-forming layer is used, it has been desired for obtaining good printed matters to develop a presensitized plate capable of providing images having high discrimination between the image and non-image areas or having a high gradation (high contrast) from the viewpoint of image reproducing ability and anti-scratch characteristics, having high sensitivity, free of the formation of any indistinct image during printing and satisfying the requirements for the stability to an incandescent and the development latitude. However, there has not yet been developed any satisfactory technique.

In this respect, the expression "an image is low contrast" means that when a presensitized plate is exposed to light rays through a step wedge and then developed, the difference between the step number at which images begin to remain and the step number at which the film completely remains is large. On the other hand, the expression "an image is high contrast" means that when a presensitized plate is exposed to light rays through a step wedge and then developed, the difference between the step number at which images begin to remain and the step number at which the film completely remains is small.

Moreover, the term "formation of an indistinct image during printing" is caused when the litho-film rises due to the gas generated through the decomposition of the light-sensitive material and this makes the complete contact exposure impossible. In general, the higher the contrast of the image, the easier the elimination of indistinct images formed during printing, if the clear sensitivity is set at the same level. In addition, the term "stability to an incandescent" means the stability of the image observed when a printing plate is exposed to light rays from an incandescent such as those emitted from a fluorescent lighting and the higher the contrast of the image, the higher the stability to an incandescent. Incidentally, the "step wedge" is a tanzaku-like film whose density changes at a rate of 0.15 per step and used for estimating the relation between the exposure value and the amount of remaining film of the light-sensitive layer observed after the exposure and the subsequent development. Moreover, the term "clear sensitivity" means the sensitivity observed at an instance when images begin to form after the exposure and the subsequent development. The term "development latitude" herein used means a measure used for evaluating the extent of the change in the sensitivity of images after the exposure and the subsequent development when the developer undergoes a concentration change and the smaller the sensitivity change, the higher the development latitude.

Moreover, in case of a photopolymerizable printing plate typical of the negative lithographic printing plate comprising a photopolymerization initiator and a monomer having a polymerizable double bond, in particular, a laser direct-exposure type printing plate having high sensitivity to laser beams falling within the visible region, the gradation thereof has conventionally been low contrast and therefore, it is liable to cause fog due to scattered light rays and/or reflected light rays when imagewise exposing the same in an inner drum type laser plate setter in which the printing plate is exposed to light while the plate is fixed and a mirror is rotated at a high speed. It is necessary to expose light rays having a high energy in order to improve the printing durability of the printing plate, but the exposure value cannot be increased since the fog attributable to scattered light rays and/or reflected light rays becomes increasingly high. Accordingly, it is necessary to suppress the occurrence of fog due to scattered light rays and/or reflected light rays to improve the printing durability. Converting the gradation of the light-sensitive material into high contrast can solve this problem. This is because the imagewise exposure is carried out by irradiation with a laser beam within a very short time on the order of about 1 μsec per dot, while the fog due to scattered light rays and/or reflected light rays is such a phenomenon that a light-sensitive material is optically hardened through irradiation thereof with very weak light over a long period of time on the order of several minutes. Therefore, if the gradation of a light-sensitive material is high contrast, it is difficult to optically harden the light-sensitive material and the area exposed to scattered and/or reflected light rays is removed through development and any fog is not formed. In the light-sensitive lithographic printing plate on which images are depicted using, for instance, an infrared laser beam, the discrimination between the image and non-image areas is low or the gradation thereof is low (low contrast) and accordingly, it suffers from problems in that images on the portion touched with bare hands are slipped and that the resistance to defects is low.

SUMMARY OF THE INVENTION

Accordingly, it is an object of the present invention to provide a fluoroaliphatic group-containing polymeric compound, which can provide a coating composition capable of simultaneously satisfying the requirements for the ability of a coating liquid to wet the base material and the uniform coating ability upon the application of the liquid and the post-processing aptitudes such as the re-coating ability of the coated film and developing ability as well as the foaming ability of the coating liquid.

It is another object of the present invention to provide a fluoroaliphatic group-containing polymeric compound, which is useful as cosmetics, paints and varnishes and fiber-treating agents, which is uniformly dissolved in an aqueous carrier and which can provide a film having excellent water resistance after the application.

It is a further object of the present invention to construct a technique capable of solving the foregoing technical problems (1) and (2) associated with the lithographic printing plate to an extent higher than that achieved by the conventional techniques and more specifically to provide an image-forming composition comprising an image-forming layer whose uniformity and solubility and dispersibility in developer are improved and which can provide high contrast image-forming ability without reducing any sensitivity as well as a presensitized plate useful for preparing a lithographic printing plate.

The inventors of this invention have conducted various studies to solve the foregoing problems and have found that the foregoing object can be accomplished by providing a copolymer comprising repeating units derived from (A) at least one fluoroalkyl (meth) acrylate represented by the following general formula (I) or (II):

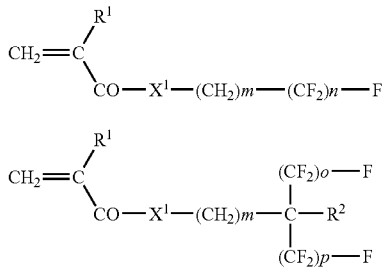

wherein, $X^1$ represents —O— or —NR$^3$—; $R^1$ represents —H or —CH$_3$; $R^3$ represents a hydrogen atom, a substituted or unsubstituted alkyl group having 1 to 12 carbon atoms, a substituted or unsubstituted cycloalkyl group having 3 to 12 carbon atoms, a substituted or unsubstituted aryl group having 6 to 12 carbon atoms or a substituted or unsubstituted aralkyl group having 7 to 24 carbon atoms; $R^2$ represents H or F; m is an integer ranging from 0 to 10; n is an integer of 2 or 3; and o and p each represents an integer of 1 or 2, and (B) at least one polyoxyalkylene group-containing ethylenically unsaturated monomer.

The inventors of this invention have further found that a presensitized plate for preparing a lithographic printing plate characterized in that it comprises an image-forming layer containing a fluoroaliphatic group-containing copolymer prepared by copolymerizing at least monomers (A) and (B) (as will be detailed below) permits the solution of the foregoing technical problems (1) and (2) and have thus completed the present invention. More specifically, the presensitized plate for preparing a lithographic printing plate is characterized in that it comprises a substrate provided thereon with an image-forming layer containing a fluoroaliphatic group-containing copolymer prepared by copolymerizing at least the following monomers (A) and (B):

(A) Fluoroalkyl (meth) acrylate represented by the following general formula (I) or (II):

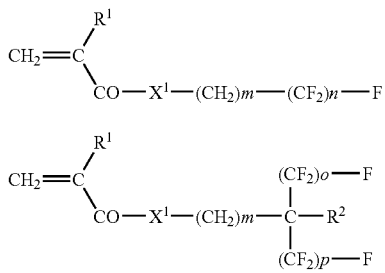

wherein, $X^1$ represents —O— or —NR$^3$—; $R^1$ represents —H or —CH$_3$; $R^3$ represents a hydrogen atom, a substituted or unsubstituted alkyl group having 1 to 12 carbon atoms, a substituted or unsubstituted cycloalkyl group having 3 to 12 carbon atoms, a substituted or unsubstituted aryl group having 6 to 12 carbon atoms or a substituted or unsubstituted aralkyl group having 7 to 24 carbon atoms; $R^2$ represents H or F; in is an integer ranging from 0 to 10; n is an integer of 2 or 3; and o and p each represents an integer of 1 or 2;

(B) Polyoxyalkylene group-containing ethylenically unsaturated monomer.

The inventors of this invention have found that the use of such a fluoroaliphatic group-containing copolymer permits the preparation of a positive light-sensitive resin composition capable of, for instance, forming a film having uniform surface condition without being accompanied by any surface abnormality due to the foaming during the preparation of a film and having excellent solubility and/or dispersibility in a developer without causing any reduction of sensitivity.

It has also been proved that the addition of the specific fluorine atom-containing polymer defined in the present invention permits not only the improvement of the foregoing surface quality and solubility in a developer in case of the negative presensitized plate for preparing a lithographic printing plate, but also the improvement of the gradation and that the resulting presensitized plate, in particular, a laser beam-sensitive photopolymerizable printing plate is highly sensitive to laser beams, excellent in the antifogging properties against scattered and reflected light rays and can provide a printing plate having high printing durability.

Moreover, in a thermosensitive presensitized plate for preparing a lithographic printing plate, the addition of the specific fluorine atom-containing polymer of the present invention permits not only the improvement of the foregoing surface quality and solubility in a developer, but also the production of a presensitized plate in which the images have high strength and any image-slipping is not caused even at the portion touched with the bare hands and which is improved in the stability or resistance to defects.

Further, the present invention relates to an image-forming composition comprising the copolymer described above.

Also, the present invention relates to a paint composition or a photo resist composition comprising the copolymer described above.

BEST MODE FOR CARRYING OUT THE INVENTION (Fluoroaliphatic Group-Containing Polymeric Compound)

The polymeric compound carrying, on the side chains, fluoroaliphatic groups (in the specification, the polymer is also referred to as "fluorine atom-containing polymer") used in the present invention will now be described in detail below.

The fluorine atom-containing polymer used in the present invention is a polymer satisfying the requirements (A) and (B) specified below.

(A) Fluoroalkyl (meth) acrylate represented by the following general formula (I) or (II):

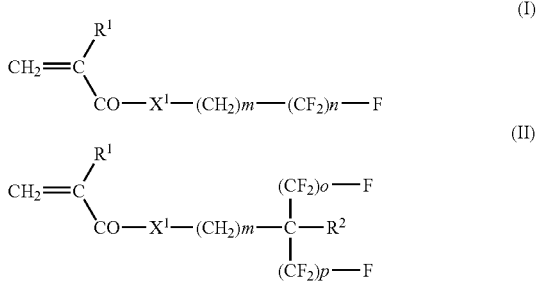

wherein, $X^1$ represents —O— or —NR$^3$—; $R^1$ represents —H or —CH$_3$; $R^3$ represents a hydrogen atom, a substituted or unsubstituted alkyl group having 1 to 12 carbon atoms, a substituted or unsubstituted cycloalkyl group having 3 to 12 carbon atoms, a substituted or unsubstituted aryl group having 6 to 12 carbon atoms or a substituted or unsubstituted aralkyl group having 7 to 24 carbon atoms; $R^2$ represents H or F; m is an integer ranging from 0 to 10; n is an integer of 2 or 3; and o and p each represents an integer of 1 or 2.

Examples of substituents for the foregoing groups include hydroxyl group, halogen atoms, alkyl groups (preferably those having 1 to 12 carbon atoms), alkoxy groups (preferably those having 1 to 12 carbon atoms), aryl groups (preferably those having 6 to 12 carbon atoms), sulfamoyl group and carboxyl groups.

The substituent $R^3$ is preferably a hydrogen atom, an alkyl group having 1 to 6 carbon atoms and more preferably a hydrogen atom or an alkyl group having 1 to 4 carbon atoms.

The term "aryl group" used herein has a meaning commonly used in this art. Specific examples thereof are those derived from aromatic compounds such as phenyl groups, tolyl groups, xylyl groups, biphenylyl groups, naphthyl groups, anthryl groups and phenanthryl groups.

Specific examples of the acrylates are compounds listed below. These compounds are put on the market and are commercially available from, for instance, Daikin Fine Chemical, Azumax, Hydras Chemical, Central Yakuhin and Wako Pure Chemical Co., Ltd.

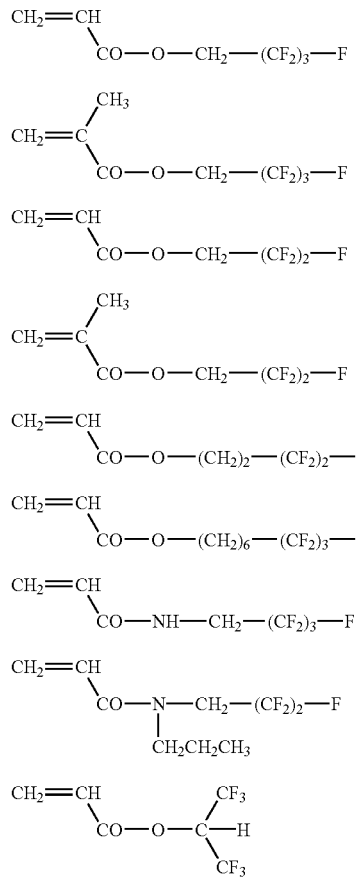

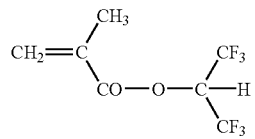

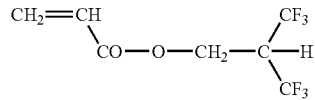

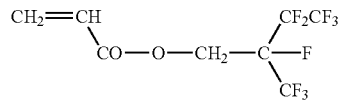

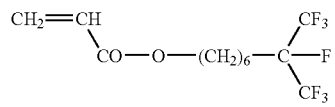

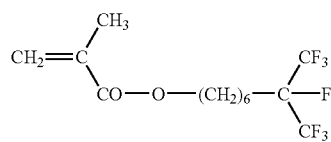

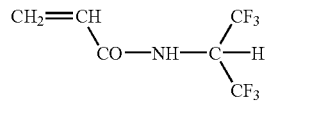

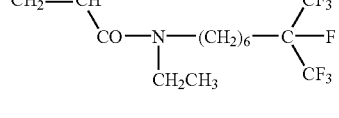

Then the polyoxyalkylene group-containing ethylenically unsaturated monomer (B) in the fluorine atom-containing polymer used in the present invention will be described in detail below.

The "polyoxyalkylene group-containing ethylenically unsaturated monomer" used herein is not particularly restricted inasmuch as it is a copolymerizable monomer compound comprising an ethylenically unsaturated group and a polyoxyalkylene group in the molecule. The ethylenically unsaturated group usable herein is suitably a (meth) acryl ester group or a group similar thereto from the viewpoint of easy availability of raw materials, compatibility to components incorporated into a variety of coating compositions, an ability of easily controlling such compatibility or polymerizability.

The polyoxyalkylene group may be represented by the formula: $(OR)_x$, wherein R represents an alkylene group having 2 to 4 carbon atoms and preferably —$CH_2CH_2$—, —$CH_2CH_2CH_2$—, —$CH(CH_3)CH_2$—, —$CH_2CH_2CH_2CH_2$— or —$CH(CH_3)CH(CH_3)$—. x is a positive integer, preferably an integer ranging from 2 to 50 and more preferably an integer ranging from 3 to 30.

In case where x is an integer of not less than 2, the plurality of substituent R may be the same or different. More specifically, the oxyalkylene units present in the foregoing poly(oxyalkylene) group may be composed of only the same oxyalkylene units as in the poly(oxypropylene) or composed of at least two different oxyalkylene units regularly or randomly linked together such as a group comprising oxypropylene unit and oxyethylene unit linked together.

The terminal atom or group of the poly(oxyalkylene) chain may be a hydrogen atom or any other group, but preferably a hydrogen atom, an alkyl group (preferably that having 1 to 20 carbon atoms), an allyl group (preferably that having 1 to 20 carbon atoms) or an aryl group (preferably that having 6 to 10 carbon atoms). The aryl group may have a substituent such as an alkyl group (for instance, that having 1 to 10 carbon atoms) or a halogen atom.

The poly(oxyalkylene) chain may be one linked through one or more chains (such as —CONH—Ph—NHCO— (Ph represents a phenylene group) or —S—). The chain-bonding site may have a valency of 3 or higher to form a branched chain-like oxyalkylene unit.

The molecular weight of the poly(oxyalkylene) group including the chain-bonding site preferably ranges from 250 to 3000.

Examples of the polyoxyalkylene group-containing ethylenically unsaturated monomers (B) used in the present invention are those represented by the following general formula (III):

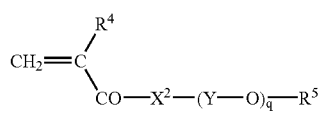

(III)

Wherein $X^2$ represents —O— or —$NR^6$—. Y represents a substituted or unsubstituted alkylene group having 1 to 5 carbon atoms. $R^4$ represents —H or —$CH_3$. $R^5$ represents a hydrogen atom, a substituted or unsubstituted alkyl group having 1 to 12 carbon atoms, a substituted or unsubstituted cycloalkyl group having 3 to 12 carbon atoms, a substituted or unsubstituted aryl group having 6 to 12 carbon atoms or a substituted or unsubstituted aralkyl group having 7 to 24 carbon atoms. $R^6$ represents a substituted or unsubstituted alkyl group having 1 to 12 carbon atoms, a substituted or unsubstituted cycloalkyl group having 3 to 12 carbon atoms, a substituted or unsubstituted aryl group having 6 to 12 carbon atoms or a substituted or unsubstituted aralkyl group having 7 to 24 carbon atoms. q is a positive integer. When q is not less than 2, a plurality of substituents Y may be the same or different.

Examples of substituents for the foregoing groups include hydroxyl group, halogen atoms, alkyl groups (preferably those having 1 to 12 carbon atoms), alkoxy groups (preferably those having 1 to 12 carbon atoms), aryl groups (preferably those having 6 to 12 carbon atoms), sulfamoyl group and carboxyl groups.

In Formula (III), Y preferably represents a linear or branched alkylene group having 2 to 4 carbon atoms and q preferably ranges from 2 to 50 and more preferably an integer ranging from 3 to 30.

Poly(oxyalkylene) acrylate and methacrylate listed above as specific examples of the polyoxyalkylene group-containing ethylenically unsaturated monomer used in the present invention may be prepared by reacting commercially available hydroxy poly(oxyalkylene) materials such as those sold under the trade name of "Pluronic" (available from Asahi Denka Kogyo K.K.), "Adeka Polyether" (available from Asahi Denka Kogyo K.K.), "Carbowax" (available from Glyco Products), "Titon" (available from Rohm and Haas Company) and P.E.G. (available from Dai-ichi Kogyo Seiyaku Co., Ltd.) with acrylic acid, methacrylic acid, acryl chloride, methacryl chloride or acrylic acid anhydride according to any known method. Alternatively, it is also possible to use, for instance, poly(oxyalkylene) diacrylate prepared according to the known method.

Examples of such commercially available monomers are polyoxyalkylene glycol mono (meth) acrylate having a terminal hydroxyl group prepared by Nippon Oil and Fats Co., Ltd. such as Blemmer PE-90, Blemmer PE-200, Blemmer PE-350, Blemmer AE-90, Blemmer AE-200, Blemmer AE-400, Blemmer PP-1000, Blemmer PP-500, Blemmer PP-800, Blemmer AP-15, Blemmer AP-400, Blemmer AP-550, Blemmer AP-800, Blemmer 50PEP-300, Blemmer 70PEP-350B, Blemmer AEP Series, Blemmer 55PEP-400, Blemmer 30PEP-800, Blemmer 55PEP-800, Blemmer AET Series, Blemmer 30PPT-800, Blemmer 50PPT-800, Blemmer 70PPT-800, Blemmer APT Series, Blemmer 10PPB-500B and Blemmer 10APB-500B. Examples of such commercially available monomers also include polyoxyalkylene glycol mono (meth) acrylate having a terminal alkyl group prepared by Nippon Oil and Fats Co., Ltd. such as Blemmer PME-100, Blemmer PME-200, Blemmer PME-400, Blemmer PME-1000, Blemmer PME-4000, Blemmer AME-400, Blemmer 50POEP-800B, Blemmer 50AOEP-800B, Blemmer PLE-200, Blemmer ALE-200, Blemmer ALE-800, Blemmer PSE-400, Blemmer PSE-1300, Blemmer ASEP Series, Blemmer PKEP Series, Blemmer AKEP Series, Blemmer ANE-300, Blemmer ANE-1300, Blemmer PNEP Series, Blemmer PNPE Series, Blemmer 43ANEP-500 and Blemmer 70ANEP-550; and Light Ester MC, Light Ester 130MA, Light Ester 041MA, Light Acrylate BO-A, Light Acrylate EC-A, Light Acrylate MTG-A, Light Acrylate 130A, Light Acrylate DMP-A, Light Acrylate P-200A, Light Acrylate NP-4EA and Light Acrylate NP-8EA.

In this connection, the present invention is not restricted to the specific examples listed above at all. In the fluorine atom-containing polymer of the present invention, the polyoxyalkylene group-containing ethylenically unsaturated monomer (B) may be used alone or in any combination of at least two kinds of monomers.

As the fluorine atom-containing polymer of the present invention, particularly preferred are those prepared by copolymerizing at least three kinds of monomers, for instance, a monomer represented by the general formula (I)/poly(oxyethylene) acrylate and/or poly(oxyethylene) methacrylate/ poly(oxyalkylene) acrylate and/or poly(oxyalkylene) methacrylate. In this case, however, the poly(oxyalkylene) acrylate and/or poly(oxyalkylene) methacrylate are those other than poly(oxyethylene) acrylate and/or poly(oxyethylene) methacrylate.

In the present invention, it is also possible to use a fluorine atom-containing polymer obtained by reacting a monomer (A) and a polyoxyalkylene group-containing ethylenically unsaturated monomer as essential components and other monomers copolymerizable with these essential monomers.

The copolymerization ratio of the copolymerizable monomers other than those represented by (A) and (B) is not more than 30% by weight and more preferably not more than 20% by weight (on the basis of the total weight of the fluorine atom-containing polymer) in the whole monomers.

As such monomers, usable herein include, for instance, those disclosed in Polymer Handbook, $2^{nd}$ ed., J. Brandrup, Wiley Interscience, (1975), Chapter 2, Page 1 to 483.

Examples thereof are compounds each having at least one addition polymerizable unsaturated bond in the molecule selected from the group consisting of acrylic acid, methacrylic acid, acrylic acid esters, methacrylic acid esters, acrylamides, methacrylamides, allyl compounds, vinyl ethers and vinyl esters.

Specifically, there may be listed the following monomers:

Acrylic Acid Esters: methyl acrylate, ethyl acrylate, propyl acrylate, chloroethyl acrylate, 2-hydroxyethyl acrylate, trimethylolpropane monoacrylate, benzyl acrylate, methoxybenzyl acrylate, furfuryl acrylate and tetrahydrofurfuryl acrylate;

Methacrylic Acid Esters: methyl methacrylate, ethyl methacrylate, propyl methacrylate, chloroethyl methacrylate, 2-hydroxyethyl methacrylate, trimethylolpropane monomethacrylate, benzyl methacrylate, methoxybenzyl methacrylate, furfuryl methacrylate and tetrahydrofurfuryl methacrylate;

Acrylamides: acrylamide, N-alkyl acrylamide, (the alkyl group may be those having 1 to 3 carbon atoms such as methyl, ethyl and propyl groups), N,N-dialkyl acrylamide (the alkyl group may be those having 1 to 3 carbon atoms), N-hydroxyethyl-N-methyl acrylamide and N-2-acetamidoethyl-N-acetyl acrylamide;

Methacrylamides: methacrylamide, N-alkyl methacrylamide, (the alkyl group may be those having 1 to 3 carbon atoms such as methyl, ethyl and propyl groups), N,N-dialkyl methacrylamide (the alkyl group may be those having 1 to 3 carbon atoms), N-hydroxyethyl-N-methyl methacrylamide and N-2-acetamidoethyl-N-acetyl methacrylamide;

Allyl Compounds: allyl esters (such as allyl acetate, allyl caproate, allyl caprylate, allyl laurate, allyl palmitate, allyl stearate, allyl benzoate, allyl acetoacetate and allyl lactate) and allyl oxyethanol;

Vinyl Ethers: alkyl vinyl ethers (such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether;

Vinyl Esters: vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxy acetate, vinyl butoxy acetate, vinyl lactate, vinyl-β-phenyl butyrate and vinyl cyclohexyl carboxylate;

Dialkyl Itaconates: dimethyl itaconate, diethyl itaconate and dibutyl itaconate;

Dialkyl Esters or Monoalkyl Esters of Fumaric Acid: such as dibutyl fumarate; and Other Monomers such as crotonic acid, itaconic acid, acrylonitrile, methacrylonitrile, maleylonitrile and styrene.

A part of the fluorine atom-containing products, which are prepared according to the electrolytic fluorination technique conventionally, favorably employed are inferior in the biodegradability and are highly bio-accumulative substances and accordingly, it would be faired that they have generative toxicity and growth toxicity. It is industrially advantageous that the fluorine atom-containing chemical products used in the present invention are highly environmentally safe substances.

The amount of the fluoroaliphatic group-containing monomer (A) used in the fluorine atom-containing polymer of the present invention ranges from 5 to 90% by weight, preferably 5 to 70% by weight, more preferably 7 to 60% by weight and particularly preferably 40 to 70% by weight on the basis of the total weight of the fluorine atom-containing polymer.

The amount of the fluoroaliphatic group-containing monomer (A) used in the fluorine atom-containing polymer of the present invention ranges from 5 to 90% by weight, preferably 10 to 80% by weight, more preferably 20 to 70% by weight and particularly preferably 40 to 70% by weight on the basis of the total weight of the fluorine atom-containing polymer.

The amount of the polyoxyalkylene group-containing ethylenically unsaturated monomer (B) ranges from 10 to 95% by weight, preferably 15 to 70% by weight and more preferably 20 to 60% by weight on the basis of the total weight of the fluorine atom-containing polymer.

The preferred weight average molecular weight of the fluorine atom-containing polymer used in the present invention ranges from 3,000 to 200,000 and more preferably 6,000 to 80,000.

The fluorine atom-containing polymer of the present invention may be a block, random or graft copolymer, but it is preferably a random copolymer.

Further the amount of the fluorine atom-containing polymer used in the present invention to be added ranges from 0.005 to 8% by weight, preferably 0.01 to 5% by weight and more preferably 0.05 to 3% by weight on the basis of the light-sensitive composition (coating components other than solvents) for forming an image-forming layer. If the added amount of the fluorine atom-containing polymer is less than 0.005% by weight, the effect thereof expected is insufficient, while if it exceeds 8% by weight, the coated film cannot sufficiently be dried and the polymer may adversely affect the quality (such as sensitivity) of the light-sensitive material.

The method for preparing the copolymer of the present invention is not particularly restricted and the copolymer may be prepared by any known method such as solution polymerization, bulk polymerization or emulsion polymerization technique, according to a polymerization mechanism such as radical polymerization, cationic polymerization, anionic polymerization. In particular, the radical polymerization technique is simple and industrially preferred. For instance, such a polymer may be prepared by adding a commonly used radical polymerization initiator to monomers such as a fluoroaliphatic group-containing (meth)acrylate and a polyoxyalkylene group-containing (meth)acrylate in an organic solvent to thus polymerize the monomers. Alternatively, other addition polymerizable unsaturated compounds are, if needed, added to the foregoing reaction system and then the same procedures used above are repeated to likewise form a polymer.

It is also effective to use a dropwise addition polymerization technique in which polymerization is carried out while dropwise adding monomers and an initiator to a reaction container depending on the polymerizing ability of each monomer in order to obtain a polymer having a uniform composition.

The polymerization initiator used in this case may be any one known in this art and examples thereof are peroxides such as benzoyl peroxide and diacyl peroxide; azo compounds such as azobisisobutyronitrile and phenyl azotriphenyl methane; metal chelate compounds such as $Mn(acac)_3$; and transition metal catalysts such as those capable of inducing living radical polymerization.

Moreover, in the polymerization reaction, it is also possible to use a chain transfer agent such as lauryl mercaptan, 2-mercaptoethanol, ethyl thioglycollic acid and octyl thioglycollic acid; and other additives such as a coupling group-containing thiol compound, for instance, γ-mercaptopropyl trimethoxy silane.

Alternatively, the fluorine atom-containing random or block copolymer used in the present invention may be prepared by a photopolymerization technique, which is carried out in the presence of a photosensitizer or a photo-initiator or a polymerization technique, which makes use of radiant rays or heat as an energy source.

The polymerization may be carried out in the presence or absence of a solvent, but preferably it is carried out in the presence of a solvent from the viewpoint of working properties. Examples of solvent usable herein are alcohols such as ethanol, isopropyl alcohol, n-butanol, iso-butanol and tert-butanol; ketones such as acetone, methyl ethyl ketone, methyl isobutyl ketone and methyl amyl ketone; esters such as methyl acetate, ethyl acetate, butyl acetate, methyl lactate, ethyl lactate and butyl lactate; carboxylic acid monoesters such as methyl 2-oxypropionate, ethyl 2-oxypropionate, propyl 2-oxypropionate, butyl 2-oxypropionate, methyl 2-methoxy-propionate, ethyl 2-methoxypropionate, propyl 2-methoxypropionate and butyl 2-methoxypropionate; polar solvents such as dimethylformamide, dimethylsulfoxide and N-methylpyrrolidone; ethers such as methyl cellosolve, cellosolve, butyl cellosolve, butyl carbitol and ethyl cellosolve acetate; propylene glycols and esters thereof such as propylene glycol, propylene glycol monomethyl ether, propylene glycol monomethyl ether acetate, propylene glycol monoethyl ether acetate and propylene glycol monobutyl ether acetate; halogen atom-containing solvents such as 1,1,1-trichloroethane and chloroform; ethers such as tetrahydrofuran and dioxane; aromatic hydrocarbons such as benzene, toluene and xylene; and fluorinated inert liquids such as perfluoro-octane and perfluoro-tri-n-butylamine.

Further, any defects attributable to repellency can be eliminated by removing polymer moiety having a high fluorine atom content according to purification or isolation technique such as column filtration, purification through re-precipitation and solvent extraction techniques.

When the fluorine atom-containing polymer of the present invention is used in a composition such as a paint composition or a coating composition, these polymers may be used alone or in any combination of at least two of them depending on the applications. In addition, it is also possible to simultaneously use a known and currently used surfactant such as hydrocarbon type, fluorine atom-containing or silicone type ones, for the purpose of, for instance, improving the compatibility with components incorporated into the composition.

The use of the fluorine atom-containing polymer of the present invention would permit the inhibition of any foaming even in a coating method in which the coating is carried out at a high speed under a high shearing force, the achievement of high leveling characteristics and the inhibition of any water repellency on the film surface after the application thereof and therefore, a coating composition excellent even in the post-processing characteristics such as the re-coating ability or developing ability. Such a coating composition is not restricted to any particular one, but useful coating compositions include, for instance, various kinds of paint compositions and photo resist compositions.

(Paint Composition)

First a paint composition will be detailed below. There has conventionally been used, in the paint composition, a variety of leveling agent for the improvement of the leveling properties upon coating and widely used are fluorine atom-containing surfactant having a low surface tension-reducing ability and a high leveling effect, among others. If using the conventional fluorine atom-containing surfactant, however, the film after the application is improved in the water repellency and oil-repellency, this makes the re-coating difficult and therefore, these leveling agents has been limited in the applications. From the foregoing standpoint, it is quite effective to incorporate, into such a paint composition, the fluorine atom-containing polymer of the present invention, which simultaneously has high leveling properties, antifoaming properties and re-coating ability.

The rate of the fluorine atom-containing polymer of the present invention incorporated into the paint composition may vary depending on the kind of systems to which it is added, the physical properties to be improved, coating methods and cost, but it preferably ranges from 0.0001 to 20% by weight, more preferably 0.001 to 10% by weight and further preferably 0.01 to 7% by weight on the basis of the total weight of the paint composition.

The kinds of paints to which the fluorine atom-containing polymer of the present invention are not restricted to particular ones and examples thereof include, but are not limited to, paints, which make use of natural resins, such as petroleum resin-containing paints, shellac-containing paints, rosin-containing paints, cellulose-containing paints, rubber-containing paints, Japanese lacquer (urushi)-containing paints, cashew resin-paints and oil-based vehicle-containing paints; and synthetic resin-containing paints such as phenol resin-containing paints, alkyd resin-containing paints, unsaturated polyester resin-containing paints, amino resin-containing paints, epoxy resin-containing paints, vinyl resin-containing paints, acrylic resin-containing paints, polyurethane resin-containing paints, silicone resin-containing paints and fluoroplastic-containing paints.

These paints may be in the form of an aqueous system, a solvent-containing system, a non-aqueous dispersion system, or a powdery system, the polymer of the invention may be applied to either of these paints and there is not any limitation in the solvent or dispersion medium in the present invention. Specific examples of such solvents or dispersion mediums are alcohols such as ethanol, isopropanol, n-butanol, iso-butanol and tert-butanol; ketones such as acetone, methyl ethyl ketone, methyl isobutyl ketone and methyl amyl ketone; esters such as methyl acetate, ethyl acetate and butyl acetate; polar solvents such as dimethylformamide and dimethylsulfoxide; ethers such as methyl cellosolve, cellosolve, butyl cellosolve and butyl carbitol; halogen atom-containing solvents such as 1,1,1-trichloroethane and chloroform; ethers such as tetrahydrofuran and dioxane; aromatic hydrocarbons such as benzene, toluene and xylene; and fluorinated inert liquids such as perfluoro-octane and perfluoro-tri-n-butylamine.

In this respect, it is a matter of course that the present invention is not restricted to the foregoing specific examples at all. Moreover, these paints may, if necessary, comprise a coloring agent such as a pigment, a dye and carbon; inorganic powder such as silica, titanium oxide, zinc oxide, aluminum oxide, zirconium oxide, calcium oxide and calcium carbonate powder; organic fine powder such as higher fatty acids, poly(vinylidene fluoride), poly(tetra-fluoroethylene) and polyethylene fine powder; and a variety of additives or fillers such as light resistance-improving agents, weatherability-improving agents, heat resistance-improving agents, antioxidants, thickening agents and anti-settling agents.

Moreover, any known and currently used coating method can be employed in the present invention without any restriction and examples of such coating methods are roll coating, electrostatic spray coating, bar coating, gravure coating, knife coating, dip coating and spray coating techniques.

(Photo Resist Composition)

In this respect, it is a matter of course that the present invention is not restricted to the foregoing specific examples at all. Photo resist compositions will then be described in detail below. In the semiconductor photolithography technique, it is common that a photo resist composition is in general applied onto the surface of a silicon wafer to a thickness on the order of about 1 to 2 µm according to the spin coating technique in which a high shearing force is applied to the resulting film. At this stage, if the deviation in coated film thickness or striped non-uniform coating called "striation" is caused, the linearity and reproducibility of a pattern are considerably reduced and any resist pattern having a desired accuracy cannot be obtained. Recently, the resist pattern has increasingly been finer as the integration degree of semiconductor elements increases and therefore, it is an important subject in this art to solve the problem of the occurrence of such deviation in coated film thickness or striation. Moreover, the diameter of silicon wafer has recently been increased from 6 inches to 8 inches or higher in order to improve the productivity rate of semiconductor elements. As the diameter of the semiconductor wafer increases, it becomes a considerably important subject in this art to solve the problem of the occurrence of such deviation in coated film thickness or striation. Furthermore, the application of a photo resist composition is followed by a developing step and accordingly, the wettability of the fluorine atom-containing polymer with a developer likewise becomes an important factor.

The fluorine atom-containing polymer of the present invention having high leveling properties and antifoaming ability and suitable for improving the post-processing characteristics would be effectively used in a variety of photo resist compositions, while taking into consideration the foregoing problems.

A photo resist composition comprises the foregoing fluorine atom-containing polymer and a known and currently used photo resist. Photo resists, which may be used in combination with the fluorine atom-containing polymer of the present invention, are not restricted to particular ones and all of the known and currently used photo resists can be used in the present invention.

Specific examples thereof are a photo resist composition (PR-1) prepared by dissolving a quinone diazide type light-sensitive compound and an alkali-soluble resin in an organic solvent, a photo resist composition (PR-2) prepared by dissolving a photolytically acid-generating agent, a cross-linking agent and an alkali-soluble resin in an organic solvent, and a photo resist composition (PR-3) prepared by dissolving a photolytically acid-generating agent, an alkali-soluble resin and optionally a solubilization-inhibitory agent in an organic solvent.

First, the photo resist composition (PR-1) will be detailed below. The alkali-soluble resin may be, for instance, a variety of conventionally known alkali-soluble resins. The alkali-soluble resins specifically include novolak resins, polyhydroxy styrene or a derivative thereof and styrene-maleic anhydride copolymers, with novolak resins, polyhydroxy styrene or derivatives thereof being preferably used and novolak resins being particularly preferably used.

Such novolak resins can be prepared by mixing hydroxy aromatic compounds, for instance, alkyl phenols such as phenol, o-cresol, m-cresol, p-cresol, 3-ethyl phenol, 2,5-xylenol and 3,5-xylenol, alkoxy or aryloxy phenols such as 2-methoxy phenol, 4-methoxy phenol and 4-phenoxy phenol, naphthols such as α-naphthol, β-naphthol and 3-methyl-α-naphthol, and polyhydroxy benzenes such as 1,3-dihydroxy benzene, 1,3-dihydroxy-2-methylbenzene, 1,2,3-trihydroxy benzene, 1,2,3-trihydroxy-5-methylbenzene and 1,3,5-trihydroxy benzene with carbonyl compounds, for instance, aliphatic aldehydes such as formaldehyde, paraformaldehyde, acetaldehyde and paraldehyde, aromatic aldehydes such as benzaldehyde and alkyl ketones such as acetone; and then heating the resulting mixture in the presence of a catalyst such as hydrochloric acid, sulfuric acid or oxalic acid to thus induce polycondensation. Among these alkali-soluble resins thus prepared, preferred are novolak resins obtained by polycondensation of at least one alkyl phenols as the hydroxy aromatic compounds and carbonyl compounds. Examples of further preferred novolak resins are those prepared by mixing at least one member selected from the group consisting of m-cresol, p-cresol, 2,5-xylenol and 3,5-xylenol with at least one member selected from the group consisting of formaldehyde, acetaldehyde and para-aldehyde and then heating the resulting mixture in the presence of, for instance, hydrochloric acid or oxalic acid as a catalyst to thus polycondensate the mixture. Particularly preferred are novolak resins prepared by mixing m-cresol, p-cresol and 2,5-xylenol with formaldehyde alone or a combination of formaldehyde and acetaldehyde or paraldehyde and then heating the resulting mixture in the presence of, for instance, hydrochloric acid or oxalic acid as a catalyst to thus polycondensate the mixture. If the polymer of the invention is used in combination with these resins, the resulting photo resist composition is substantially improved, in particular, in the resolution. The polystyrene-converted weight average molecular weight of the foregoing novolak resin (hereunder simply referred to as "molecular weight") is preferably not more than 30,000 and particularly preferably not more than 20,000 and it is preferably not less than 2,500 and particularly preferably not less than 3,000. If the molecular weight is too low, the resulting photo resist composition is considerably impaired in its heat resistance, while if it is too high, the sensitivity of the resulting composition is substantially reduced and therefore, it may not be preferred to use such a resin in the stable manufacture of integrated circuits.

The polyhydroxy styrene or derivatives thereof can be prepared by polymerizing hydroxy styrene derivatives such as 4-hydroxystyrene, 3-methyl-4-hydroxystyrene and 3-chloro-4-hydroxystyrene according to any known method. Incidentally, the foregoing alkali-soluble resin may be one obtained by further reducing with, for instance, hydrogen to thus reduce the ability of absorbing light rays falling within the short wavelength region. In addition, the raw aromatic compound or monomer for preparing the alkali-soluble resin may have substituents such as halogen atoms, nitro groups and/or ester groups inasmuch as they never adversely affect the intended effects of the present invention.

As quinone diazide type light-sensitive compounds, there may be listed, for instance, o-quinone diazide group-containing compounds. Such o-quinone diazide group-containing compounds may include various compounds containing o-quinone diazide groups in the structures thereof and specific examples thereof preferably used herein are esters and amides of 1,2-benzoquinone diazide-4-sulfonic acid, 1,2-naphthoquinone diazide-4-sulfonic acid and 1,2-naphthoquinone diazide-5-sulfonic acid. More specifically, preferably used herein include polyhydroxy alkyl compounds such as glycerin and pentaerythritol; 1,2-benzoquinone diazide-4-sulfonic acid esters or amides, 1,2-naphthoquinone diazide-4-sulfonic acid esters or amides and 1,2-naphthoquinone diazide-5-sulfonic acid esters or amides of polyhydroxy aromatic compounds such as novolak resin as polycondensates of hydroxy aromatic compounds, for instance, those listed above in connection with the foregoing alkali-soluble resin with carbonyl compounds, bisphenol A, gallic acid esters, quercetin, morin and polyhydroxy benzophenone. Incidentally, as the polyhydroxy benzophenone, there may be listed, for instance, tri to hexa-hydroxy benzophenone such as 2,3,4-trihydroxy benzophenone, 2,3,4,4'-tetrahydroxy benzophenone, 2,3,4,2',4'-pentahydroxy benzophenone and 2,3,4,3',4',5'-hexahydroxy benzophenone. In addition, compounds containing 1,2-quinone diazide groups likewise preferably used herein are, for instance, naphthoquinone diazide sulfonic acid esters of phenolic hydroxyl group-containing compounds such as those disclosed in J.P. KOKAI Hei 2-269351 and J.P. KOKAI Hei 3-48249.

These compounds containing 1,2-quinone diazide groups may be used alone or in any combination of at least two of them. Among these, preferably used herein are novolak resins having a molecular weight ranging from about 600 to 2200 or 1,2-naphthoquinone diazide-5-sulfonic acid ester of polyhydroxy benzophenone. Examples of 1,2-quinone diazide compounds particularly preferably used herein are novolak resins prepared by polycondensing m-cresol with formaldehyde and/or acetaldehyde, and 1,2-naphthoquinone diazide-5-sulfonic acid esters of 2,3,4-trihydroxy benzophenone, 2,3,4,4'-tetrahydroxy benzophenone and 2,3,4,2',4'-pentahydroxy benzophenone. The degree of substitution, through esterification, of the hydroxyl groups of these light-sensitive agents may vary depending on the kinds of light-sensitive agents, but the degree of substitution preferably ranges from 25 to 70% for the esterified products of the foregoing novolak resins and 50 to 95% for the esterified products of polyhydroxy benzophenones. If the degree of substitution is too low, there is such a tendency that the resulting photo resist composition has insufficient resolution, while if it is too high, there is such a tendency that the resulting composition has a considerably reduced sensitivity.

Then the photo resist composition (PR-2) will be detailed below. The alkali-soluble resin usable herein may be the same as those described before in connection with the photo resist composition (PR-1), but preferred are polyhydroxy styrene or derivatives thereof. In addition, the polyhydroxy styrene derivatives may be, for instance, copolymerized polymers comprising, as copolymer components, hydroxy styrene and monomers other than the former.

The other monomers or other copolymerizable components may be, for instance, acrylic acid derivatives such as acrylic acid, ethyl acrylate, methacrylic acid, methyl methacrylate, crotonic acid, ethyl crotonate, cinnamic acid and ethyl cinnamate; styrene derivatives such as styrene, stilbene and vinyl cyclohexane; maleic acid derivatives such as maleic acid, dimethyl maleate, methylmaleic acid, dimethyl methylmaleate; vinyl ketones such a methyl vinyl ketone; and vinyl ethers such as methyl vinyl ether.

The molecular weight of the foregoing polyhydroxy styrene and derivatives thereof in general ranges from about 1,000 to 20,000 and preferably about 2,000 to 10,000. In addition, the photolytically acid-generating agents may be poly-halogenated hydrocarbon group-containing compounds and specific examples thereof are poly-halogenated hydrocarbon group-containing hydrocarbons such as hexachloro-ethane, hexachloro-acetone, 1,2,3,4,5,6-hexachloro-cyclohexanone, carbon tetrabromide, iodoform, 1,1,2,2-tetrabromoethane and 1,2,3,4-tetraburomobutane. Moreover, these poly-halogenated hydrocarbon group may be present as substituents for triazine and benzene or constituent groups of sulfone compounds such as tris (trichloromethyl)-s-triazine, bis(tribromo-methyl) benzene and tribromomethyl phenyl sulfone. Moreover, it is also possible to use diallyl iodonium salts such as diphenyl iodonium hexafluoro-phosphate and diphenyl iodonium chloride; triaryls such as triphenyl sulfonium hexafluoro-phosphate, triphenyl sulfonium bromide and nitro-benzyl tosylate; and onium salts such as sulfonium salts, as the foregoing poly-halogenated hydrocarbon group-containing compounds.

Moreover, as the cross-linking agents, there may be listed, for instance, compounds having at least two cross-linking groups such as hydroxymethyl, methoxymethyl or ethoxymethyl group in the molecule, for instance, alkoxy-methylated melamine such as hexamethoxy-methylated melamine; alkoxy-methylated saccinamide such as N,N,N',N'-tetrahydroxy-methyl saccinamide; alkoxy-methylated urea such as N,N'-dimethoxy-methyl urea and tetramethoxy-methyl urea; and 2,4,6-trihydroxy-methylated phenol.

The photo resist composition (PR-3) will now be described in detail below. The alkali-soluble resin may be, for instance, those listed above in connection with the photo resist compositions (PR-1) and (PR-2), but in these alkali-soluble resins, part of the functional groups, which can impart alkaline characteristics to the resins, may be replaced with groups highly susceptible to acids such as t-butoxy carbonyl, t-amyloxy carbonyl, t-butyl, t-amino, t-hexyl and allyl groups.

The photolytically acid-generating agents may be the same as those listed above in connection with the foregoing photo resist composition (PR-2). In addition, the solubilization-inhibitory agents may be, for instance, those obtained by protecting hydroxyl groups of phenol compounds such as bisphenol-A, bisphenol-S, biphenol, catechol, fluoroglycinol and pyrogallol with, for instance, t-butoxy carbonyl group.

The photo resist composition is dissolved in an organic solvent to give a coating solution. Examples of such organic solvents are glycolic acid ester derivatives such as methyl lactate, ethyl lactate and ethyl glycolate; glycol ether ester derivatives such as ethyl cellosolve acetate, methyl cellosolve acetate propylene glycol monomethyl ether acetate; ketone esters such as methylpyruvate and ethyl pyruvate; alkoxy carboxylic acid esters such as methyl 3-methoxypropionate and ethyl 3-ethoxy-propionate; ketone derivatives such as acetyl acetone, cyclopentanone, cyclohexanone and 2-heptanone; ketone ether derivatives such as diacetone alcohol methyl ether; ketone alcohol derivatives such as acetol and diacetone alcohol; amide derivatives such as dimethylacetamide and dimethylformamide; and ether derivatives such as anisole and diethylene glycol dimethyl ether. Moreover, it is also possible to optionally use mixed solvents obtained by addition of, for instance, xylene and butyl acetate to the foregoing solvents. Among these, preferably used herein are mixed solvents mainly comprising methyl 3-methoxypropionate, methyl lactate or ethyl lactate while taking into consideration the storage stability, uniformity of the resulting film, safety and easy handling ability, with mixed solvents comprising methyl 3-methoxypropionate or ethyl lactate and propylene glycol monomethyl ether acetate or butyl lactate being particularly preferably used. Incidentally, the surface tension of the fluorine atom-containing polymer of the present invention as will be described later corresponds to that determined in such an organic solvent.

Moreover, the light-sensitive resin composition may further comprise a light-absorbing material for reducing the effect of light rays irregularly reflected from the substrate and/or a sensitizing agent for the improvement of the sensitivity of the composition.

In the present invention, the rate of the fluorine atom-containing polymer of the present invention to be incorporated may appropriately be adjusted while taking into consideration the desired thickness of the film upon the application of the photo resist composition onto the substrate, coating conditions and the kinds of solvents used, but the amount of the polymer in general ranges from 0.0001 to 5 parts by weight and preferably 0.0005 to 1 part by weight per 100 parts by weight of the alkali-soluble resin.

In the photo resist composition, the presence of the fluorine atom-containing polymer is quite important and therefore, if the composition is free of any fluorine atom-containing polymer, various problems arise, for instance, the composition does not show excellent coating properties, cannot prevent the occurrence of striation and generation of particles in the liquid, cannot reduce the amount of foams entrained and cannot improve the wettability with a developer during development to thus impair the developing ability.

It is a matter of course that the photo resist composition may further comprise, if needed, known and currently used additives such as surfactants, storage stability-improving agents, pigments, dyes, fluorescent agents, color-developing agents, plasticizers, thickening agents, thixotropic agents, resin-dissolution-inhibitory agents and adhesion-strengthening agents such as silane coupling agents.

The photo resist composition may be applied onto a substrate according to the known and currently used coating method such as spin coating, roll coating, dip coating, spray coating, blade coating, curtain coating and gravure coating techniques.

Furthermore, the fluorine atom-containing polymer of the present invention may be added, as a variety of resin leveling agents, to single layer or multi-layer coating compositions used in the production of light-sensitive materials for halide photography, the production of lithographic printing plates, the manufacture of liquid crystal-related products such as materials for color filters, the manufacture of PS plates and other various photo-fabrication processes. The use of the polymer would permit the elimination of the formation of pinholes, orange peel, uneven coating and cissing and the realization of highly smooth surface of the coated film.

The fluorine atom-containing polymer of the present invention may likewise be used as a resin-modifying agent, which can impart non-adhesive properties, low friction characteristics, water repellency, oil repellency, antifouling properties, which have never been achieved by any conventional technique, to the surface of molded articles of widely used plastic materials such as polyethylene, polypropylene and polyesters, engineering plastics such as PPS and PBT, and even thermoplastic elastomers without deteriorating the basic physical properties thereof.

Moreover, the polymer thus obtained is not only soluble in water, but also capable of being formed into a flexible film without using any plasticizers. Accordingly, phthalic acid esters or the like, which may have internally secreted substance-disturbing effect must not be used at all as such plasticizers. In addition, it is soluble in water and therefore, water is used as a solvent when preparing a drug and a composition free of any organic solvent can be obtained. For this reason, the polymer may be incorporated into cosmetics such as those for the hair; those for the skin; and those for the nail and further it may likewise be used in water-based paints and as an agent for treating the surface of, for instance, metals, glass materials and fibers. The water-soluble polymer may be applied onto a substrate and then dried to give a hydrophobic and plastic film. Moreover, the polymer may impart water-repellency of high level to the resulting film over a long period of time.

(Image-Forming Composition)

We will now explain other components required for the preparation of a light-sensitive resin composition as an image-forming composition according to the present invention.

The foregoing light-sensitive resin composition, which contains a fluorine atom-containing polymer, used for forming an image-forming layer at least comprises a light-sensitive compound or a light-heat conversion agent in addition to the fluorine atom-containing polymer.

<Positive Light-Sensitive Resin Composition>

The light-sensitive compound usable in the positive light-sensitive resin composition (image-forming composition) of the present invention may be any one inasmuch as it can cause a change in the solubility in a developer or the ability of getting swollen with the developer after the exposure to light rays. Among them, preferred are o-quinone diazide compounds. For instance, in case of a positive light-sensitive resin composition comprising an alkali-soluble resin and an o-quinone diazide compound, the o-quinone diazide compound is preferably a compound, which has at least one o-quinone diazido group and whose solubility in an alkali aqueous solution increases after the irradiation with actinic rays.

Such compounds having a variety of structures have been known and disclosed in, for instance, J. KOSAR, "Light-Sensitive Systems", pp. 336–352, published in 1965 by John Wiley & Sons, Inc. As the light-sensitive compounds of the positive light-sensitive resin composition, preferred are, in particular, a variety of hydroxyl compounds and sulfonic acid ester of o-benzoquinone diazide or o-naphthoquinone diazide.

Examples of the foregoing o-quinone diazide compounds are esters of 1,2-naphthoquinone-2-diazide-5-sulfonyl chloride with phenol-formaldehyde resins or cresol-formaldehyde resins; esters of 1,2-naphthoquinone-2-diazide-5-sulfonyl chloride with pyrogallol-acetone resins as disclosed in U.S. Pat. No. 3,635,709; esters of 1,2-naphthoquinone-2-diazide-5-sulfonyl chloride with resorcin-benzaldehyde resins as disclosed in Japanese Examined Patent Publication (hereunder referred to as "J.P. KOKOKU") Sho 63-13528; esters of 1,2-naphthoquinone-2-diazide-5-sulfonyl chloride with resorcin-pyrogallol-acetone co-condensed resins as disclosed in J.P. KOKOKU Sho 62-44257; products obtained by esterifying polyesters having terminal hydroxyl groups with 1,2-naphthoquinone-2-diazide-5-sulfonyl chloride as disclosed in J.P. KOKOKU Sho 56-45127; products obtained by esterifying homopolymers of N-(4-hydroxyphenyl) methacrylamide or copolymers of the monomer and other copolymerizable monomers with 1,2-naphthoquinone-2-diazide-5-sulfonyl chloride as disclosed in J.P. KOKOKU Sho 50-24641; esters of 1,2-naphthoquinone-2-diazide-5-sulfonyl chloride with bisphenol-formaldehyde resins as disclosed in J.P. KOKOKU Sho 54-29922; products obtained by esterifying homopolymers of p-hydroxy styrene or copolymers of the monomer and other copolymerizable monomers with 1,2-naphthoquinone-2-diazide-5-sulfonyl chloride as disclosed in J.P. KOKOKU Sho 52-36043; and esters of 1,2-naphthoquinone-2-diazide-5-sulfonyl chloride with polyhydroxy benzophenones.

Examples of other known o-quinone diazide compounds usable in the present invention include those disclosed in, for instance, J.P. KOKAI Sho 63-80254, Sho 58-5737, Sho 57-111530, Sho 57-111531, Sho 57-114138, Sho 57-142635 and Sho 51-36129; and J.P. KOKOKU Sho 62-3411, Sho 62-51459 and Sho 51-483. The amount of the foregoing o-quinone diazide compound to be incorporated into the light-sensitive resin composition in general ranges from 5 to 60% by weight and more preferably 10 to 40% by weight on the basis of the total solid content of the composition.

As the light-sensitive compounds usable herein, other than the o-quinone diazides, there may be listed, for instance, chemically amplified light-sensitive materials comprising combinations of compounds whose alkali-soluble groups are protected with acid-decomposable groups with photolytically acid-generating agents. The photolytically acid-generating agents used in the chemically amplified systems may be any known one.

Examples thereof are diazonium salts such as those disclosed in, for instance, S. I. Schlesinger, Photogr. Sci. Eng., 1974, 18:387, T. S. Bal et al., Polymer, 1980, 21:423; ammonium salts such as those disclosed in, for instance, U.S. Pat. Nos. 4,069,055 and 4,069,056 and J.P. KOKAI Hei 3-140140; phosphonium salts such as those disclosed in, for instance, D. C. Necker et al., Macromolecules, 1984, 17:2468, C. S. Wen et al., Teh. Proc. Conf. Rad. Curing ASIA, p. 478, Tokyo, October (1988), U.S. Pat. Nos. 4,069,055 and 4,069,056; iodonium salts such as those disclosed in, for instance, J. V. Crivello et al., Macromolecules, 1977, 10(6): 1307, Chem. & Eng. News, Nov. 28, 1998, p. 31, European Patent No. 104,143, U.S. Pat. Nos. 339,049 and 410,201 and J.P. KOKAI Hei 2-150848 and Hei 2-296514; sulfonium salts such as those disclosed in, for instance, J. V. Crivello et al., Polymer J., 1985, 17:73, J. V. Crivello et al., J. Org. Chem., 1978, 43:3055, W. R. Watt et al., J. Polymer Sci. Polymer Chem. Ed., 1984, 22:1789, J. V. Crivello et al., Polymer Bull., 1985, 14:279, J. V. Crivello et al., Macromolecules, 1981, 14(5):1141, J. V. Crivello et al., J. Polymer Sci. Polymer Chem. Ed., 1979, 17:2877, European Patent Nos. 370,693, 233,567, 297,443 and 297,442, U.S. Pat. Nos. 3,902,114, 4,933,377, 410,201, 339,049, 4,760,013, 4,734,444 and 2,833,827, German Patent Nos. 2,904,626, 3,604,580 and 3,604,581; selenonium salts such as those disclosed in, for instance, J. V. Crivello et al., Macromolecules, 1977, 10(6):1307, J. V. Crivello et al., J. Polymer Sci. Polymer Chem. Ed., 1979, 17:1047; onium salts, for instance, arsonium salts such as those disclosed in, for instance, C. S. Wen et al., Teh. Proc. Conf. Rad. Curing ASIA, p. 478, Tokyo, October (1988); organic halogen atom-containing compounds such as those disclosed in, for instance, U.S. Pat. No. 3,905,815, J.P. KOKOKU Sho 46-4605, J.P. KOKAI Sho 48-36281, Sho 55-32070, Sho 60-239736, Sho 61-169835, Sho 61-169837, Sho 62-58241, Sho 62-212401, Sho 63-70243 and Sho 63-298339; organometal/organic halogen atom-containing compounds such as those disclosed in, for instance, K. Meier et al., J. Rad. Curing, 1986, 13(4): 26, T. P. Gill et al., Inorg. Chem., 1980, 19:3007, D. Astruc, Acc. Chem. Res., 1896, 19(12):377 and J.P. KOKAI Hei 2-161445; photolytically acid-generating agents carrying o-nitrobenzyl type protective groups such as those disclosed in, for instance, S. Hayase et al., J. Polymer Sci., 1987, 25:753, E. Reichmanis et al., J. Polymer Sci. Polymer Chem. Ed., 1985, 23:1, Q. Q. Zhu et al., J. Photochem., 36, 85, 39, 317 (1987), B. Amit et al., Tetrahedron Lett., (24), 2205 (1973), D. H. R. Barton et al., J. Chem. Soc., 1965, p. 3571, P. M. Collins et al., J. Chem. Soc., Perkin I, 1695 (1975), M. Rudinstein et al., Tetrahedron Lett., (17), 1445 (1975), J. W. Walker et al., J. Am. Chem. Soc., 1988, 110:7170, S. C. Busman et al., J. Imaging Technol., 1985, 11(4):191, H. M. Houlihan et al., Macromolecules, 1988, 21:2001, P. M. Collins et al., J. Chem. Soc. Chem. Commun., 532 (1972), S. Hayase et al., Macromolecules, 1985, 18:1799, E. Reichmanis et al., J. Electrochem. Soc. Solid State Sci. Technol., 130(6), F. M. Houlihan et al., Macromolecules, 1988, 21:2001, European Patent Nos. 0,290,750, 046,083, 156,535, 271,851 and 0,388,343, U.S. Pat. Nos. 3,901,710 and 4,181,531 and J.P. KOKAI Sho 60-198538 and Sho 53-133022; compounds generating sulfonic acid through photolysis represented by iminosulfonates as disclosed in, for instance, M. TUNOOKA et al., Polymer Preprints Japan, 35(8), G. Berner et al., J. Rad. Curing, 13(4), W. J. Mijs et al., Coating Technol., 55(697), 45 (1983), Akzo, H. Adachi et al., Polymer Preprints Japan, 37(3), European Patent Nos. 0,199,672, 84,515, 199,672, 044,115 and 0,101,122, U.S. Pat. Nos. 4,618,564, 4,371,605 and 4,431,774, J.P. KOKAI Sho 64-18143 and Hei 2-245756 and Japanese Patent Application Serial No. Hei 3-140109; and disulfone compounds such as those disclosed in, for instance, J.P. KOKAI Sho 61-166544.

The added amount of these compounds capable of generating acids through decomposition when irradiating with actinic rays or radiant rays in general ranges from 0.001 to 40% by weight, preferably 0.01 to 20% by weight and more preferably 0.1 to 5% by weight on the basis of the total weight of the light-sensitive resin composition (except for coating solvents).

Moreover, the compounds whose alkali-soluble groups are protected with acid-decomposable groups may be, for instance, those having —C—O—C— or —C—O—Si— bonds in the molecule and examples thereof are those listed below:

(a) Compounds comprising at least one member selected from the group consisting of ortho-carboxylic acid esters and carboxylic acid amide acetals, which may be polymerizable, in which the foregoing ortho-carboxylic acid esters carboxylic acid amide acetals may be included in the main chain or side chains thereof as cross-linking elements;

(b) Oligomeric or polymeric compounds comprising, in the main chains, a member selected from the group consisting of repeated acetal and ketal units;

(c) Compounds comprising at least one member selected from the group consisting of enol esters or N-acylaminocarbonates;

(d) Cyclic acetals or ketals of β-keto-esters or β-keto-amides;

(e) Compounds containing silyl ether groups;

(f) Compounds having silyl enol ether groups;

(g) Mono-acetals or mono-ketals whose aldehyde or ketone components have a solubility in developer ranging from 0.1 to 100 g/L;

(h) Ethers of tertiary alcohols; and (i) Carboxylic acid esters and carbonic acid esters of tertiary allyl or benzyl alcohol.

The foregoing compounds (a) capable of being cleaved with acids are disclosed in German Patent Nos. 2,610,842 and 2,928,636. Mixtures containing the compounds (b) are disclosed in German Patent Nos. 2,306,248 and 2,718,254. The compounds (c) are disclosed in European Patent Nos. 0,006,626 and 0,006,627. The compounds (d) are disclosed in European Patent No. 0,202,196 and the compounds (e) are disclosed in German Patent Nos. 3,544,165 and 3,601,264.

The compounds (f) are disclosed in German Patent Nos. 3,730,785 and 3,730,783 and the compounds (g) are disclosed in German Patent No. 3,730,783. The compounds (h) are disclosed in, for instance, U.S. Pat. No. 4,603,101 and the compounds (g) are disclosed in, for instance, U.S. Pat. No. 4,491,628 and an article of J. M. Frechet et al. (J. Imaging Sci., 1986, 30:59–64).

The content of these compounds protected with acid-decomposable groups in the light-sensitive resin composition in general ranges from 1 to 60% by weight and more preferably 5 to 40% by weight on the basis of the total solid content of the composition.

The light-sensitive resin composition may further comprise a synthetic resin insoluble in water and soluble in an aqueous alkali solution (hereunder referred to as "alkali-soluble resin").

Examples of such alkali-soluble resins are phenol-formaldehyde resins, cresol-formaldehyde resins, phenol-cresol-formaldehyde co-condensed resins, phenol-modified xylene resins, polyhydroxy styrene, poly-halogenated hydroxy-styrene, N-(4-hydroxyphenyl) methacrylamide copolymers, hydroquinone mono-methacrylate copolymers, sulfonylimide type polymers as disclosed in J.P. KOKAI Hei 7-28244 and carboxyl group-containing polymers as disclosed in J.P. KOKAI Hei 7-36184. Examples of such resins usable in the present invention further include a variety of alkali-soluble resin or polymeric compounds such as phenolic hydroxyl group-containing acrylic resins such as those disclosed in J.P. KOKAI Sho 51-34711; sulfonamide group-containing acrylic resins such as those disclosed in J.P. KOKAI Hei 2-866; and urethane type resins. The alkali-soluble resin or polymeric compound preferably has a weight average molecular weight ranging from 500 to 20,000 and a number average molecular weight ranging from 200 to 60,000. These alkali-soluble resins or polymeric compounds may be used alone or in any combination of at least two of them and they are used in an added amount of not more than 80% by weight on the basis of the total solid content of the composition.

Further, the simultaneous use of a condensate of a phenol carrying an alkyl group having 3 to 8 carbon atoms as a substituent with formaldehyde such as t-butylphenol-formaldehyde resin or octylphenol-formaldehyde resin, as disclosed in U.S. Pat. No. 4,123,279 is preferred for the improvement of the ink-receptivity of the resulting images. Such an alkali-soluble resin is in general used in an amount of not more than 90% by weight on the basis of the total solid content of the composition.

The light-sensitive resin composition may likewise comprise, if necessary, a cyclic acid anhydride for the improvement of the sensitivity, an agent or a composition for obtaining a visible image immediately after the imagewise exposure, a dye as an image-pigmenting agent and/or other fillers.

It is preferred to add cyclic acid anhydrides, phenols and/or organic acids for the purpose of improving the sensitivity to the light-sensitive resin composition used in the present invention. Examples of such cyclic acid anhydrides are phthalic acid anhydride, tetrahydro-phthalic acid anhydride, hexahydro-phthalic acid anhydride, 3,6-endoxy-Δ4-tetrahydro-phthalic acid anhydride, tetrachloro-phthalic acid anhydride, maleic acid anhydride, chloro-maleic acid anhydride, α-phenyl-maleic acid anhydride, succinic acid anhydride and pyromellitic acid anhydride. Examples of phenols are bisphenol A, p-nitro-phenol, p-ethoxy-phenol, 2,3,4-trihydroxy benzophenone, 4-hydroxy benzophenone, 2,4,4'-trihydroxy benzophenone, 4,4',4"-trihydroxy-triphenylmethane and 4,4',3",4"-tetrahydroxy-3,5,3',5'-tetramethyl triphenyl-methane.

Examples of organic acids are sulfonic acids, sulfonic acids, alkylsulfuric acids, phosphonic acids, phosphonic acid, phosphoric acid esters and carboxylic acids and specific examples thereof are p-toluene-sulfonic acid, dodecyl-benzene-sulfonic acid, p-toluene-sulfinic acid, ethylsulfuric acid, phenyl phosphonic acid, phenyl phosphonic acid, phenyl phosphate, diphenyl phosphate, benzoic acid, isophthalic acid, adipic acid, p-toluic acid, 3,4-dimethoxy benzoate, phthalic acid, terephthalic acid, 1,4-cyclohexene-2,2-dicarboxylic acid, erucic acid, lauric acid, n-undecanoic acid and ascorbic acid. The rate of the light-sensitive resin composition occupied by the foregoing cyclic acid anhydrides, phenols and organic acids preferably ranges from 0.05 to 15% by weight and more preferably 0.1 to 5% by weight on the basis of the total solid content of the composition.

Examples of the foregoing agent or composition for obtaining a visible image immediately after imagewise exposure include combinations of light-sensitive compounds capable of generating acids through exposure with organic dyes, which undergo color tone changes through the formation of salts with the acids.

Examples of such light-sensitive compounds capable of generating acids through exposure are o-naphthoquinone-diazide-4-sulfonic acid halogenide such as those disclosed in J.P. KOKAI Sho 50-36209; trihalomethyl-2-pyrone or trihalomethyl-s-triazine such as those disclosed in J.P. KOKAI Sho 53-36223; o-naphthoquinone-diazide compounds such as those disclosed in J.P. KOKAI Sho 55-62444; 2-trihalomethyl-5-aryl-1,3,4-oxadiazole compounds such as those disclosed in J.P. KOKAI Sho 55-77742; and diazonium salts. These compounds may be used alone or in any combination and the amount thereof to be added to the light-sensitive composition preferably ranges from 0.3 to 15% by weight on the basis of the total solid content of the composition.

The light-sensitive resin composition used in the present invention comprises at least one organic dye, which undergoes changes in its color tone through the interaction with photolytically decomposed products of compounds capable of generating acidic substances through photolysis. Examples of such organic dyes are diphenyl-methane type, triaryl-methane type, thiazine type, oxazine type, phenazine type, xanthene type, anthraquinone type, imino-naphthoquinone type and azomethine type dyes.

Specific examples of such organic dyes are Brilliant Green, Eosine, Ethyl Violet, Erythrosine B, Methyl Green, Crystal Violet, Basic Fuchsine, Phenolphthalein, 1,3-diphenyl-triazine, Alizarine Red S, Thymolphthalein, Methyl Violet 2B, Quinaldine Red, Rose Bengale, Thymolsulfophthalein, Xylenol Blue, Methyl Orange, Orange IV, diphenyl thiocarbazone, 2,7-dichloro-fluorescein, Para-Methyl Red, Congo Red, Benzopurpurine 4B, α-Naphthyl Red, Nile Blue 2B, Nile Blue A, Phenacetarine, Methyl Violet, Malachite Green, Para-Fuchsine, Oil Bleu #603 [available from ORIENT Chemical Industry Co., Ltd.], Oil Pink #312 [available from ORIENT Chemical Industry Co., Ltd.], Oil Red 5B [available from ORIENT Chemical Industry Co., Ltd.], Oil Scarlet #308 [available from ORIENT Chemical Industry Co., Ltd.], Oil Red OG [available from ORIENT Chemical Industry Co., Ltd.], Oil Red RR [available from ORIENT Chemical Industry Co., Ltd.], Oil Green #502 [available from ORIENT Chemical Industry Co., Ltd.],Spiron Red BEH Special [available from Hodogaya Chemical Co., Ltd.], Patent Pure Blue [available from Sumitomo Mikuni Chemical Industry Co., Ltd.], Sudan Blue II [available from BASF Company], m-Cresol Purple, Cresol Red, Rhodamine B, Rhodamine 6G, Fast Acid Violet R, Sulforhodamine B, Auramine, 4-p-diethylamino-phenylimino-naphthoquinone, 2-carboxyanilino-4-p-diethylamino-phenylimino-naphthoquinone, 2-carbostearylamino-4-p-dihydrooxyethyl-aminophenyl-imino-naphthoquinone, p-methoxy-benzoyl-p'-diethylamino-o'-methyl-phenylimino-acetanilide, cyano-p-diethyl-amino-phenylimino-acetanilide, 1-phenyl-3-methyl-4-p-diethylamino-phenylimino-5-pyrazolone and 1-β-naphthyl-4-p-diethylamino-phenylimino-5-pyrazolone.

Particularly preferred organic dyes are triarylmethane type dyes. Among these triarylmethane type dyes, particularly preferably used herein are those comprising sulfonic acid compounds as counter anions thereof such as those disclosed in J.P. KOKAI Sho 62-2932471 and Japanese Patent Application Hei 4-112844. These dyes may be used alone or in any combination and the added amount thereof in the light-sensitive resin composition preferably ranges from 0.3 to 15% by weight on the basis of the total weight of the composition. Moreover, other dyes may, if needed, be used in combination with pigments and the amount thereof to be used is not more than 70% by weight and more preferably not ore than 50% by weight on the basis of the total weight of the dyes and the pigments.

<Negative Light-Sensitive Resin Composition>

Then we will describe a negative light-sensitive resin composition (image-forming composition), which is used as an image-forming layer (light-sensitive layer) in a photopolymerizable printing plate as a negative printing plate used in the present invention. In case where the negative light-sensitive resin composition used in the invention is a photopolymerizable light-sensitive resin composition, the principal components thereof are, for instance, an addition polymerizable ethylenically unsaturated double bond-containing compound and a photopolymerization initiator in addition to the foregoing fluorine atom-containing polymer and other compounds such as a heat polymerization-inhibitory agent may, if needed, be added to the composition.

The addition polymerizable double bond-containing compound may arbitrarily be selected from compounds having at least one, preferably at least two terminal ethylenically unsaturated bonds. Such a compound may be in the form of a chemical form such as a monomer, a pre-polymer or a dimmer, a trimer or an oligomer or further mixture thereof or a copolymer. Examples of such monomers and copolymers thereof are esters of unsaturated carboxylic acids (such as acrylic acid, methacrylic acid, itaconic acid, crotonic acid, iso-crotonic acid and maleic acid) with aliphatic polyhydric alcohols and amides of unsaturated carboxylic acids with aliphatic polyvalent amine compounds.

Specific examples of monomers or esters of unsaturated carboxylic acids with aliphatic polyhydric alcohols include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylol-propane triacrylate, trimethylolpropane tri(acryloyloxy-propyl) ether, trimethylol-ethane triacrylate, hexane-diol diacrylate, 1,4-cyclohexane-diol diacrylate, tetraethylene glycol diacrylate, pentaerythritol diacrylate, pentaerythritol tri-acrylate, pentaerythritol tetra-acrylate, di-pentaerythritol di-acrylate, di-pentaerythritol penta-acrylate, di-pentaerythritol hexa-acrylate, sorbitol tri-acrylate, sorbitol tetra-acrylate, sorbitol penta-acrylate, sorbitol hexa-acrylate, tri(acryloyloxy-ethyl) isocyanurate and polyester acrylate oligomers; methacrylic acid esters such as tetramethylene glycol di-methacrylate, triethylene glycol di-methacrylate, neopentyl glycol di-methacrylate, trimethylol-propane tri-methacrylate, trimethylol-ethane tri-methacrylate, ethylene glycol di-methacrylate, 1,3-butane-diol di-methacrylate, hexane-diol di-methacrylate, pentaerythritol di-methacrylate, pentaerythritol tri-methacrylate, pentaerythritol tetra-methacrylate, di-pentaerythritol di-methacrylate, di-pentaerythritol hexa-methacrylate, di-pentaerythritol penta-methacrylate, sorbitol tri-methacrylate, sorbitol tetra-methacrylate, bis[p-(3-methacryloxy-2-hydroxypropoxy)-phenyl] dimethyl-methane and bis[p-(methacryloxy-ethoxy)-phenyl] dimethyl-methane; itaconic acid esters such as ethylene glycol di-itaconate, propylene glycol di-itaconate, 1,3-butane-diol di-itaconate, 1,4-butane-diol di-itaconate, tetramethylene glycol di-itaconate, pentaerythritol di-itaconate and sorbitol tetra-itaconate; crotonic acid esters such as ethylene glycol di-crotonate, tetramethylene glycol di-crotonate, pentaerythritol di-crotonate and sorbitol tetra-crotonate; iso-crotonic acid esters such as ethylene glycol di-iso-crotonate, pentaerythritol di-iso-crotonate and sorbitol tetra-iso-crotonate; maleic acid esters such as ethylene glycol di-maleate, triethylene glycol di-maleate, pentaerythritol di-maleate and sorbitol tetra-maleate; and mixtures of the foregoing ester monomers.

Specific examples of monomers or amides of aliphatic polyvalent amine compounds with unsaturated carboxylic acids are methylene bis-acrylamide, methylene bis-methacrylamide, 1,6-hexamethylene-bis-acrylamide, 1,6-hexamethylene-bis-methacrylamide, diethylene-triamine tris-acrylamide, xylylene-bis-acrylamide and xylylene-bis-methacrylamide. Examples of such amides also include vinyl urethane compounds comprising at least two polymerizable vinyl groups in the molecule obtained by adding vinyl monomers having hydroxyl groups and represented by the following general formula (A) to poly-isocyanate compounds having at least two isocyanate groups in the molecule, as disclosed in J.P. KOKOKU Sho 48-41708:

$$CH_2=C(R^7)COOCH_2CH(R^8)OH \qquad (A)$$

Wherein $R^7$ and $R^8$ each represents H or $CH_3$.

Examples thereof also include polyfunctional acrylates and methacrylates such as urethane acrylates as disclosed in J.P. KOKAI Sho 51-37193; polyester acrylates such as those disclosed in J.P. KOKAI Sho 48-64183 and J.P. KOKOKU Sho 49-43191 and Sho 52-30490; and epoxy acrylates obtained by reacting epoxy resins with (meth) acrylic acids. It is also possible to use those introduced in Bulletin of Japan Adhesive Society, vol. 20, No. 7, pp. 300–308 (1984) as optically curable monomers and oligomers.

In this respect, the amount of these double bond-containing compound to be used ranges from 5 to 70% by weight and preferably 10 to 50% by weight on the basis of the total solid content of the total components.

The photopolymerization initiator included in the photopolymerizable light-sensitive resin composition used in the present invention may be one appropriately selected from a variety of photopolymerization initiators known and disclosed in patents and literatures depending on the wavelength of the light source used or a system comprising at least two of such initiators (photopolymerization initiator system). For instance, when using a light source emitting light rays having a wavelength in the proximity to 400 nm, examples of such initiators widely used are benzyl, benzoin ether, Michler's ketones, anthraquinone, thioxanthone, Acridine, phenazine, and benzophenone.

Moreover, when using visible light rays having wavelengths of not less than 400 nm, an Ar laser, secondary harmonic wave of semiconductor lasers or an SHG-YAG laser as light sources, there have been proposed a variety of photopolymerization initiators and examples thereof are certain kinds of optically reducible dyes such as Rose Bengale, Eosine, Erythrosine as disclosed in U.S. Pat. No. 2,850,445; systems comprising combinations of dyes with photopolymerization initiators, for instance, composite initiator systems comprising dyes and amines (J.P. KOKOKU Sho 44-20189), systems comprising combinations of hexa-aryl-bi-imidazole, radical generators and dyes (J.P. KOKOKU Sho 45-37377), systems comprising hexa-aryl-bi-imidazole and p-dialkylamino-benzylidene ketones (J.P. KOKOKU Sho 47-2528 and J.P. KOKAI Sho 54-155292), systems comprising cyclic cis-α-dicarbonyl compounds and dyes (J.P. KOKAI Sho 48-84183), systems comprising cyclic triazines and merocyanine (J.P. KOKAI Sho 54-151024), systems comprising 3-ketocumalin and activators (J.P. KOKAI Sho 52-112681), systems comprising bi-imidazole, styrene derivatives and thiol (J.P. KOKAI Sho 59-140203), systems comprising organic peroxides and dyes (J.P. KOKAI Sho 59-1504, Sho 59-140203, Sho 59-189340 and Sho 62-174203, J.P. KOKOKU Sho 62-1641 and U.S. Pat. No. 4,766,055), systems comprising dyes and halogen atom-containing compounds (J.P. KOKAI Sho 63-258903 and Hei 2-63054), systems comprising dyes and borate compounds (J.P. KOKAI Sho 62-143044, Sho 62-150242, Sho 64-13140, Sho 64-13141, Sho 64-13142, Sho 64-13143, Sho 64-13144, Sho 64-17048, Hei 1-229003, Hei 1-298348 and Hei 1-138204), systems comprising rhodanine ring-containing dyes and radical-generators (J.P. KOKAI Hei 2-179643 and Hei 2-244050), systems comprising titanocene and 3-ketocumalin (J.P. KOKAI Sho 63-221110), systems comprising combinations of titanocene, xanthene dyes and amino or urethane group-containing addition polymerizable ethylenically unsaturated compounds (J.P. KOKAI Hei 4-221958 and Hei 4-219756), systems comprising titanocene and specific merocyanine dyes (J.P. KOKAI Hei 6-295061) and systems comprising titanocene and benzopyran ring-containing dyes (J.P. KOKAI Hei 8-334897). The amount of these polymerization initiator to be used ranges from 0.05 to 100 parts by weight, preferably 0.1 to 70 parts by weight and more preferably 0.2 to 50 parts by weight per 100 parts by weight of the ethylenically unsaturated compound.

Moreover, the photopolymerizable light-sensitive resin composition used in the present invention may desirably comprise a small amount of a heat polymerization-inhibitory agent for preventing any unnecessary heat polymerization of the polymerizable ethylenically unsaturated compound during the production or storage of the composition, in addition to the foregoing basic components. Examples of preferred heat polymerization-inhibitory agents are hydroquinone, p-methoxy-phenol, di-t-butyl-p-cresol, pyrogallol, t-butyl-catechol, benzoquinone, 4,4'-thiobis(3-methyl-6-t-butyl-phenol), 2,2'-methylenebis(4-methyl-6-t-butylphenol), cerous salt of N-nitrosophenyl-hydroxylamine and aluminum salt of N-nitrosophenyl-hydroxylamine. The added amount of these heat polymerization-inhibitors preferably ranges from about 0.01 to about 5% by weight on the basis of the total solid content of the composition. In addition, higher fatty acid derivatives such as behenic acid and behenic acid amide or the like are, if necessary added to the composition so that they are unevenly distributed on the surface of the image-forming layer during the drying process after the application of the composition to thus prevent any polymerization-inhibitory effect of oxygen. The added amount of the higher fatty acid derivatives preferably ranges from about 0.5 to about 10% by weight on the basis of the total solid content of the composition.

<Protective Layer Having Oxygen Barrier Properties>

In case of the presensitized plate for preparing a lithographic printing plate, which makes use of a photopolymerizable light-sensitive resin composition for forming an image-forming layer according to the present invention, a protective layer having oxygen barrier properties can be formed on the image-forming layer for the purpose of preventing any polymerization-inhibitory effect of oxygen. This protective layer comprises a water-soluble vinyl polymer and examples of such vinyl polymers are polyvinyl alcohols, partially esterified or etherified derivatives thereof, partially acetal-modified polyvinyl alcohols, and copolymers of vinyl alcohol containing a substantial amount of unsubstituted vinyl alcohol units, which can impart the desired water solubility to the copolymer. Examples of such polyvinyl alcohols are those in which 71 to 100% thereof is hydrolyzed and which have a degree of polymerization ranging from 300 to 2400.

Specific examples thereof are PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 available from Kuraray Co., Ltd. Examples of the foregoing copolymers are polyvinyl acetate chloroacetate or propionate, 88 to 100% of which are hydrolyzed, polyvinyl formal and polyvinyl acetal as well as copolymers thereof. Examples of other useful polymers are polyvinyl pyrrolidone, gelatin and gum Arabic, which may be used alone or in any combination.

In the present invention, the solvent used when the oxygen-barrier protective layer is coated is preferably pure water, but alcohols such as methanol and ethanol, and/or ketones such as acetone and methyl ethyl ketone may be used in combination with pure water. The concentration of the solid matter present in the coating solution suitably ranges from 1 to 20% by weight. The protective layer having oxygen barrier properties may further comprise known additives such as a surfactant for the improvement of the coating characteristics and a water-soluble plasticizer for improving the physical properties of the resulting film. Examples of such water-soluble plasticizers are propionamide, cyclohexane-diol, glycerin and sorbitol. It is also possible to add a water-soluble (meth) acrylic polymer. The amount of the protective layer having oxygen barrier properties to be applied suitably ranges from about $0.1/m^2$ to about $15/m^2$ (determined after drying) and more preferably $1.0/m^2$ to about $5.0/m^2$.

<Other Lithographic Printing Plate Materials>

The present invention may likewise be applied to the following types of lithographic printing plate materials, in addition to the foregoing positive presensitized plate useful for preparing a lithographic printing plate (also referred to as "positive PS plate") provided with an image-forming layer, which comprises a positive light-sensitive resin composition containing a quinone-diazide or a compound having alkali-soluble groups protected with acid-decomposable groups and the foregoing negative PS plate, which makes use of a photopolymerizable system:
(1) Negative lithographic printing plate materials, which make use of image-forming layers containing diazo resins;
(2) Negative lithographic printing plate materials, which make use of image-forming layers containing optically cross-linkable resins;
(3) Negative laser direct exposure type lithographic printing plate materials, which make use of image-forming layers containing an alkali-soluble binder, an acid-generating agent and an acid (or heat)-cross-linkable compound;
(4) Positive laser direct exposure type lithographic printing plate materials, which make use of image-forming layers containing a light-heat transforming agent, an alkali-soluble binder and optionally a substance, which is heat decomposable and can substantially reduce the solubility of the alkali-soluble binder in its undecomposed state; and
(5) Negative laser direct exposure type lithographic printing plate materials, which make use of image-forming layers containing a light-heat transforming agent/thermally radical-generating agent/radical polymerizable compound system.

These examples will in order be described in detail below.

Examples of resins used in the plate (1) are diazo resins represented by salts of condensates of diazo-diarylamines with active carbonyl compounds and preferably used herein are those, which have high light-sensitivity, are insoluble in water and soluble in organic solvents.

Examples of particularly preferred diazo resins are organic acid salts or inorganic acid salts of condensates of amines such as 4-diazo-diphenylamine, 4-diazo-3-methyl-diphenylamine, 4-diazo-4'-methyldiphenylamine, 4-diazo-3'-methyldiphenyl-amine, 4-diazo-4'-methoxydiphenylamine, 4-diazo-3-methyl-4'-ethoxy-diphenylamine and 4-diazo-3-methoxy-diphenylamine with active carbonyl compounds such as formaldehyde, para-formaldehyde, acetaldehyde, benzaldehyde and 4,4'-bis-methoxy-methyl diphenyl ether.

Examples of such organic acid used for forming the organic acid salts are methane-sulfonic acid, benzene-sulfonic acid, toluene-sulfonic acid, xylene-sulfonic acid, mesitylene-sulfonic acid, dodecylbenzene-sulfonic acid, naphthalene-sulfonic acid, propyl-naphthalene-sulfonic acid, 1-naphthol-5-sulfonic acid, 2-nitrobenzene-sulfonic acid, 3-chlorobenzene-sulfonic acid and 2-hydroxy-4-methoxy-benzophenone-5-sulfonic acid, while examples of such inorganic acids used for forming the inorganic acid salts are hexafluoro-phosphoric acid, tetrafluoro-boric acid and thiocyanic acid. Moreover, diazo resins usable herein also include diazo resins whose principal chains are polyesters such as those disclosed in J.P. KOKAI Sho 54-30121; diazo resins obtained by reacting polymers having carboxylic acid anhydride residues with diazo compounds carrying hydroxyl groups such as those disclosed in J.P. KOKAI Sho 61-273538; and diazo resins obtained by reacting poly-isocyanate compounds with diazo compounds carrying hydroxyl groups.

The amount of these diazo resins to be used preferably ranges from 0 to 40% by weight on the basis of the solid content of the composition. In this respect, these diazo resins may optionally be used in any combination of at least two of them. Moreover, when preparing a negative light-sensitive resin composition, an organic polymer binder is in general used in combination. Examples of such organic polymer binders are acrylic resins, polyamide resins, polyester resins, epoxy resins, polyacetal resins, polystyrene resins and novolak resins. In addition, the light-sensitive resin composition may comprise known additives for the improvement of the quality such as a heat polymerization-inhibitor, a dye, a pigment, a plasticizer and/or a stability-improving agent.

Examples of dyes preferably used herein are basic oil-soluble dyes such as Crystal violet, Malachite Green, Victoria Blue, Methylene Blue, Ethyl Violet and Rhodamine B. Examples of commercially available ones are "Victoria Pure Blue BOH" (available from Hodogaya Chemical Co., Ltd.) and "Oil Blue #603" (available from ORIENT Chemical Industry Co., Ltd.). Examples of pigments are Phthalocyanine Blue, Phthalocyanine Green, Dioxazine Violet and Quinacridone Red.

Examples of plasticizers include diethyl phthalate, dibutyl phthalate, dioctyl phthalate, tri-butyl phosphate, tri-octyl phosphate, tri-cresyl phosphate, tri-(2-chloroethyl) phosphate and tri-butyl citrate. Moreover, examples of known stability-improving agents simultaneously used herein are phosphoric acid, phosphorous acid, oxalic acid, tartaric acid, malic acid, citric acid, dipicolinic acid, polyacrylic acid, benzene-sulfonic acid and toluene-sulfonic acid. The amount of these various kinds of additives to be added may vary depending on purposes, but it is in general preferred to use them in an amount ranging from 0 to 30% by weight on the basis of the total solid content of the light-sensitive resin composition.

The optically cross-linkable resins used in the printing plate (2) are preferably optically cross-linkable resins having affinity to an aqueous alkaline developer and examples thereof include copolymers carrying cinnamic acid groups and carboxyl groups such as those disclosed in J.P. KOKOKU Sho 54-15711; polyester resins carrying phenylene-diacrylic acid residues and carboxyl groups such as those disclosed in J.P. KOKAI Sho 60-165646; polyester resins carrying phenylene-diacrylic acid residues and phenolic hydroxyl groups such as those disclosed in J.P. KOKAI Sho 60-203630; polyester resins carrying phenylene-diacrylic acid residues and sodium imino-disulfonyl groups such as those disclosed in J.P. KOKOKU Sho 57-42858; polymers having azido groups and carboxyl groups on side chains such as those disclosed in J.P. KOKAI Sho 59-208552; and polymers having maleimide groups on side chains such as those disclosed in J.P. KOKAI Hei 7-295212.

The alkali-soluble binders and acid-generating agents used in the plate (3) are the same as those used in the positive PS plate, which makes used of quinone-diazide or a compound having an alkali-soluble group protected with an acid-decomposable group. The acid (heat)-cross-linkable compound means a compound, which undergoes cross-linking in the presence of an acid and examples thereof include aromatic compounds and heterocyclic compounds, which are poly-substituted with hydroxymethyl groups, acetoxy-methyl groups or alkoxymethyl groups, with compounds obtained by condensing phenols with aldehydes under basic conditions being preferred among others. Among the foregoing compounds, preferred are compounds obtained by condensing phenols with formaldehyde under basic conditions as has been described above, compounds prepared from m-cresol and formaldehyde; compounds obtained from 4,4'-bisphenol and formaldehyde, according to the same method, and compounds disclosed in GB Patent No. 2,082,339 as resol resins.

These acid-cross-linkable compounds preferably have a weight average molecular weight ranging from 500 to 100,000 and a number average molecular weight ranging from 200 to 50,000. Examples of such compounds preferably used herein further include aromatic compounds substituted with alkoxy-methyl or oxiranyl-methyl groups such as those disclosed in EP-A 0,212,482; monomers and oligomers, melamine-formaldehyde condensates and urea-formaldehyde condensates disclosed in EP-A 0,133,216, DE-A 3,634,671 and DE 3,711,264; and alkoxy-substituted compounds disclosed in EP-A 0,212,482. Examples of such compounds preferably used herein likewise include melamine-formaldehyde derivatives having at least two free N-hydroxymethyl, N-alkoxymethyl or N-acyloxy-methyl groups. Among these, particularly preferred are N-alkoxymethyl derivatives.

Moreover, low molecular weight or oligomer silanols may be used as silicon-containing cross-linking agents. Examples of such silanols are dimethyl- and diphenyl-silane diols and oligomers, which have been pre-condensed and contain these units and specific examples thereof usable herein are disclosed in EP-A 0,377,155. Among the aromatic compounds and heterocyclic compounds having poly-substituted with alkoxy-methyl groups, preferably used herein are compounds, which have alkoxymethyl groups on the position adjacent to hydroxyl groups and in which the alkoxy group of the alkoxymethyl group has not more than 18 carbon atoms, with those represented by the following general formulas (B) to (E) being particularly preferred:

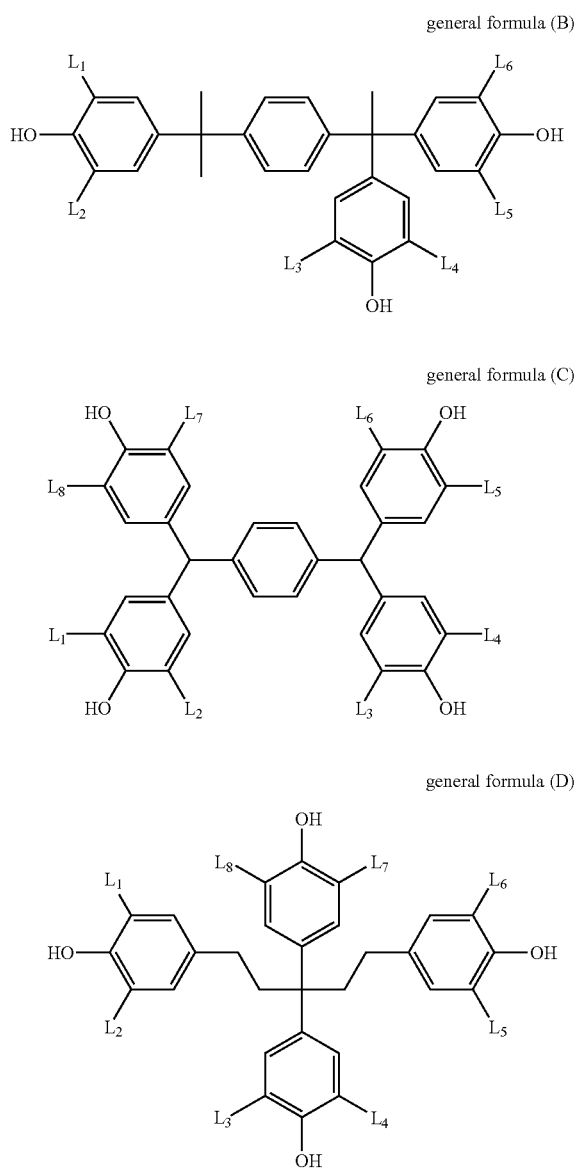

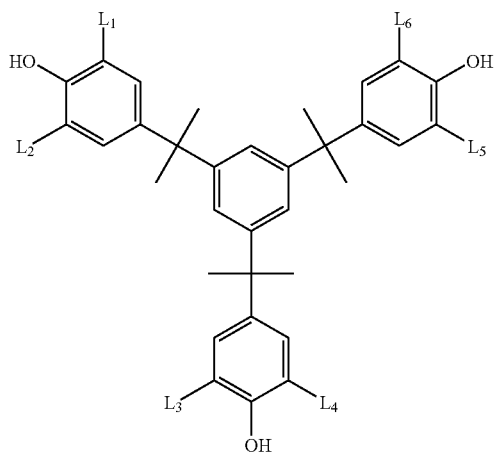

In the formulas, $L_1$ to $L_8$ may be the same or different and each represents an alkoxymethyl group substituted with an alkoxy group having not more than 18 carbon atoms such as a methoxymethyl or ethoxymethyl group. These compounds are quite preferably used since they have high cross-linking efficiency and permit the improvement of the printing durability of the resulting printing plate. The foregoing compounds capable of cross-linking through heating may be used alone or in any combination of at least two of them.

The acid cross-linkable compound used in the present invention is used in the image-forming layer of the light-sensitive resin composition in an amount ranging from 5 to 80% by weight, preferably 10 to 75% by weight and particularly preferably 20 to 70% by weight on the basis of the total solid content of the image-forming layer. This is because if the added amount of the acid cross-linkable compound is less than 5% by weight, the resulting lithographic printing material is impaired in the printing durability of the image-forming layer thereof, while if it exceeds 80% by weight, the stability of the material during storage may be impaired.

The alkali-soluble binder to be used in the printing plate material (4) may be the same as those used in the foregoing positive PS plate prepared using quinone diazide. As the substance, which is heat decomposable, can substantially reduce the solubility of the alkali-soluble binder in its undecomposed state and suitably used herein, there may be listed, for instance, a variety of onium salts and quinone diazide compounds, because of their excellent ability to reduce the solubility of the alkali-soluble binder. Examples of such onium salts are diazonium salts, ammonium salts, phosphonium salts, iodonium salts, sulfonium salts, selenonium salts and arsonium salts.

Examples of onium salts preferably used in the present invention are diazonium salts such as those disclosed in, for instance, S. I. Schlesinger, Photogr. Sci. Eng., 1974, 18: 387, T. S. Bal et al., Polymer, 1980, 21: 423 and J.P. KOKAI Hei 5-158230; ammonium salts such as those disclosed in, for instance, U.S. Pat. Nos. 4,069,055 and 4,069,056 and J.P. KOKAI Hei 3-140140; phosphonium salts such as those disclosed in, for instance, D. C. Necker et al., Macromolecules, 1984, 17: 2468, C. S. Wen et al., Teh. Proc. Conf. Rad. Curing ASIA, p. 478, Tokyo, October (1988) and U.S.

Pat. Nos. 4,069,055 and 4,069,056; iodonium salts such as those disclosed in, for instance, J. V. Crivello et al., Macromolecules, 1977, 10(6): 1307, Chem. & Eng. News, Nov. 28, p. 31 (1988), European Patent No. 104,143, U.S. Pat. Nos. 339,049 and 410,201 and J.P. KOKAI Hei 2-150848 and Hei 2-296514; sulfonium salts such as those disclosed in, for instance, J. V. Crivello et al., Polymer J., 1985, 17:73, J. V. Crivello et al., J. Org. Chem., 1978, 43: 3055, W. R. Watt et al., J. Polymer Sci., Polymer Chem. Ed., 1984, 22: 1789, J. V. Crivello et al., Polymer Bull., 1985, 14: 279, J. V. Crivello et al., Macromolecules, 1981, 14(5): 1141, J. V. Crivello et al., J. Polymer Sci., Polymer Chem. Ed., 1979, 17: 2877, European Patent Nos. 370,693, 233,567, 297,443 and 297,442, U.S. Pat. Nos. 3,902,114, 4,933,377, 410,201, 339,049, 4,760,013, 4,734,444 and 2,833,827, German Patent Nos. 2,904,626, 3,604,580 and 3,604,581; selenonium salts such as those disclosed in, for instance, J. V. Crivello et al., Macromolecules, 1977, 10(6): 1307 and J. V. Crivello et al., J. Polymer Sci., Polymer Chem. Ed., 1979, 17: 1074; and arsonium salts such as those disclosed in, for instance, C. S. Wen et al., Teh. Proc. Conf. Rad. Curing ASIA, p. 478, Tokyo, October (1988).

In the present invention, diazonium salts are, in particular, preferably used among others. Moreover, particularly preferred diazonium salts are those described in J.P. KOKAI Hei 5-158230. Preferred quinone-diazide compounds are, for instance, o-quinone-diazide compounds.

The o-quinonediazide compound used in the present invention is a compound having at least one o-quinonediazide group and capable of increasing the alkali-solubility through thermal decomposition and those having a variety of chemical structures can be used in the present invention. More specifically, the o-quinonediazide loses its ability to inhibit the solubilization of the alkali-soluble binder through the thermal decomposition and the o-quinonediazide per se is converted into an alkali-soluble substance to thus assist the solubilization of the light-sensitive system. Examples of such o-quinonediazide compounds used in the present invention include those disclosed in J. KOSAR, "Light-Sensitive Systems", 1965, pp. 339-352, John Wiley & Sons, Inc., with sulfonic acid esters or sulfonic acid amides of o-quinonediazide obtained through the reaction with a variety of aromatic polyhydroxy compounds or aromatic amine compounds being particularly suitably used in the present invention. Examples thereof suitably used herein also include esters of benzoquinone-(1,2)-diazido-5-sulfonic acid chloride or naphthoquinone-(1,2)-diazido-5-sulfonic acid chloride with pyrogallol-acetone resins disclosed in J.P. KOKOKU Sho 43-28403; and esters of benzoquinone-(1, 2)-diazido-5-sulfonic acid chloride or naphthoquinone-(1, 2)-diazido-5-sulfonic acid chloride with phenol-formaldehyde resins disclosed in U.S. Pat. Nos. 3,046,120 and 3,188,210.

Examples of o-quinonediazide compounds suitably used in the present invention also include esters of naphthoquinone-(1,2)-diazido-4-sulfonic acid chloride with phenol-formaldehyde resins or cresol-formaldehyde resins, and esters of naphthoquinone-(1,2)-diazido-4-sulfonic acid chloride with pyrogallol-acetone resins. Other useful o-quinonediazide compounds have likewise been reported in a variety of patent-related literatures and examples thereof are those disclosed in, for instance, J.P. KOKAI Sho 47-5303, Sho 48-63802, Sho 48-63803, Sho 48-96575, Sho 49-38701 and Sho 48-13354, J.P. KOKOKU Sho 41-11222, So 45-9610 and Sho 49-17481, U.S. Pat. Nos. 2,797,213, 3,454,400, 3,554,323, 3,573,917, 3,674,495 and 3,785,825, U.K. Patent Nos. 1,277,602, 1,251,345, 1,267,005, 1,329, 888 and 1,330,932 and German Patent No. 854,890.

In the present invention, the amount of the o-quinonediazide compound to be added to the composition preferably ranges from 1 to 50% by weight, more preferably 5 to 30% by weight and particularly preferably 10 to 30% by weight on the basis of the total solid content of the lithographic printing plate material. These compounds may be used alone or as a mixture of several compounds. If the added amount of the o-quinonediazide compound is less than 1% by weight, the image-recording ability of the resulting plate material is deteriorated, while if it exceeds 50% by weight, the durability of the image portion is impaired and the sensitivity thereof is lowered.

Examples of counter ions for the onium salts are those derived from tetrafluoro-boric acid, hexafluoro-phosphoric acid, tri-isopropyl-naphthalene-sulfonic acid, 5-nitro-o-toluenesulfonic acid, 5-sulfosalicylic acid, 2,5-dimethylbenzene-sulfonic acid, 2,4,6-trimethylbenzene-sulfonic acid, 2-nitrobenzene-sulfonic acid, 3-chloro-benzene-sulfonic acid, 3-bromobenzene-sulfonic acid, 2-fluorocaprylnaphthalene-sulfonic acid, dodecylbenzene-sulfonic acid, 1-naphthol-5-sulfonic acid, 2-methoxy-4-hydroxy-5-benzoyl-benzenesulfonic acid and p-toluene-sulfonic acid. Among these, particularly preferred are those derived from hexafluoro-phosphoric acid, and alkyl aromatic sulfonic acid such as tri-isopropyl-naphthalene-sulfonic acid and 2,5-dimethyl-benzene-sulfonic acid among others. The amount of the foregoing compounds other than the o-quinonediazide compound preferably ranges from 1 to 50% by weight, more preferably 5 to 30% by weight and particularly preferably 10 to 30% by weight on the basis of the total solid content of the lithographic printing plate material.

Specific examples of ingredients used in the plate material (5) are those listed above in connection with the photopolymerizable systems. Most of the photopolymerization initiators are also useful as thermally radical-generating agents. Moreover, azo-bis compounds (azo-bis-isobutyronitrile) or diazonium compounds may likewise be used as heat polymerization initiators. The same is also true for addition polymerizable compounds. Moreover, the light-heat transforming agents may be any one inasmuch as they may absorb the light rays emitted from light sources for exposure and therefore, all of the dyes listed above in connection with the photopolymerizable systems may be used without any restriction, provided that the light-heat transforming agent presently most effectively used is a compound capable of absorbing (near) infrared light rays since the practically used high output laser source for heat mode exposure is a (near) infrared light source capable of emitting light rays having a wavelength of not less than 750 nm. A variety of IR absorbers are available, but most preferably used herein are hepta-methine cyanine dye, phthalocyanines and carbon blacks.

Incidentally, the light-sensitive resin composition used in the present invention may further comprise a variety of additives for a variety of purposes, for instance, various kinds of resins having hydrophobic groups for improving the ink receptivity of the resulting image such as octylphenol-formaldehyde resin, t-butylphenol-formaldehyde resins, t-butylphenol-benzaldehyde resins, rosin-modified novolak resins and o-naphthoquinone-diazide sulfonic acid esters of these modified novolak resins; and a plasticizer for the improvement of the flexibility of the resulting coated film such as dibutyl phthalate, dioctyl phthalate, butyl glycolate, tri-cresyl phosphate and dioctyl adipate. The amount of these additives to be incorporated into the light-sensitive resin composition preferably ranges from 0.01 to 30% by weight on the basis of the total solid content of the composition.

Moreover, the composition may further comprise a known resin for the further improvement of the frictional resistance of the resulting film. Examples of such resins are polyvinyl acetal resins, polyurethane resins, epoxy resins, vinyl chloride resins, nylon, polyester resins and acrylic resins, which may be used alone or in any combination. The amount thereof to be added to the composition preferably ranges from 2 to 40% by weight on the basis of the total solid content of the composition.

In addition, the light-sensitive resin composition used in the present invention may further comprise a nonionic surfactant such as those disclosed in J.P. KOKAI Sho 62-251740 and Hei 4-68355 or an amphoteric surfactant such as those disclosed in J.P. KOKAI Sho 59-121044 and Hei 4-13149, for the extension of the development latitude. Specific examples of such nonionic surfactants are sorbitan tristearate, sorbitan mono-palmitate, sorbitan trioleate, stearic acid mono-glyceride, polyoxyethylene sorbitan monooleate and polyoxyethylene nonylphenyl ether and specific examples of amphoteric surfactants are alkyl-di (aminoethyl) glycine, alkyl polyaminoethyl glycine hydrochloride, Amorgen K (trade name of an N-tetra-decyl-N,N-betaine type product available from Dai-ichi Kogyo Seiyaku Co., Ltd.), 2-alkyl-N-carboxyethyl-N-hydroxyethyl imidazolinium betaine and Lebon 15 (trade name of an alkyl imidazoline type product available from Sanyo Chemical Industries, Ltd.). The rate of the light-sensitive resin composition occupied by the foregoing nonionic and amphoteric surfactants preferably ranges from 0.05 to 15% by weight and more preferably 0.1 to 5% by weight on the basis of the total solid content of the composition.

Moreover, the light-sensitive resin composition used in the present invention may likewise comprise a yellow dye, preferably a yellow dye whose absorbance at 417 nm is not less than 70% of that observed at 436 nm.

When a light-sensitive material for producing a lithographic printing plate is prepared from the light-sensitive resin composition containing the fluorine atom-containing polymer according to the present invention, the composition is applied onto the surface of a substrate as an image-forming layer. The light-sensitive resin composition containing the fluorine atom-containing polymer is dissolved or dispersed in the following organic solvents, which are used alone or as a mixture, the resulting liquid or solution is applied onto the substrate and then dried. Such organic solvents may be any known and currently used one, but preferred are selected from those having a boiling point ranging from 40 to 200° C., in particular, 60 to 160° C. since they are advantageous when drying the applied film. It is a matter of course that the organic solvent should be selected from those capable of dissolving the fluorine atom-containing polymer of the present invention.

Examples of such organic solvents are alcohols such as methyl alcohol, ethyl alcohol, n- or iso-propyl alcohol, n- or iso-butyl alcohol and diacetone alcohol; ketones such as acetone, methyl ethyl ketone, methyl propyl ketone, methyl butyl ketone, methyl amyl ketone, methyl hexyl ketone, diethyl ketone, di-isobutyl ketone, cyclohexanone, methyl cyclohexanone and acetyl acetone; hydrocarbons such as benzene, toluene, xylene, cyclohexane and methoxy benzene; acetic acid esters such as ethyl acetate, n- or iso-propyl acetate, n- or iso-butyl acetate, ethyl-butyl acetate and hexyl acetate; halogen atom-containing compounds such as methylene dichloride, ethylene dichloride and mono-chlorobenzene; ethers such as isopropyl ether, n-butyl ether, dioxane, dimethyl dioxane and tetrahydrofuran; polyhydric alcohols and derivatives thereof such as ethylene glycol, methyl cellosolve, methyl cellosolve acetate, ethyl cellosolve, diethyl cellosolve, cellosolve acetate, butyl cellosolve, butyl cellosolve acetate, methoxy methoxy-ethanol, diethylene glycol mono-methyl ether, diethylene glycol dimethyl ether, diethylene glycol methyl ethyl ether, diethylene glycol diethyl ether, propylene glycol, propylene glycol mono-methyl ether, propylene glycol mono-methyl ether acetate, propylene glycol mono-ethyl ether, propylene glycol mono-ethyl ether acetate, propylene glycol mono-butyl ether and 3-methyl-3-methoxy butanol; and special solvents such as dimethylsulfoxide and N,N-dimethylformamide, which are used alone or as a mixture. The concentration of the solid content of the coating liquid is suitably adjusted to the range of from 2 to 50% by weight.

The composition used in the present invention is applied onto the surface of a substrate by, for instance, roll coating, dip coating, air knife coating, gravure coating, gravure offset coating, hopper coating, blade coating, wire doctor coating and spray coating techniques and the coated amount of the composition preferably ranges from 0.3 to 4.0 $g/m^2$ as expressed in terms of the weight determined after drying. In this respect, the smaller the coated amount of the composition, the smaller the exposure value required for obtaining an image, but the smaller the strength of the film. As the coated amount increases, the exposure value increases, but the strength of the light-sensitive film increases and if this is used, for instance, as a presensitized plate useful for preparing a lithographic printing plate, the resulting plate would provide a large number of printed matters (or the plate has a high printing durability).

The light-sensitive resin composition applied onto a substrate is in general dried using hot air. The temperature of the air used preferably ranges from 30 to 200° C. and, in particular, 40 to 140° C. The drying temperature may be maintained at a constant level or may stepwise be raised during the drying step. Good results are sometimes obtained by dehumidifying the drying air. The hot (or heated) air is suitably fed to the coated plane at a rate ranging from 0.1 m/sec to 30 m/sec and, in particular, 0.5 to 20 m/sec.

<Mat Layer>

A mat layer is preferably formed on the surface of the image-forming layer thus formed for shortening the time required for evacuation upon the contact exposure using a vacuum-printing frame, and for preventing the formation of an indistinct image during printing. The mat layer may be formed according to any known method such as the mat layer-forming method disclosed in J.P. KOKAI Sho 50-125805 and J.P. KOKOKU Sho 57-6582 and Sho 61-28986 or a method, which comprises the step of fusion-bonding solid powder to the surface to be treated, as disclosed in J.P. KOKOKU Sho 62-62337.

<Substrate>

The substrate used in, for instance, light-sensitive lithographic printing plates is a dimensionally stable plate-like material and the substrate suitably used herein may be any one conventionally used in the printing plates. Examples of such substrate include paper, paper laminated with plastic sheets (such as polyethylene, polypropylene and polystyrene sheets); metal plates such as aluminum (including aluminum alloys), zinc, iron and copper; plastic films such as cellulose di-acetate, cellulose tri-acetate, cellulose propionate, cellulose butyrate, cellulose acetate butyrate, cellulose nitrate, polyethylene terephthalate, polyethylene, polystyrene, polypropylene, polycarbonate and polyvinyl acetal films; and paper and plastic films laminated with foils of the foregoing metals or on which the foregoing metal is deposited, with aluminum plates being particularly preferred. The term "aluminum plate" herein used includes pure aluminum plates and aluminum alloy plates. A variety of aluminum alloys may be used herein and specific examples thereof are alloys of aluminum with other metals such as silicon, copper, manganese, magnesium, chromium, zinc, lead, bismuth and nickel. These compositions (or alloys) may comprise a trace amount of iron and titanium as well as a negligible amount of impurities.

The substrate is if needed subjected to a surface-treatment. For instance, in case of a light-sensitive lithographic printing plate, the surface of a substrate is subjected to a hydrophilization treatment. Moreover, a substrate having a metallic surface, in particular, aluminum surface is preferably subjected to a surface-graining treatment, treatments by dipping in an aqueous solution containing, for instance, sodium silicate, potassium fluorozirconate or a phosphoric acid salt, or an anodization treatment. Aluminum substrates preferably used herein further include, for instance, those surface-grained and then treated by dipping in an aqueous solution of sodium silicate such as those disclosed in U.S. Pat. No. 2,714,066 and those obtained by anodizing and then treating by dipping in an aqueous solution of an alkali metal silicate such as those disclosed in U.S. Pat. No. 3,181,461. The foregoing anodization treatment may be carried out by, for instance, passing an electric current through an aluminum plate serving as an anode in an electrolyte comprising an aqueous solution or non-aqueous solution, which comprise an inorganic acid such as phosphoric acid, chromic acid, sulfuric acid or boric acid or an organic acid such as oxalic acid or sulfamic acid or a salt thereof, in which these aqueous and non-aqueous solutions may be used in combination of at least two thereof.

Moreover, it is also effective to use the silicate-electrodeposition treatment disclosed in U.S. Pat. No. 3,658,662. These hydrophilization treatments are used not only for making the surface of a substrate hydrophilic, but also for the prevention of the occurrence of any harmful reaction with a subsequently applied light-sensitive resin composition and for the improvement of the adhesion between the surface and the image-forming layer. The aluminum plate may be pre-treated prior to the surface-graining treatment in order to if needed, remove any rolling oil present on the surface thereof and to expose clear aluminum surface. Solvents such as trichlene and surfactants have been used for degreasing (or the removal of such rolling oil). In addition, alkali-etching agents such as sodium hydroxide and potassium hydroxide have widely been used for the latter treatment.

Effectively used herein as the surface-graining methods are, for instance, mechanical, chemical and electrochemical methods. Examples of such mechanical methods are ball graining, blast graining, and brush graining in which the surface of a substrate to be treated is rubbed with a nylon brush in the presence of an aqueous dispersion of an abrasive such as pumice stone; examples of chemical methods suitably used herein are those disclosed in J.P. KOKAI Sho 54-31187 in which a substrate is immersed in a saturated aqueous solution of aluminum salts of mineral acids; and the electrochemical method preferably comprises the step of electrolyzing an aluminum substrate in an acidic electrolyte comprising hydrochloric acid, nitric acid or combination thereof using an alternating current. Among these surface-roughening treatments, particularly preferably used herein is one comprising a combination of mechanical and electrochemical surface-roughening treatments disclosed in J.P. KOKAI Sho 55-137993 because of the improvement of the adhesion of the substrate to the ink receptive images. The surface-graining by the foregoing methods is preferably applied to the substrate surface to such an extent that the central line surface roughness (Ra) observed on the surface of an aluminum plate ranges from 0.3 to 1.0 μm. The aluminum plate thus surface-grained is, if needed, washed with water and chemically etched.

Such an etching solution is usually selected from aqueous solutions of bases or acids capable of dissolving aluminum. In this case, the etching solution should be one, which never form any film of components originated from the etching solution other that aluminum. Examples of such etching agents preferably used herein are basic substances such as sodium hydroxide, potassium hydroxide, tri-sodium phosphate, di-sodium hydrogen phosphate, tri-potassium phosphate and di-potassium hydrogen phosphate; and acidic substances such as sulfuric acid, persulfuric acid, phosphoric acid, hydrochloric acid and salts thereof. However, the use of salts with metals whose ionization tendency is lower than that of aluminum such as zinc, chromium, cobalt, nickel and copper is not preferred since they may form an undesirable film on the etched surface. The etching treatment is most preferably carried out at a desired concentration of the etching agent and a desired etching temperature in such a manner that the rate of dissolution of an aluminum or aluminum alloy plate used ranges from 0.3 to 40 g/m$^2$ per unit immersion time (one minute), but the dissolution rate may be out of the foregoing range.

The etching operation is carried out by immersing an aluminum plate in the foregoing etching liquid or applying the etching solution onto the surface of the aluminum plate and it is preferably carried out in such a manner that the amount of the aluminum removed through etching ranges from 0.5 to 10 g/m$^2$. As the foregoing etching agent, the use of aqueous solution of bases is desirable since they can provide a high etching speed. In this case, smut is formed and therefore, the aluminum plate thus treated is desmutted. In this desmutting treatment, there may be used an acid such as nitric acid, sulfuric acid, phosphoric acid, chromic acid, hydrofluoric acid and borofluoric acid. The aluminum plate thus etched is, if needed, washed with water and then anodized. This anodization treatment may be carried out according to the method currently used in this field. Specifically, a direct or alternating current is passed through an aluminum plate in an aqueous or non-aqueous solution of, for instance, sulfuric acid, phosphoric acid, chromic acid, oxalic acid, sulfamic acid or benzene-sulfonic acid or a combination of at least two of them to thus form an anodized film on the surface of the aluminum plate or substrate.

The conditions for the anodization are variously changed depending on the electrolyte used and cannot thus unconditionally be determined. In general, however it is desirable that the concentration of the electrolyte ranges from 1 to 80% by weight, the temperature thereof ranges from 5 to 70° C., the current density ranges from 0.5 to 60 A/dm$^2$, an electric voltage ranges from 1 to 100 V and the electrolysis time ranges from 30 seconds to 50 minutes. Among these anodization treatments, preferably used herein are, in particular, methods for the anodization in a high current density in sulfuric acid solution as disclosed in U.K. Patent No. 1,412,768 and anodization methods carried out in an electrolytic bath containing phosphoric acid as disclosed in U.S. Pat. No. 3,511,661. The aluminum plate surface-roughened and then anodized by the foregoing methods is, if needed, hydrophilized and examples of such hydrophilization treatments preferably used herein are methods in which the aluminum plate is treated with aqueous solutions of alkali metal silicates such as sodium silicate as disclosed in U.S. Pat. Nos. 2,714,066 and 3,181,461; potassium fluorozirconate as disclosed in J.P. KOKOKU Sho 36-22063; and polyvinyl phosphonic acid as disclosed in U.S. Pat. No. 4,153,461.

<Organic Undercoating Layer>

It is preferred to form an organic undercoating layer to a substrate prior to the application of an image-forming layer onto the surface of the substrate to give a light-sensitive lithographic printing plate of the present invention in order to reduce the amount of the remaining image-forming layer on the non-image areas. Examples of organic compounds used for forming such an organic undercoating layer include carboxymethyl cellulose, dextrin, gum Arabic, phosphonic acids carrying amino groups such as 2-aminoethyl-phosphonic acid, organic phosphonic acids such as phenyl-phosphonic acid, naphthyl-phosphonic acid, alkyl-phosphonic acid, glycerol-phosphonic acid, methylene di-phosphonic acid and ethylene di-phosphonic acid, which may have substituents; organic phosphoric acids such as phenyl-phosphoric acid, naphthyl-phosphoric acid, alkyl-phosphoric acid and glycerol-phosphoric acid, which may have substituents; organic phosphinic acids such as phenyl-phosphinic acid, naphthyl-phosphinic acid, alkyl-phosphinic acid and glycerol-phosphinic acid, which may have substituents; amino acids such as glycine and β-alanine; and hydrochlorides of amines carrying hydroxyl groups such as triethanolamine hydrochloride, which may be used alone or in combination.

Moreover, it is also possible to use at least one member selected from the group consisting of polymeric compounds having, in the molecule, structural units represented by, for instance, poly (p-vinyl benzoate). More specifically, there may be listed, for instance, a copolymer of p-vinyl benzoate with vinyl-benzyl triethylammonium salt and a copolymer of p-vinyl benzoate with vinyl-benzyl trimethylammonium chloride.

The organic undercoating layer may be applied according to the following method. Specifically, a solution of the foregoing organic compound in water or an organic solvent such as methanol, ethanol or methyl ethyl ketone or a mixture thereof is applied onto an aluminum plate and then drying the same; or an aluminum plate is immersed in a solution of the foregoing organic compound in water or an organic solvent such as methanol, ethanol or methyl ethyl ketone or a mixture thereof to thus adsorb the organic compound on the plate surface, followed by washing the plate with, for instance, water and then drying the same to thus form an organic undercoating layer. In the former method, a solution of the organic compound having a concentration ranging from 0.005 to 10% by weight can be applied onto the aluminum plate by a variety of methods. For instance, the solution may be applied thereto according to any method selected from bar coater coating, whirler coating, spray coating or curtain coating. Moreover, in the latter method, the concentration of the dipping solution ranges from 0.01 to 20% by weight, preferably 0.05 to 5% by weight, the dipping temperature ranges from 20 to 90° C., preferably 25 to 50° C. and the dipping time ranges from 0.1 sec to 20 minutes and preferably 2 sec to one minute.

The pH value of the solution used in the formation of the undercoating layer may be adjusted to the range of from 1 to 12 prior to use by the addition of a basic substance such as ammonia, triethylamine or potassium hydroxide or an acidic substance such as hydrochloric acid or phosphoric acid. A yellow dye may be added to the light-sensitive lithographic printing plate for the improvement of the tone reproduction of the plate. Further, a compound represented by the following general formula (a) may be added to the solution:

$(HO)_y$—$R^9$—$(COOH)_z$     (a)

Wherein $R^9$ represents an arylene group having not more than 14 carbon atoms, which may have a substituent, y and z independently represent an integer ranging from 1 to 3. Specific examples of the compounds represented by the foregoing general formula (a) include 3-hydroxy-benzoic acid, 4-hydroxy-benzoic acid, salicylic acid, 1-hydroxy-2-naphthoic acid, 2-hydroxy-1-naphthoic acid, 2-hydroxy-3-naphthoic acid, 2,4-dihydroxy-benzoic acid and 10-hydroxy-9-anthracene carboxylic acid. The coated amount of the organic undercoating layer weighed after drying suitably ranges from 1 to 100 mg/m$^2$ and preferably 2 to 70 mg/m$^2$. If the coated amount is less than 2 mg/m$^2$, the resulting printing plate does not have sufficient printing durability. On the other hand, if it exceeds 100 mg/m$^2$, the same result would be obtained.

<Back Coat>

A back coat is, if necessary, formed on the back face of the substrate. Examples of such back coats preferably used herein are layers of organic polymer compounds disclosed in J.P. KOKAI Hei 5-45885 and coated layers comprising metal oxides obtained by hydrolyzing and polycondensing organic or inorganic metal compounds disclosed in J.P. KOKAI Hei 6-35174. Among these coated layers, alkoxy compounds of silicon such as $Si(OCH_3)_4$, $Si(OC_2H_5)_4$, $Si(OC_3H_7)_4$ and $Si(OC_4H_9)_4$ are cheap and easily available and the coated layer of the metal oxides prepared from these compounds are excellent in the resistance to developers and thus particularly preferably used herein.

<Exposure>

The lithographic printing plate prepared by the foregoing method is in general imagewise exposed to light and then developed. Examples of light sources of actinic rays used for the imagewise exposure are a mercury lamp, a metal halide lamp, a xenon lamp, a chemical lamp and a carbon arc lamp. Examples of radiant rays usable herein are an electron beam, X-rays, an ion beam and far infrared rays. Examples of light sources usable herein also include g-rays, I-rays, Deep-UV light rays and high-density energy beams (laser beams). Examples of laser beams are those emitted from He—Ne lasers, Ar lasers, Kr lasers, He—Cd lasers and KrF excimer lasers. Moreover, light sources emitting light rays having a wavelength falling within the range of from far infrared to infrared region are preferably used for the laser direct exposure type printing plate and solid-state lasers and semiconductor lasers are particularly preferred.

<Development>

Examples of developers used for developing the imagewise exposed presensitized plate for a lithographic printing plate provided thereon with the light-sensitive resin composition of the present invention applied thereto are those comprising (a) at least one saccharide selected from the group consisting of non-reduced saccharides and (b) at least one base and having a pH value falling within the range of from 9.0 to 13.5. this developer will be detailed below. In this respect, the term "developer" used herein means development-initiation solutions (developers in a narrow sense) and replenisher solutions for developers, unless otherwise specified.

This developer comprises, as principal components, at least one compound selected from the group consisting of non-reduced saccharides and at least one base and it preferably has a pH value falling within the range of from 9.0 to 13.5. Such non-reduced saccharides are saccharides, which do not have any free aldehyde and/or ketone groups and which do not show any reducing ability and they are divided into trehalose type oligosaccharides in which reducing groups are linked together, glycosides in which the reducing groups of saccharides are linked to non-saccharides and sugar alcohols obtained by reducing saccharides through hydrogenation. Either of them can suitably be used in the invention. Examples of such trehalose type oligosaccharides are saccharose and trehalose; and examples of glycosides are alkyl glycosides, phenol glycosides and mustard oil glycosides. Moreover, examples of sugar alcohols are D-, L-arabitol (arabite), ribitol, xylitol, D-, L-sorbitol, D-, L-mannitol, D-, L-iditol, D-, L-talitol, dulcitol and allo-dulcitol. Moreover, suitably used herein are maltitol obtained by hydrogenation of disaccharides and reduced derivatives (reduced glucose) obtained by the hydrogenation of oligosaccharides. Among these, particularly preferred non-reduced saccharides are sugar alcohols and saccharose and D-sorbitol, saccharose and reduced glucose are particularly preferred since they have buffering effects in an appropriate pH region and they are cheap.

These non-reduced saccharides can be used alone or in any combination and the rate of the developer occupied by these non-reduced saccharides preferably ranges from 0.1 to 30% by weight and more preferably 1 to 20% by weight.

If the rate of the non-reduced saccharide is less than the lower limit, a sufficient buffering effect thereof cannot be expected, while if it exceeds the upper limit, it would be difficult to concentrate the developer to a high level and a problem arises such as an increase of the production cost. In this regard, if a reducing sugar is used in combination with a base, the resulting developer may undergo browning with the elapse of time and the pH value thereof is gradually reduced. Accordingly, the developer is impaired in its developing ability.

Such bases used in combination with non-reduced saccharides may be conventionally known alkaline agents. Specific examples thereof are inorganic alkaline agents such as sodium hydroxide, potassium hydroxide, lithium hydroxide, tri-sodium phosphate, tri-potassium phosphate, tri-ammonium phosphate, di-sodium hydrogen phosphate, di-potassium hydrogen phosphate, di-ammonium hydrogen phosphate, sodium carbonate, potassium carbonate, ammonium carbonate, sodium hydrogen carbonate, potassium hydrogen carbonate, ammonium hydrogen carbonate, sodium borate, potassium borate and ammonium borate. It is also possible to use organic alkaline agents such as monomethylamine, dimethylamine, trimethylamine, mono-ethylamine, di-ethylamine, tri-ethylamine, mono-isopropylamine, di-isopropyl-amine, tri-isopropylamine, n-butylamine, mono-ethanolamine, di-ethanolamine, tri-ethanolamine, mono-isopropanolamine, di-isopropanolamine, ethylene-imine, ethylene-diamine and pyridine.

These alkaline agents may be used alone or in any combination of at least two of them. Among these, preferably used herein are sodium hydroxide and potassium hydroxide since the pH value of the developer can be controlled over a wide range by adjusting the amount of these alkaline agents with respect to the non-reduced saccharides. Moreover, tri-sodium phosphate, tri-potassium phosphate, sodium carbonate and potassium carbonate are likewise preferred since they have buffering effects in themselves. These alkaline agents are added to the developer so that the pH value of the developer falls within the range of from 9.0 to 13.5, the added amount thereof is determined depending on the desired pH value and the kinds and added amount of the non-reduced saccharides and the pH value of the developer more preferably ranges from 10.0 to 13.2.

Furthermore, the developer may simultaneously comprise an alkaline buffering solution consisting of a combination of a weak acid and a strong base other than saccharides. Such acids used as buffering agents are preferably those having a dissociation constant (pKa) ranging from 10.0 to 13.2. Such weak acids may be, for instance, those disclosed in, for instance, "IONIZATION CONSTATS OF ORGANIC ACIDS IN AQUEOUS SOLUTION", published by Pergamon Press and specific examples thereof are alcohols such as 2,2,3,3-tetrafluoropropanol-1 (pKa 12.74), trifluoro-ethanol (pKa 12.37) and trichloro-ethanol (pKa 12.24); aldehydes such as pyridine-2-aldehyde (pKa 12.68) and pyridine-4-aldehyde (pKa 12.05); phenolic hydroxyl group-containing compounds such as salicylic acid (pKa 13.0), 3-hydroxy-2-naphthoic acid (pKa 12.84), catechol (pKa 12.6), gallic acid (pKa 12.4), sulfo-salicylic acid (pKa 11.7), 3,4-dihydroxy-sulfonic acid (pKa 12.2), 3,4-dihydroxy benzoic acid (pKa 11.94), 1,2,4-trihydroxy-benzene (pKa 11.82), hydroquinone (pKa 11.56), pyrogallol (pKa 11.34), o-cresol (pKa 10.33), resorcinol (pKa 11.27), p-cresol (pKa 10.27) and m-cresol (pKa 10.09); oximes such as 2-butanone-oxime (pKa 12.45), acetoxime (pKa 12.42), 1,2-cycloheptane-dione-dioxime (pKa 12.3), 2-hydroxy-benzaldehyde-oxime (pKa 12.10), dimethyl glyoxime (pKa 11.9), ethane-diamide dioxime (pKa 11.37) and acetophenone oxime (pKa 11.35); nucleus-related substances such as adenosine (pKa 12.56), inosine (pKa 12.5), guanine (pKa 12.3), cytosine (pKa 12.2), hypoxanthine (pKa 12.1) and xanthine (pKa 11.9); and other weak acids such as diethylamino-methyl-phosphonic acid (pKa 12.32), 1-amino-3,3,3-trifluoro-benzoic acid (pKa 12.29), iso-propylidene di-phosphonic acid (pKa 12.10), 1,1-ethylidene-di-phosphonic acid (pKa 11.54), 1,1-ethylidene-di-phosphonic acid (pKa 11.52), benzimidazole (pKa 12.86), thiobenzamide (pKa 12.8), picoline-thioamide (pKa 12.55) and barbituric acid (pKa 12.5).

Among these weak acids, preferred are sulfo-salicylic acid and salicylic acid. Examples of bases suitably used in combination with these weak acids are sodium hydroxide, potassium hydroxide, ammonium hydroxide and lithium hydroxide. These alkaline agents may be used alone or in any combination of at least two of them. The pH value of the developer may be appropriately be adjusted by appropriately controlling the concentration of the foregoing alkaline agents and appropriately combining the alkaline agents.

The developer may further comprise, if necessary, a variety of surfactants and/or organic solvents for the purpose of accelerating the developing operations, dispersion of development scum and improving the ink-affinity of the image portion of the printing plate. Examples of preferred surfactants are anionic, cationic, nonionic and amphoteric surfactants.

Examples of preferred surfactants are nonionic surfactants such as polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol mono-fatty acid esters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylene-modified castor oils, polyoxyethylene glycerin fatty acid partial esters, fatty acid diethanolamides, N,N-bis-2-hydroxyl-alkylamines, polyoxyethylene alkylamines, tri-ethanolamine fatty acid esters and tri-alkylamine-oxides; anionic surfactants such as fatty acid salts, abietic acid salts, hydroxyalkane-sulfonic acid salts, alkane-sulfonic acid salts, dialkyl-sulfosuccinic acid ester salts, linear alkylbenzene-sulfonic acid salts, branched alkylbenzene-sulfonic acid salts, alkyl-naphthalene-sulfonic acid salts, alkyl-phenoxy polyoxyethylene propyl-sulfonic acid salts, polyoxyethylene alkyl-sulfophenyl ether salts, N-methyl-N-oleyl taurine sodium salt, N-alkylsulfo-succinic acid monoamide di-sodium salts, petroleum sulfonic acid salts, sulfated tallow oil, sulfuric acid ester salts of fatty acid alkyl esters, alkylsulfuric acid ester salts, polyoxyethylene alkyl ether sulfuric acid ester salts, fatty acid monoglyceride sulfuric acid ester salts, polyoxyethylene alkyl-phenyl ether sulfuric acid ester salts, polyoxyethylene styryl-phenyl ether sulfuric acid ester salts, alkyl-phosphoric acid ester salts, polyoxyethylene alkyl ether phosphoric acid ester salts, polyoxyethylene alkyl-phenyl ether phosphoric acid ester salts, partially saponified styrene/maleic anhydride copolymers, partially saponified olefin/maleic anhydride copolymers and naphthalene-sulfonic acid salt-formalin condensates; cationic surfactants such as alkylamines, quaternary ammonium salts such as tetra-butyl-ammonium bromide, polyoxyethylene alkylamine salts and polyethylene polyamine derivatives; amphoteric surfactants such as carboxy betaines, aminocarboxylic acids, sulfo-betaines, amino-sulfuric acid esters and imidazolines. The term "polyoxyethylene" in the terminology of the surfactants listed above may be replaced with other polyoxyalkylenes such as polyoxymethylene, polyoxypropylene and polyoxybutylene and such surfactants may likewise be used in the present invention.

Moreover, preferred surfactants are fluorine atom-containing surfactants comprising perfluoroalkyl groups in the molecule. Examples of such fluorine atom-containing surfactants are anionic ones such as perfluoroalkyl carboxylic acid salts, perfluoroalkyl sulfonic acid salts and perfluoroalkyl phosphoric acid esters; amphoteric ones such as perfluoroalkyl betaines; cationic ones such as perfluoroalkyl trimethyl-ammonium salts; and nonionic ones such as perfluoroalkyl amine oxides, perfluoroalkyl-ethylene oxide adducts, perfluoroalkyl group and hydrophilic group-containing oligomers, perfluoroalkyl group and lipophilic group-containing oligomers, perfluoroalkyl group, hydrophilic group and lipophilic group-containing oligomers and perfluoroalkyl group and lipophilic group-containing urethanes. The foregoing surfactants may be used alone or in any combination of at least two of them and they may be added to the developer in an amount ranging from 0.001 to 10% by weight and more preferably 0.01 to 5% by weight.

The developer may comprise a variety of development stabilizers. Examples of such stabilizers are polyethylene glycol adducts of sugar alcohols, tetra-alkyl-ammonium salts such as tetra-butyl-ammonium hydroxide, phosphonium salts such as tetra-butyl-phosphonium bromide, and iodonium salts such as diphenyl iodonium chloride as disclosed in J.P. KOKAI Hei 6-282079. Examples of other stabilizers usable herein are anionic or amphoteric surfactants disclosed in J.P. KOKAI Sho 50-51324; water-soluble cationic polymers disclosed in J.P. KOKAI Sho 55-95946; and water-soluble amphoteric polyelectrolytes disclosed in J.P. KOKAI Sho 56-142528.

Moreover, examples of such stabilizers also include organo-boron compounds to which alkylene glycol is added as disclosed in J.P. KOKAI Sho 59-84241; polyoxyethylene-polyoxypropylene block polymer type water-soluble surfactants disclosed in J.P. KOKAI Sho 60-111246; polyoxyethylene-polyoxypropylene-substituted alkylene-diamine compounds disclosed in J.P. KOKAI Sho 60-129750; polyethylene glycols having a weight average molecular weight of not less than 300 as disclosed in J.P. KOKAI Sho 61-215554; fluorine atom-containing surfactants having cationic groups such as those disclosed in J.P. KOKAI Sho 63-175858; water-soluble ethylene oxide-added compounds obtained by adding not less than 4 moles of ethylene oxide to acids or alcohols such as those disclosed in J.P. KOKAI Hei 2-39157; and water-soluble polyalkylene compounds.

The developer may likewise comprise, if needed, an organic solvent. Such an organic solvent may suitably be selected from those having a solubility in water of not more than about 10% by weight and preferably not more than 5% by weight. Specific examples thereof are 1-phenyl-ethanol, 2-phenyl-ethanol, 3-phenyl-1-propanol, 4-phenyl-1-butanol, 4-phenyl-2-butanol, 2-phenyl-1-butanol, 2-phenoxy-ethanol, 2-benzyloxy-ethanol, o-methoxy-benzyl alcohol, m-methoxy-benzyl alcohol, p-methoxy-benzyl alcohol, benzyl alcohol, cyclohexanol, 2-methyl-cyclohexanol, 3-methyl-cyclohexanol and 4-methyl-cyclohexanol, N-phenyl-ethanolamine and N-phenyl-diethanolamine.

The content of the organic solvent ranges from 0.1 to 5% by weight on the basis of the total weight of the developer liquid used. The amount thereof to be used is closely related to the amount of the surfactant used. More specifically, it is preferred to increase the amount of the surfactant as the amount of the organic solvent increases. This is because if the amount of the surfactant is small and the organic solvent is used in a large amount, the latter is not completely dissolved in the developer and therefore, it is difficult to ensure a desired good developing ability.

The developer may further comprise a reducing agent. This is used for preventing any contamination of the printing plate and the use thereof is quite effective when developing a negative light-sensitive lithographic printing plate comprising a light-sensitive diazonium salt compound. Examples of preferred organic reducing agents are phenolic compounds such as thio-salicylic acid, hydroquinone, metol, methoxy-quinone, resorcin and 2-methylresorcin; and amine compounds such as phenylene-diamine and phenyl hydrazine. Moreover, examples of preferred inorganic reducing agents are salts such as sodium salts, potassium salts and ammonium salts of inorganic acids such as sulfurous acid, hydrogen sulfurous acid, phosphorous acid, hydrogen phosphorous acid, di-hydrogen phosphorous acid, thio-sulfuric acid and dithionic acid. Among these reducing agents, those particularly excellent in the effect of preventing contamination are sulfites. These reducing agents are incorporated into the developer in an amount ranging from 0.05 to 5% by weight on the basis of the developer practically used.

The developer may likewise comprise an organic carboxylic acid. Such organic carboxylic acids are preferably aliphatic and aromatic carboxylic acids having 6 to 20 carbon atoms. Specific examples of such aliphatic carboxylic acids are caproic acid, enanthylic acid, caprylic acid, lauric acid, myristic acid, palmitic acid and stearic acid, with alkanoic acids having 8 to 12 carbon atoms being particularly preferred. Moreover, it is also possible to use unsaturated fatty acids having double bonds in the carbon chains and those having branched carbon chains. Examples of aromatic carboxylic acids are compounds having, for instance, benzene, naphthalene and anthracene rings carrying hydroxyl groups as substituents and specific examples thereof are o-chloro-benzoic acid, p-chloro-benzoic acid, o-hydroxy-benzoic acid, p-hydroxy-benzoic acid, o-aminobenzoic acid, p-aminobenzoic acid, 2,4-dihydroxybenzoic acid, 2,5-di-hydroxy-benzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid and 2-naphthoic acid, with hydroxy naphthoic acid being particularly preferred.

The foregoing aliphatic and aromatic carboxylic acids are preferably used in the form of sodium, potassium and/or ammonium salts for improving the solubility thereof in water. The content of the organic carboxylic acids to be incorporated into the developer of the present invention is not particularly restricted, but if it is less than 0.1% by weight, the effect thereof is insufficient, while if it exceeds 10% by weight, not only any further improvement of the effect cannot be expected, but also they may often prevent the dissolution of other additives when the latter is simultaneously used. Accordingly, the preferred amount thereof to be added ranges from 0.1 to 10% by weight and more preferably 0.5 to 4% by weight on the basis of the weight of the developer practically used.

The developer may, if necessary, further comprise other additives such as preservatives, coloring agent, thickening agents, anti-foaming agents and water softeners. Examples of water softeners are polyphosphoric acid and sodium, potassium and ammonium salts thereof; amino-polycarboxylic acids such as ethylenediamine-tetraacetic acid, diethylenetriamine-pentaacetic acid, triethylenetetramine-hexaacetic acid, hydroxyethyl ethylenediamine tri-acetic acid, nitrilotriacetic acid, 1,2-diamino-cyclohexane-tetraacetic acid and 1,3-diamino-2-propanol-tetraacetic acid and sodium, potassium and ammonium salts thereof; and amino-tri(methylene-phosphonic acid), ethylenediamine-tetra(methylene-phosphonic acid), diethylene-triamine penta-(methylene-phosphonic acid), triethylene-tetramine-hexa(methylene-phosphonic acid), hydroxyethyl-ethylene-diamine-tri(methylene-phosphonic acid) and 1-hydroxy-ethane-1,1-diphosphonic acid and sodium, potassium and ammonium salts thereof.

The optimum amount of the water softener to be used varies depending on its chelating ability, the hardness of the hard water used and the amount thereof, but the amount thereof currently used ranges from 0.01 to 5% by weight and more preferably 0.01 to 0.5% by weight on the basis of the weight of the developer practically used. If the amount thereof is less than the lower limit, the desired purpose cannot be attained, while if it exceeds the upper limit, the use thereof adversely affects the image area and causes, for instance, color blinding. The balance of the developer is water. It is advantageous that the developer is concentrated to a moisture content lower than that of the developer practically used so that it may be diluted with water immediately before the practical use from the viewpoint of the easiness of transportation. In this case, the developer is concentrated to such an extent that the components thereof never undergo any separation and precipitation.

In the development of the presensitized plate for a lithographic printing plate in which the light-sensitive resin composition of the present invention is used, it is also possible to use the developer disclosed in J.P. KOKAI Hei 6-282079. This is a developer comprising an alkali metal silicate having a molar ratio: $SiO_2/M_2O$ (M represents an alkali metal) ranging from 0.5 to 2.0 and a water-soluble ethylene oxide-added compound obtained by adding not less than 5 moles of ethylene oxide to a sugar alcohol having not less than 4 hydroxyl groups. The sugar alcohol is a polyhydric alcohol corresponding to a product obtained by reducing the aldehyde and ketone groups of a saccharide into primary and secondary alcohol groups respectively. Specific examples of such sugar alcohols are D-, L-threitol, erythritol, D-, L-arabitol, ribitol, xylitol, D-, L-sorbitol, D-, L-mannitol, D-, L-iditol, D-, L-talitol, dulcitol and allo-dulcitol as well as di-, tri-, tetra-, penta- and hexa-glycerins obtained by condensing sugar alcohols. The foregoing water-soluble ethylene oxide-added compound can be obtained by adding not less than 5 moles of ethylene oxide to one mole of the foregoing sugar alcohol. Moreover, the ethylene oxide-added compound may, if needed, be block-copolymerized with propylene oxide to such an extent that the solubility of the product is not adversely affected. These ethylene oxide-added compounds may be used alone or in any combination of at least two thereof. The amount of these water-soluble ethylene oxide-added compounds to be added suitably ranges from 0.001 to 5% by weight and more preferably 0.001 to 2% by weight on the basis of the amount of the developer (practically used one).

Further this developer may if necessary comprise a variety of surfactants and/or organic solvents already listed above for promoting the development, for dispersing development scum and for the improvement of the ink-affinity of the image area of the printing plate.

The PS plate, which has been treated with a developer having such a composition, is then subjected to post-treatments with, for instance, washing water, a rinsing liquid containing, for instance, a surfactant, a finisher mainly comprising gum Arabic and a starch derivative and a protective gumming solution. In the post-treatment of the PS plate of the present invention, the foregoing treatments can variously be combined.

Recently, there has widely been used an automatic developing machine for treating PS plates in the fields of template and printing for the rationalization and standardization of the plate-making operations. This automatic developing machine in general comprises a developing zone and a post-treatment zone and it comprises a device for transporting PS plates, baths for storing various processing solutions and a spray device. In the automatic developing machine, each processing solution pumped up is sprayed onto an exposed PS plate, while horizontally conveying the PS plate to thus conduct the development and post-treatments. Alternatively, there have recently been known a method in which an exposed PS plate is transported while passing the plate through a bath filled with a processing solution by the action of submerged guide rolls to thus develop the plate and a method in which a small predetermined amount of washing water is fed to the plate surface after the development to wash the same with water and the resulting waste water is reused as a diluent for the stock solution of the developer.

In such automatic treatment, the PS plate may be processed while a replenisher for each processing solution is supplemented in proportion to the throughput and the operation time of the device. Moreover, it is also possible to process the PS plate according to so-called disposable processing system in which the plate is processed with a substantially fresh processing solution. The lithographic printing plate obtained after such processing is installed to an offset printing press to thus form a large number of printed matters.

EXAMPLES

The present invention will hereunder be described in more detail with reference to the following Examples, but the present invention is not restricted to these specific Examples at all.

Synthetic Example 1

To a glass flask equipped with a stirring device, a condenser and a thermometer, there was added 100 parts by weight of methyl ethyl ketone (hereunder referred to as "MEK") and it was heated to 75° C. in a hot water bath, followed by dropwise addition of a mixture containing 50 parts by weight of 2,2,3,3,4,4,4-heptafluorobutyl acrylate (I-1), 45 parts by weight of Blemmer AP-400 (available from Nippon Oil and Fats Co., Ltd.) or a monoacrylate compound having propylene oxide on the side chains, 5 parts by weight of Blemmer AE-400 (available from Nippon Oil and Fats Co., Ltd.) or a monoacrylate compound having ethylene oxide on the side chains, 100 parts by weight of methyl ethyl ketone and 1 part by weight of V-601 (available from WACO Pure Chemical Co., Ltd.) as a polymerization initiator using a dropping funnel in a nitrogen gas stream over 2 hours. After the completion of the dropwise addition, the content of the flask was stirred at 75° C. for 2 hours and further at 90° C. for 2 hours. The weight average molecular weight (polystyrene standard) of the resulting polymeric compound (fluorine atom-containing polymer (a)) was determined by gel permeation chromatography technique and it was found to be 58,000.

Synthetic Example 2

To a glass flask equipped with a stirring device, a condenser and a thermometer, there were added 60 parts by weight of fluorinated alkyl group-containing acrylate monomer (II-6), 40 parts by weight of a monoacrylate compound carrying copolymers of ethylene oxide and propylene oxide on the side chains and 200 parts by weight of MEK, the mixture was heated to 75° C. in a nitrogen gas stream, followed by addition of one part by weight of V-601 as an initiator and 10 parts by weight of lauryl mercaptan as a chain transfer agent, stirring the mixture for 5 hours and further stirring the same at 90° C. for additional 2 hours. The weight average molecular weight (polystyrene standard) of the resulting polymeric compound (fluorine atom-containing polymer (b)) was determined by gel permeation chromatography technique and it was found to be 8,300.

Synthetic Examples 3 to 6

The same procedures used in Synthetic Example 2 were repeated to thus synthesize fluorine atom-containing polymers (c) to (f) listed in the following Table 1.

TABLE 1

| F atom-containing polymers | constitution units | weight ratio of each unit | Mw |
|---|---|---|---|
| (a) | —(CH$_2$—CH)— \| COOCH$_2$CF$_2$CF$_2$CF$_3$    —(CH$_2$—CH)— \| COO(C$_3$H$_6$O)$_6$H    —(CH$_2$—CH)— \| COO(C$_2$H$_4$O)$_6$H | 50:45:5 | 58000 |
| (b) | —(CH$_2$—CH)— \| COO(CH$_2$)$_6$CF(CF$_3$)$_2$    —(CH$_2$—CH)— \| COO(C$_2$H$_4$O)$_{11}$(C$_3$H$_6$O)$_{22}$(C$_2$H$_4$O)H | 60:40 | 8300 |
| (c) | —(CH$_2$—CH)— \| COOCH$_2$CH$_2$CF$_2$CF$_3$    —(CH$_2$—CH)— \| COO(C$_3$H$_6$O)$_7$H | 55:45 | 12800 |
| (d) | —(CH$_2$—C(CH$_3$))— \| COOCH(CF$_3$)$_2$    —(CH$_2$—CH)— \| COO(C$_3$H$_6$O)$_6$H    —(CH$_2$—C(CH$_3$))— \| COO(C$_2$H$_4$O)$_6$H | 40:50:10 | 48000 |
| (e) | —(CH$_2$—CH)— \| COOCH$_2$CH$_2$CF$_2$CF$_2$CF$_3$    —(CH$_2$—C(CH$_3$))— \| COO(C$_2$H$_4$O)$_4$CH$_3$    —CH$_2$—C(CH$_3$)— \| COOCH$_3$ | 40:20:40 | 26000 |
| (f) | —(CH$_2$—CH)— \| CONHCH$_2$CH$_2$CF$_2$CF$_2$CF$_3$    —(CH$_2$—CH)— \| COO(C$_3$H$_6$O)$_6$H | 70:30 | 67000 |

TABLE 1-continued

| F atom-containing polymers | constitution units | | | weight ratio of each unit | Mw |
|---|---|---|---|---|---|
| (g)* | —(CH$_2$—CH)—<br>\|<br>COOCH$_2$CH$_2$C$_8$F$_{17}$ | —(CH$_2$—CH)—<br>\|<br>COO(C$_3$H$_6$O)$_6$H | —(CH$_2$—CH)—<br>\|<br>COO(C$_2$H$_4$O)$_6$H | 40:50:10 | 34000 |
| (h)* | —(CH$_2$—CH)—<br>\|<br>COOCH$_2$CH$_2$NSO$_2$C$_8$F$_{17}$<br>\|<br>C$_3$H$_7$ | —(CH$_2$—CH)—<br>\|<br>COO(C$_3$H$_6$O)$_6$H | | 40:60 | 43000 |

*Comparative compounds

Example 1

The fluorine atom-containing polymer prepared in Synthetic Example 1 was added to the following 4 kinds of paints in an amount of 0.5% on the basis of the amount of the resin solid content and the resulting resin liquids for paint and coated film surfaces prepared under the conditions detailed below were evaluated according to the following methods. In this respect, the thickness of the coated films prepared under the following conditions was 30 μm.

(Method for Preparing Coated Film)

Each resin solution for paint was applied onto a steel plate (SPCC-SB) using Acrydick A-181 (available from Dainippon Ink and Chemicals, Inc.) by means of a bar coater, followed by allowing to stand at room temperature for one week to give each corresponding coated film for evaluation.

<Test Methods and Evaluation Criteria>

(1) Foaming Ability

The resulting resin solution for paint (50 cc) was weighed out in a 100 cc sampling bottle equipped with a hermetic stopper, followed by shaking the bottle over 50 times at a rate of 2 times/sec at an amplitude of 30 cm, allowing it to stand and thereafter the confirmation of the condition of the foams thus formed.

◯: Foams were disappeared immediately after the initiation of the settling down.

Δ: Foams were disappeared after one minute from the initiation of the settling down.

X: Foams were still present even after one minute from the initiation of the settling down.

(2) Leveling Characteristics

The resulting coated film was inspected for the leveling ability by visually observing, for instance, the smoothness of the film surface and the presence of cissing on the surface thereof.

◯: There is not observed any unevenly coated region and any cissing at all.

Δ: There is observed almost no unevenly coated region, but there is observed cissing on the film surface.

X: There are observed both unevenly coated region and cissing on the film surface.

(3) Re-Coating Ability

On the film surface, there were formed 100 squares (1 mm square each) using a cutter knife and then a tape (Cellophane Tape™)-peeling test was conducted. The re-coating ability was evaluated by means of the number of un-peeled squares out of the 100 squares. Therefore, the larger the number of the un-peeled squares, the higher the re-coating ability of the sample.

Examples 2 to 6

The procedures used in Example 1 were repeated except for using the fluorine atom-containing polymers prepared in Synthetic Examples 2 to 6 to thus form coated films and resin solutions for paint. Then they were evaluated by repeating the same procedures likewise used in Example 1.

Comparative Example 1

The procedures used in Example 1 were repeated except that any fluorine atom-containing polymer was not used to thus form coated films and resin solutions for paint. Then they were evaluated by repeating the same procedures likewise used in Example 1.

Comparative Examples 2 to 3

The procedures used in Example 1 were repeated except for using the fluorine atom-containing polymers (g) and (h) as comparative compounds to thus form coated films and resin solutions for paint. Then they were evaluated by repeating the same procedures likewise used in Example 1.

The results of the foregoing evaluation are summarized in the following Table 2.

TABLE 2

| Ex. No. | F-Containing Polymer | Foaming Ability | Leveling Characteristics | Re-coating Ability |
|---|---|---|---|---|
| 1 | (a) | ◯ | ◯ | 100 |
| 2 | (b) | ◯ | ◯ | 100 |
| 3 | (c) | ◯ | ◯ | 99 |
| 4 | (d) | ◯ | ◯ | 98 |
| 5 | (e) | ◯ | ◯ | 100 |
| 6 | (f) | ◯ | ◯ | 99 |
| 1* | — | ◯ | X | 100 |
| 2* | (g) | X | ◯ | 80 |
| 3* | (h) | X | ◯ | 75 |

*Comparative Example

Examples 7 to 12 Comparative Examples 4 to 6

In a mixed solvent containing 20 g of ethyl lactate and 8.6 g of propylene glycol monomethyl ether acetate, there were dissolved 7.43 g of a novolak resin (molecular weight: 3200) prepared from m-cresol/p-cresol/2,5-xylenol=5/4/1 (molar ratio) and formaldehyde/acetaldehyde=8/2 (molar ratio) and 4.17 g of 1,2-naphthoquinonediazide sulfonic acid ester (rate of esterification: 40%) of m-cresol-acetaldehyde condensate (molecular weight: 1000). To the resulting solution, there were added 200 ppm each of the fluorine atom-containing polymers specified in Table 1. These solutions were purified by passing through a Teflon filter having a pore size of 0.2 µm to thus prepare photo resist compositions.

These photo resist compositions were inspected for the following physical properties. The results thus obtained are listed in the following Table 3.

(1) Uneven Coating

Each photo resist composition (2 ml) was dropwise applied onto a silicon wafer having a diameter of 5 inches, extended over the wafer surface by the spin coating technique, the solvent was removed by heating the coated wafer on a hot plate for 70 seconds to thus form a photo resist film having a thickness of 1.5 µm. The coated film was observed by an optical microscope to thus examine the presence of any stripe-like uneven coating.

(2) Anti-Foaming Ability

Each photo resist composition (20 ml) was introduced into a 50 ml sample tube and these sample tubes were vigorously shaken over 20 times. Then they were allowed to stand and the time required till the foams thus generated were disappeared.

(3) Uncoated Area

Each photo resist composition (1.5 ml) was dropwise applied onto a silicon wafer having a diameter of 5 inches, extended over the wafer surface by the spin coating technique, the solvent was removed by heating the coated wafer on a hot plate for 70 seconds to thus form a photo resist film having a thickness of 1.5 µm. The coated film was visually observed to determine the presence of uncoated area.

TABLE 3

| Ex. No. | F-Containing Polymer | Uneven Coating | Anti-foaming Ability (min) | Uncoated Area |
| --- | --- | --- | --- | --- |
| 7 | (a) | Not observed | 21 | Not observed |
| 8 | (b) | Not observed | 28 | Not observed |
| 9 | (c) | Not observed | 31 | Not observed |
| 10 | (d) | Not observed | 26 | Not observed |
| 11 | (e) | Not observed | 33 | Not observed |
| 12 | (f) | Not observed | 35 | Not observed |
| 4* | — | Severely observed | 21 | Observed |
| 5* | (g) | Not observed | ≧120 | Not observed |
| 6* | (h) | Not observed | ≧120 | Not observed |

*Comparative Example

Moreover, the photo resist composition (2 ml) prepared in Example 7 was dropwise applied onto a silicon wafer having a diameter of 5 inches, extended over the wafer surface by the spin coating technique, the solvent was removed by heating the coated wafer on a hot plate maintained at 80° C. for 70 seconds to thus form a photo resist film having a thickness of 1.5 µm. The resulting resist film was exposed to light using i-ray stepper (NA.=0.50) available from Nikon Corporation, heated on a hot plate maintained at 110° C. for 70 seconds and then immersed in a 2.38% aqueous solution of tetramethyl ammonium hydroxide for 60 seconds to thus develop the exposed resist film. The cross sectional shape of the pattern thus formed was examined by an electron microscope to thus evaluate resolution (minimum size of line width/line distance pattern separated or resolved at an exposure value, which permits the 1:1 finishing of 0.6 µm line width/line distance pattern) and it was found that the resist film showed excellent resolution on the order of 0.45 µm.

Examples 13 to 24, Comparative Examples 7 to 11

In the following Examples, the entire term "%" means "% by weight" unless otherwise specified.

A JIS A-1050 aluminum plate having a thickness of 0.24 mm was subjected to a brush graining treatment using a rotated brush specified below while supplying a suspension of pumice stone having an average particle size of about 2.1 µm in water to the aluminum plate surface. A first brush had a hair length of 100 mm, a hair diameter of 0.95 mm and an implantation density of 70/cm$^2$ and a second brush had a hair length of 80 mm, a hair diameter of 0.295 mm and an implantation density of 670/cm$^2$. The brushes were both rotated at a rate of 250 rpm. After the brush graining and the subsequent sufficient water washing, the aluminum plate was etched by immersing it in a 10% aqueous sodium hydroxide solution at 60° C. for 25 seconds, followed by washing with running water, neutralization and washing with a 20% nitric acid solution and water washing. The aluminum plates were subjected to an electrolytic surface roughening treatment at the quantity of electricity at the anode time of 160 coulomb/dm$^2$ in a 1% aqueous nitric acid solution at VA=12.7 V using a sinusoidal alternating waved current. The surface roughness of these plate were determined and it was found to be 0.79 µm (as expressed in terms of Ra unit). Subsequently, the aluminum plates were immersed in a 1% aqueous sodium hydroxide solution maintained at 40° C. for 30 seconds, desmutted by immersing them in a 30% aqueous sulfuric acid solution maintained at 60° C. for 40 seconds and anodized at a current density of 2A/dm$^2$ in a 20% aqueous sulfuric acid solution using a DC current so that the amount of the resulting anodized film was 1.6 g/m$^2$ to thus prepare substrates.

An under coat liquid 1 having the following composition was applied onto the surface of the substrate thus treated and dried at 80° C. for 30 seconds. The coated amount weighed after drying was found to be 10 mg/m$^2$.

| (Under Coat Liquid 1) | |
| --- | --- |
| β-alanine | 0.10 g |
| Methanol | 40 g |
| Pure water | 60 g |

Thus a substrate (I) was prepared. Then the following coating liquid 1 for forming an image-forming layer was applied onto the substrate (I) in a coated amount of 12 ml/m$^2$ by the rod coating technique and then dried at 100° C. for one minute to give a positive presensitized plate useful for preparing a lithographic printing plate. The coated amount weighed after drying was found to be 1.15 g/m$^2$.

| (Coating liquid 1 for forming image-forming layer) | |
| --- | --- |
| Ester of 1,2-diazonaphthoquinone-5-sulfonyl chloride and pyrogallol-acetone resin (product disclosed in Ex. 1 of U.S. Pat. No. 3,635,709) | 0.8 g |
| Cresol-formaldehyde novolak resin (m/p ratio = 6:4, weight average molecular weight (Mw) = 8000 | 1.5 g |

-continued

| (Coating liquid 1 for forming image-forming layer) | |
|---|---|
| Phenol-formaldehyde resin (Mw = 15,000) | 0.3 g |
| Poly[N-(p-amino-sulfonyl-phenyl)acrylamide-co-n-butyl acrylate-co-diethylene glycol monomethyl ether methacrylate] (molar ratio of monomers: 40/40/20, Mw = 40,000, number average molecular weight (Mn) = 20,000) | 0.2 g |
| p-n-Octylphenol-formaldehyde resin (U.S. Pat. No. 4,123,279) | 0.02 g |
| Naphthoquinone-diazide-1,2-diazide-4-sulfonic acid chloride | 0.01 g |
| Tetrahydro-phthalic acid anhydride | 0.02 g |
| Pyrogallol | 0.05 g |
| 4-[p-N,N-bis(ethoxy-carbonyl-methyl) amino-phenyl]-2,6-bis(trichloromethyl)-s-triazine | 0.07 g |
| Dye obtained by substituting 1-naphthalene-sulfonic acid for the counter ion of Victoria Pure Blue BOH (available from Hodogaya Chemical Co., Ltd.) | 0.045 g |
| Fluorine atom-containing polymer (see Table 4) | See Table 2 |
| MEK/1-methoxy-2-propanol | 15 g/10 g |

TABLE 4

| | F-containing polymer | Added Amt. (solid content) |
|---|---|---|
| Light-sensitive material 1 (Example) | (a) | 0.015 g |
| Light-sensitive material 2 (Example) | (b) | 0.02 g |
| Light-sensitive material 3 (Example) | (c) | 0.02 g |
| Light-sensitive material 4 (Example) | (d) | 0.01 g |
| Light-sensitive material 5 (Example) | (e) | 0.03 g |
| Light-sensitive material 6 (Example) | (f) | 0.015 g |
| Light-sensitive material R1 (Comparative Example) | (g) | 0.015 g |
| Light-sensitive material R2 (Comparative Example) | (h) | 0.025 g |
| Light-sensitive material R3 (Comparative Example) | Not added | None |

Moreover, the light-sensitive lithographic printing plate thus prepared was visually inspected for the surface conditions of the image-forming layer. The surface conditions were expressed in terms of the number of pinholes generated per unit area (1 m$^2$).

Further, a mat layer was formed on the image-forming layer according to the method disclosed in J.P. KOKOKU Sho 61-28986 in order to shorten the time required for the adhesion under vacuum.

The presensitized plate for a lithographic printing plate thus prepared was evaluated according to the following methods. After imagewise exposing the presensitized plate through an original carrying solid and half tone dot images for one minute using a 3 kW metal halide lamp placed at distance 1.5 m from the plate surface, the following developer 1 and FP2W (1:1) (available from Fuji Photo Film Co., Ltd.) as a finisher were charged in PS Processor 900V (available from Fuji Photo Film Co., Ltd.) and the imagewise exposed plate was developed at 30° C. for 12 seconds to give each corresponding lithographic printing plate. Then the resulting printing plate was installed to R201 Printing Press available from Roland Company and printing operation was carried out using GEOS-G (N) (available from Dainippon Ink and Chemicals, Inc.) as ink and the number of printed matters required for achieving a desired ink density on the image portion after the initiation of the printing operation (the number of printed matter sufficiently receiving ink) was determined. The smaller the number of printed matters, the better the lithographic printing plate. Moreover, the printing operation was continued till the solid portion on the printed matter underwent blurring to determine the number of the printed matters obtained before the occurrence of such blurring to thus evaluate the printing durability. The greater the number of printed matters, the better the lithographic printing plate. The results thus obtained are summarized in the following Table 5.

TABLE 5

| Ex. No. | Light-sensitive material | Surface conditions | Ink-received printed matter | Printing Durability |
|---|---|---|---|---|
| 13 | Light-sensitive material 1 | ≦5 | 15 | 150,000 |
| 14 | Light-sensitive material 2 | ≦5 | 13 | 160,000 |
| 15 | Light-sensitive material 3 | ≦5 | 16 | 180,000 |
| 16 | Light-sensitive material 4 | ≦5 | 11 | 180,000 |
| 17 | Light-sensitive material 5 | ≦5 | 14 | 160,000 |
| 18 | Light-sensitive material 6 | ≦5 | 12 | 170,000 |
| 7* | Light-sensitive material R1 | ≧10 | 30 | 120,000 |
| 8* | Light-sensitive material R2 | ≧10 | 25 | 110,000 |
| 9* | Light-sensitive material R3 | See Note 1 | — | — |

Note 1:
The entire surface was patterned with spots and the film was non-uniform.

As will be clear from the data listed in Table 5, the presensitized plate for preparing a lithographic printing plate according to the present invention in which a specific fluorine atom-containing polymer is used is quite excellent in the uniformity of the image-forming layer. Moreover, the foregoing presensitized plate provided an excellent lithographic printing plate, which could simultaneously satisfy the requirements for the ink-receptivity and the printing durability. Contrary to this, the presensitized plates prepared in Comparative Examples 7 and 8 in which fluorine atom-containing polymers beyond the scope of the present invention were used provided a lithographic printing plate whose surface conditions were not uniform and which were inferior in the ink-receptivity and the printing durability. In addition, with respect to the surface condition of the light-sensitive material of Comparative Example 9, the entire surface of the material was patterned with spots and the film was non-uniform. Therefore, tests for determining the ink-receiving printed matter and printing durability could not be conducted. As has been described above, the presensitized plate of the present invention makes use of an image-forming layer comprising a fluorine atom-containing polymer obtained by appropriately selecting a fluorine-containing monomer and a copolymerizable monomer having a specific structure and accordingly, the presensitized plate would be improved in the surface condition thereof and show excellent ink-receptivity and high printing durability.

Then the foregoing light-sensitive presensitized plate useful for preparing a lithographic printing plate was evaluated by the following method. The sensitivity thereof was determined by exposing, through a step wedge (density difference between the neighboring two steps: 0.15) (available from Fuji Photo Film Co., Ltd.), to light from a 3 kW metal halide lamp positioned at a distance of 1 m from the surface of the plate for one minute and then developing the same at 30° C. for 12 seconds with an aqueous solution having an $SiO_2/K_2O$ molar ratio of 1.16 and an $SiO_2$ concentration of 1.4% in PS Processor 900V (available from Fuji Photo Film Co., Ltd.). The sensitivity was expressed in terms of the clear step number. The higher the step number, the higher the sensitivity of the plate. The gradation was expressed in terms of the difference between the clear step number and the solid step number observed for the foregoing samples used in the sensitivity evaluation. The smaller the gradation, the higher the contrast of the plate. The development latitude was determined by repeating the same exposure and development used above for the determination of the sensitivity except for using the foregoing developer whose pH value was increased and decreased by 0.2 and expressed in terms of the change in solid step number due to the change in pH. The smaller the change in the solid step number, the better the development latitude. The results thus obtained are listed in the following Table 6.

TABLE 6

| Ex. No. | Light-sensitive material | Sensitivity | Gradation | Development latitude |
|---|---|---|---|---|
| 19 | 1 | 6.0 | 5.5 | 6 |
| 20 | 2 | 6.25 | 5.0 | 5 |
| 21 | 3 | 6.25 | 5.0 | 5 |
| 22 | 4 | 6.0 | 5.25 | 6 |
| 23 | 5 | 6.0 | 5.5 | 5 |
| 24 | 6 | 6.0 | 5.25 | 6 |
| 10* | R1 | 5.75 | 6.0 | 7 |
| 11* | R2 | 5.75 | 6.25 | 7 |

*Comparative Example

As will be seen from the data listed in Table 6, the presensitized plate of the present invention could provide a lithographic printing plate, which could developed high contrast without lowering the sensitivity and had excellent development latitude (Examples 19 to 24). Contrary to this, the presensitized plates for lithographic printing plates (Comparative Examples 10 and 11) in which fluorine atom-containing polymers beyond the scope of the present invention were used showed sensitivities, gradations and development latitudes, which were all inferior to those observed for the product of the present invention.

Examples 25 to 29 and Comparative Examples 12 to 14

A belt-like aluminum plate having a thickness of 0.3 mm and a width of 1,000 mm was transported, first passed through a 10% aqueous solution of sodium tertiary phosphate maintained at 80° C. at a residence time of one minute to thus degrease the same. Then the aluminum plate was surface-grained using a nylon brush and a 400 mesh pumice stone-water suspension and sufficiently washed with water. The plate was etched by immersing it in a 25% sodium hydroxide aqueous solution maintained at 45° C. for 9 seconds, washed with water, further immersed in a 20% nitric acid solution for 20 seconds and washed with water. At this stage, the amount of the aluminum removed through the etching was found to be about 8 $g/m^2$. Then the plate was electrolyzed at a (DC) current density of 15 $A/dm^2$ in a 7% sulfuric acid solution as an electrolyte to thus form 3 $g/m^2$ of an anodized film on the plate, washed with water, dried and then supplied to the subsequent coating step.

In the coating step, the following coating liquid 2 for forming an image-forming layer was prepared.

| (Coating Liquid 2 for Image-Forming Layer) | |
|---|---|
| Ester of naphthoquinone-1,2-diazide-5-sulfonyl chloride and pyrogallol-acetone resin (product disclosed in Ex. 1 of U.S. Pat. No. 3,635,709) | 0.90 g |
| Cresol-formaldehyde resin (product disclosed in U.S. Pat. No. 4,123,279) | 2.00 g |
| t-Butylphenol-formaldehyde resin (disclosed in U.S. Pat. No. 4,123,279) | 0.05 g |
| Naphthoquinone-1,2-diazide-4-sulfonyl chloride | 0.03 g |
| Oil Blue #603 (available from ORIENT Chemical Industry Co., Ltd.) | 0.05 g |
| Fluorine atom-containing polymer (see Table 7) | 0.015 g |
| Methyl ethyl ketone | 8 g |
| Propylene glycol monomethyl ether | 25 g |

After continuously applying the foregoing coating solution onto the surface of the surface-grained belt-like aluminum plate at a rate of 30 $g/m^2$, the aluminum plate was dried by passing through a hot air-drying zone maintained at 100° C. at a residence time of one minute to dry the coated layer and to thus form a light-sensitive layer. The resulting presensitized plate for preparing a lithographic printing plate was inspected for the uniformity of the light-sensitive layer and the number of printed matter sufficiently receiving ink and printing durability of the printing plate prepared from the presensitized plate according to the test methods detailed below. The results thus obtained are listed in the following Table 7.

TABLE 7

| Ex. No. | F-Containing polymer | Uniformity of Light-sensitive layer | No. of printed matter sufficiently receiving ink | Printing Durability |
|---|---|---|---|---|
| 25 | (a) | A | 25 | 150,000 |
| 26 | (b) | A | 24 | 160,000 |
| 27 | (c) | A | 25 | 150,000 |
| 28 | (d) | A | 26 | 170,000 |
| 29 | (e) | A | 24 | 160,000 |
| 12* | (g) | B | 30 | 120,000 |
| 13* | (h) | A | 36 | 130,000 |
| 14* | Not added | D | 25 | 100,000 |

*Comparative Example

Uniformity of Light-Sensitive Layer

The surface of the light-sensitive layer of the resulting presensitized plate useful for preparing a lithographic printing plate was visually observed and the uniformity thereof was evaluated according to the following criteria:
A: Uniform and free of any irregularity;
B: There was observed slight unevenness;
C: There was observed unevenness due to, for instance, air stream used for drying;
D: There was observed severe unevenness due to, for instance, air stream used for drying.

The results listed in Table 7 clearly indicate that the uniformity of the light-sensitive layer in Examples 25 to 29 prepared using the fluorine atom-containing polymer according to the present invention is considerably improved as compared with that of Comparative Example 14 free of any such polymer. Moreover, the product of Comparative Example 12 prepared using a fluorine atom-containing polymer beyond the scope of the present invention is inferior in the uniformity of the coated film.

Ink-Receptivity

The presensitized plate was imagewise exposed through a film carrying images, developed at 25° C. for 40 seconds with automatic developer DP-4 (1:8) (available from Fuji Photo Film Co., Ltd.) in an automatic developing machine 800 U (available from Fuji Photo Film Co., Ltd.), followed by application of a gum solution (GP, available from Fuji Photo Film Co., Ltd.), printing after one week to determine the ink-receptivity, which was expressed in terms of the number of printed matters required till the printing plate completely received ink. The data listed in Table 7 indicate that the printing plates of Comparative Examples 12 and 13 are inferior in the ink-receptivity.

Printing Durability

As in the foregoing evaluation of ink-receptivity, each light-sensitive lithographic printing plate was subjected to contact exposure with an original film and then developed with the same developer. As a result, it was found that the light-sensitive lithographic printing plates of Examples 25 to 29 were excellent in the sensitivity and could uniformly reproduce the original pattern. The printing operations were conducted using these printing plates and it was confirmed that they were excellent in the printing durability and could provide excellent images showing uniform strength.

Example 30 and Comparative Examples 15, 16

After surface-graining an aluminum plate of the quality IS having a thickness of 0.30 mm using No. 8 nylon brush and an aqueous suspension of 800 mesh pumice stone, the plate was sufficiently washed with water. Then the aluminum plate was etched by immersing it in a 10% sodium hydroxide solution at 70° C. for 60 seconds, washed with running water, neutralized and washed with a 20% $HNO_3$ solution and washed with water. The aluminum plate was subjected to an electrolytic surface roughening treatment at the quantity of electricity at the anode time of 300 coulomb/$dm^2$ in a 1% aqueous nitric acid solution at VA=12.7 V using a sinusoidal alternating waved current. The surface roughness of the plate was determined and it was found to be 0.45 μm (as expressed in terms of Ra unit). Subsequently, the aluminum plate was desmutted by immersing it in a 30% aqueous sulfuric acid solution maintained at 55° C. for 2 minutes and anodized at a current density of 5 A/$dm^2$ in a 20% aqueous sulfuric acid solution maintained at 33° C., while placing a cathode on the side of the grained surface of the aluminum plate. As a result, the thickness of the resulting anodized film was found to be 2.7 g/$m^2$.

Further, the aluminum plate was immersed in a 2.5% by weight aqueous solution of No. 3 sodium silicate ($SiO_2$=28–30%, $Na_2O$=9–10%, Fe=not more than 0.02) having a pH value of 11.2 and maintained at 70° C. for 13 seconds and then washed with water. At this stage, the amount of the silicate was found to be 10 mg/$m^2$. This was determined by measuring the amount of Si element by the fluorescent X-ray analysis. Then a liquid composition (a sol) for the SG method was prepared by the following procedures. The following composition was weighed out into a beaker and stirred at 25° C. for 20 minutes.

| (Sol) | |
|---|---|
| $Si(OC_2H_5)_4$ | 38 g |
| 3-Methacryloxypropyl-trimethoxy silane | 13 g |
| 85% phosphoric acid aqueous solution | 12 g |
| Ion-exchanged water | 15 g |
| Methanol | 100 g |

This solution was transferred to a three-necked flask and the three-necked flask equipped with a reflux condenser was immersed in an oil bath maintained at room temperature. The contents of the three-necked flask were heated to 50° C. over 30 minutes, while stirring them with a magnetic stirrer. The contents of the flask were further reacted for one hour while maintaining the bath temperature at 50° C. to thus give a liquid composition (a sol). This sol was diluted with a methanol/ethylene glycol (20/1, weight ratio) mixture so that the concentration thereof was adjusted to 0.5% by weight, the diluted sol was applied onto the surface of a substrate by a whirler and then dried at 100° C. for one minute. At this stage, the coated amount of the sol was found to be 4 mg/$m^2$. The coated amount was expressed in terms of the amount of Si element determined by the fluorescent X-ray analysis. A coating solution 3 for forming an image-forming layer as a highly sensitive photopolymerizable composition having the following composition was applied onto the surface of the aluminum plate thus treated so that the coated amount was equal to 1.5 g/$m^2$ and then dried at 100° C. for one minute to form an image-forming layer.

(Coating Solution 3 for Forming an Image-Forming Layer (Photopolymerizable Composition))

| | |
|---|---|
| Tetra-methylol methane tetra-acrylate | 1.5 g |
| Linear organic high molecular weight polymer (B1) (allyl methacrylate/methacrylic acid copolymer, copolymerization molar ratio: 80/20, Mw = 45,000) | 2.0 g |
| Sensitizer (C1) (λ max THF 479 nm, ε = 6.9 × $10^4$) | 0.15 g |
| Photopolymerization initiator (D1) | 0.2 g |
| IRGACURE 907 (E1) (available from Ciba-Geigy Company) | 0.4 g |
| Fluorine atom-containing polymer (a) | 0.2 g |
| γ-Phthalocyanine/(B1) dispersion | 0.2 g |
| Methyl ethyl ketone | 9.0 g |
| Propylene glycol monomethyl ether acetate | 7.5 g |
| Toluene | 11.0 g |

Structures of the sensitizer (C1) and the photopolymerization initiator (D1) will be given below:

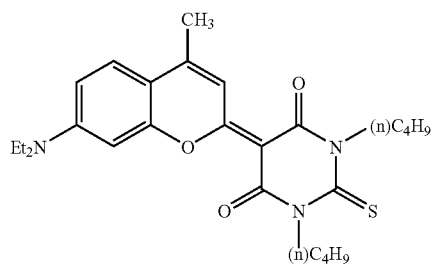

(C1)

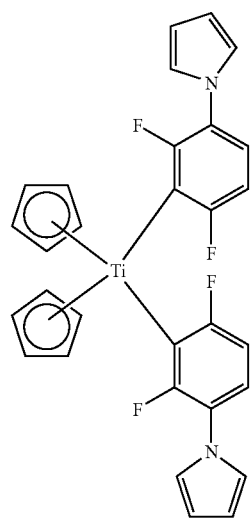

(D1)

A 3% by weight aqueous solution of a polyvinyl alcohol (degree of saponification: 98 mole %, degree of polymerization: 500) as an oxygen-barrier protective layer was applied onto the image-forming layer in an amount of 2.5 g/m² (weighed after drying) and then dried at 120° C. for 3 minutes to give a photopolymerizable presensitized plate for preparing a lithographic printing plate. The uniformity of the image-forming film was found to be excellent (Example 30). On the other hand, when omitting the fluorine atom-containing polymer (P-9) from the composition of the foregoing image-forming layer, the resulting film was found to be full of spots and non-uniform (Comparative Example 15). Moreover, the same procedures were repeated except that the foregoing R-1 was substituted for P-9 to give a comparative light-sensitive solution. As a result, it was found that the foaming ability was inhibited in the system comprising P-9, but it was very high in the system comprising R-1 and the number of pinhole per unit area (1 m²) was found to be not less than 10 for the system comprising R-1 (Comparative Example 16).

The resulting presensitized plate was exposed to light at an exposure value of 4000 dpi and 175 lines/inch using XLP 4000 (Ar laser of 75 mW, 488 nm) available from Optronics Company in such a manner that each plate was exposed at two portions over the range of from 1 to 99% by 1% at a step. Thereafter the plate was subjected to a post-heating treatment by exposing it to 120° C. for 20 seconds.

The plate was developed by immersing the same in the following developer 2 at 25° C. for 30 seconds:

| (Developer 2) | |
| --- | --- |
| Potassium silicate 1K | 30 g |
| Potassium hydroxide | 15 g |
| Water | 1000 g |

Then the plate surface was processed with a gum liquid GU-7 (available from Fuji Photo Film Co., Ltd.) diluted two times with water. The quantity of plate surface energy reproduced by 1% under the conditions of an exposure value of 4000 dpi and 175 lines/inch was determined as the sensitivity of each sample and it was found to be 0.2 mJ, which was practically sufficient. Moreover, the quality of half tone dots at that exposure value was likewise excellent and there was not observed any undesirable fog and flare. The plate was subjected to a test for examining printing durability using SORKZ available from Heidelberg Company as a printing press and KURAF G (N) available from Dainippon Ink and Chemicals, Inc. as ink and it was found that the plate could provide not less than 180,000 good printed matters (Example 30).

Further, the light-sensitive material was stored at 60° C. for 3 days, thereafter the same procedures used above were repeated for the imagewise exposure, development and printing and the plate was visually inspected for the stability with time. As a result, it was found that all of the printing durability, resistance to stain and the image quality were good and almost identical to those observed immediately after the preparation of the light-sensitive material.

Next, a thermally cross-linkable presensitized plate for preparing a lithographic printing plate will be detailed below with reference to the following Examples.

Example 31

After degreasing an aluminum plate (aluminum material 1050) having a thickness of 0.30 mm by washing with trichloro-ethylene, the aluminum plate was surface-grained using a nylon brush and a 400 mesh pumice stone-water suspension and then the plate was sufficiently washed with water. After etching the plate by immersing it in a 25% aqueous sodium hydroxide solution maintained at 45° C. for 9 seconds and washing the plate with water, it was further immersed in a 2% nitric acid solution for 20 seconds and then washed with water. At this stage, the amount of the aluminum removed from the grained surface through the etching was found to be about 3 g/m². Then the plate was anodized by passing a DC current through the plate in a 7% sulfuric acid solution as an electrolyte at a current density of 15 A/dm² so that the anodized film formed amounted to 3 g/m² and then washed with water and dried.

Then the following liquid 2 for under coating was applied onto the surface of the aluminum plate and dried at 80° C. for 30 seconds. The coated amount as determined after drying was found to be 10 mg/m².

| (Liquid 2 for Under Coating) | |
| --- | --- |
| β-Alanine | 0.1 g |
| Phenyl phosphonic acid | 0.05 g |
| Methanol | 40 g |
| Pure water | 60 g |

Then the following coating solution 4 for preparing an image-forming layer was prepared, applied onto the aluminum plate on which an under coat layer had been formed, dried at 100° C. for one minute to give a negative presensitized plate useful for preparing a lithographic printing plate. The surface condition of the coated layer was uniform and excellent. The coated amount weighed after drying was found to be 1.5 g/m².

| (Coating solution 4 for image-forming layer) | |
|---|---|
| Fluorine atom-containing polymer (b) | 0.05 g |
| Acid-generating agent (SH-1) | 0.3 g |
| Cross-linking agent (KZ-1) | 0.5 g |
| Binder polymer (BP-1) | 1.5 g |
| Infrared-absorbing agent (IK-1) | 0.07 g |
| Aizen Spilon Blue C-RH (available from Hodogaya Chemical Co., Ltd.) | 0.035 g |
| Methyl ethyl ketone | 12 g |
| Methyl alcohol | 10 g |
| 1-Methoxy-2-propanol | 8 g |

The structure of the cross-linking agent (KZ-1) will be given below:

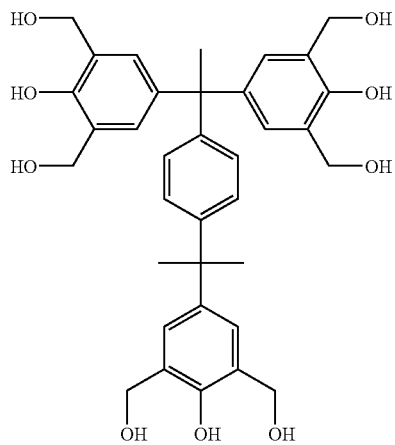

KZ-1

The binder polymer (BP-1) was MARUKA Linker MS-4P (trade name of a poly(p-hydroxy-styrene) available from Maruzen Petrochemical Co., Ltd.).

The structures of the acid-generating agent (SH-1) and the infrared-absorbing agent (IK-1) will be given below:

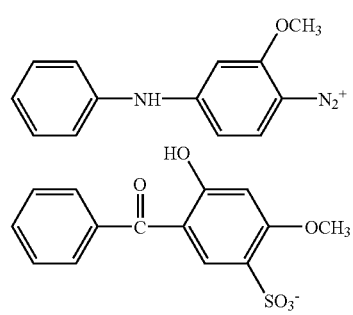

(SH-1)

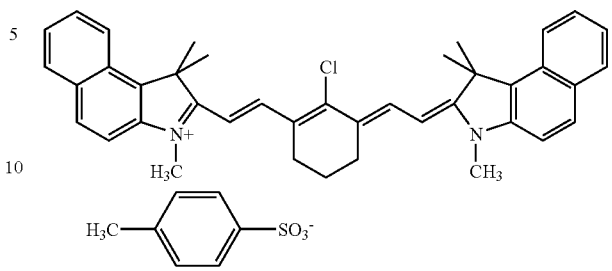

(IK-1)

The resulting negative presensitized plate useful for preparing a lithographic printing plate was touched with bare hands and then subjected to scanning exposure using a semiconductor laser emitting infrared light rays having a wavelength ranging from 820 to 850 nm. After the completion of the exposure and heat-treatment at 110° C. for 30 seconds using a panel heater, the exposed plate was developed with a developer DP-4 (diluted 1:8 with water; available from Fuji Photo Film Co., Ltd.). After the formation of images, the plate was visually inspected for the presence of any slipping of the images on the portion touched with bare hands, but there was not observed any slipping of images.

Separately, the whole surface of the presensitized plate (1 m²) was exposed to light, treated with 100 ml of a developer and then the developer after the processing was inspected for the presence of sludge. As a result, there was not observed the formation of any sludge and thus it was confirmed that the presensitized plate was excellent in the solubility in the developer.

Comparative Example 17

The same procedures used in Example 31 were repeated except that the fluorine atom-containing polymer (b) was not used in the solution (coating solution 4 for image-forming layer) to thus form a coating solution. This solution was applied onto the surface of the aluminum plate used in Example 31 on which an under coat layer had been formed and then dried at 100° C. for one minute to give a negative plate material for lithographic printing plates. The surface of the coated layer was found to be full of spots and non-uniform. Then images were formed on the presensitized plate according to the same procedures used in Example 31. After the formation of images, the plate was visually inspected for the presence of any slipping of the images on the portion touched with bare hands and there was observed distinct slipping of images.

Comparative Example 18

The same procedures used in Example 31 were repeated except that the fluorine atom-containing polymer (g) was substituted for the fluorine atom-containing polymer (b) used in the solution (coating solution 4 for image-forming layer) to thus form a coating solution. This solution was applied onto the surface of the aluminum plate used in Example 31 on which an under coat layer had been formed and then dried at 100° C. for one minute to give a negative plate material for lithographic printing plates. Then images were formed on the presensitized plate according to the same procedures used in Example 31. After the formation of images, the plate was visually inspected for the presence of any slipping of the images on the portion touched with bare hands and there was observed distinct slipping of images.

Separately, the whole surface of the presensitized plate (1 m$^2$) was exposed to light, treated with 100 ml of a developer and then the developer after the processing was inspected for the presence of sludge. As a result, there was distinctly observed the formation of sludge and thus it was confirmed that the presensitized plate was inferior in the solubility and/or dispersibility in the developer.

Then the thermal positive presensitized plate useful for preparing a lithographic printing plate will be explained in detail below with reference to the following Examples.

Example 32

[Preparation of Copolymer 1]

To a 20 ml three-necked flask equipped with a stirring machine, a cooling pipe and a dropping funnel, there were added 4.61 g (0.0192 M) of N-(p-amino-sulfonyl-phenyl) methacrylamide, 2.94 g (0.0258 M) of ethyl methacrylate, 0.80 g (0.015 M) of acrylonitrile and 20 g of N,N-dimethylacetamide and the mixture was stirred while heating the same to 65° C. in a hot water bath. To this mixture, there was added 0.15 g of "V-65" (WACO Pure Chemical Co., Ltd.) and the mixture was stirred for 2 hours in a nitrogen gas stream while maintaining the temperature thereof at 65° C. To this reaction mixture, there was further dropwise added, through the dropping funnel over 2 hours, a mixture comprising 4.61 g of N-(p-amino-sulfonyl-phenyl) methacrylamide, 2.94 g of ethyl methacrylate, 0.80 g of acrylonitrile, N,N-dimethylacetamide and 0.15 g of "V-65".

After the dropwise addition, the resulting mixture was further stirred at 65° C. for 2 hours. After the completion of the reaction, 40 g of methanol was added to the mixture, the mixture was cooled, the resulting mixture was charged into 2 L of water with stirring, the mixture was then stirred for 30 minutes, precipitates formed were removed through filtration and dried to give 15 g of white solid. The weight average molecular weight of this specific copolymer 1 was determined by the gel permeation chromatography (polystyrene standard) and it was found to be 53,000.

[Preparation of Substrate]

After degreasing an aluminum plate (aluminum material 1050) having a thickness of 0.30 mm by washing with trichloro-ethylene, the aluminum plate was surface-grained using a nylon brush and a 400 mesh pumice stone-water suspension and then the plate was sufficiently washed with water. After etching the plate by immersing it in a 25% aqueous sodium hydroxide solution maintained at 45° C. for 9 seconds and washing the plate with water, it was further immersed in a 20% nitric acid solution for 20 seconds and then washed with water. At this stage, the amount of the aluminum removed from the grained surface through the etching was found to be about 3 g/m$^2$. Then the plate was anodized by passing a DC current through the plate in a 7% sulfuric acid solution as an electrolyte at a current density of 15 A/dm$^2$ so that the anodized film formed amounted to 3 g/m$^2$ and then washed with water and dried. Then the following liquid 3 for under coating was applied onto the surface of the aluminum plate and dried at 90° C. for one minute. The coated amount as determined after drying was found to be 10 mg/m$^2$.

| (Liquid 3 for Under Coating) | |
|---|---|
| β-Alanine | 0.5 g |
| Methanol | 95 g |
| Pure water | 5 g |

Further, the plate was treated with a 2.5% by weight aqueous solution of sodium silicate at 30° C. for 10 seconds, the following liquid 4 for under coating was applied onto the surface of the plate and dried at 80° C. for 15 seconds to give a substrate. The coated amount as determined after drying was found to be 15 mg/m$^2$.

| (Liquid 4 for Under Coating) | |
|---|---|
| The following compound | 0.3 g |
| Methanol | 100 g |
| Water | 1 g |

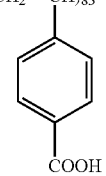

Molecular weight: 28,000

The following coating solution 5 for forming an image-forming layer was prepared. This light-sensitive liquid 5 was applied onto the substrate obtained by the foregoing method so that the coated amount thereof was amounted to 1.8 g/m$^2$ to thus give a presensitized plate useful for preparing a lithographic printing plate excellent in the surface condition of the image-forming layer thereof.

| (Coating solution 5 for image-forming layer) | |
|---|---|
| Fluorine atom-containing polymer (a) | 0.02 g |
| The foregoing copolymer 1 | 0.75 g |
| m,p-Cresol novolak (m/p ratio = 6/4, Mw = 3,500, un-reacted cresol content: 0.5% by weight | 0.25 g |
| p-Toluene-sulfonic acid | 0.003 g |
| Tetrahydro-phthalic acid anhydride | 0.03 g |
| Cyanine dye (IK-1) | 0.017 g |
| Dye obtained by substituting 1-naphthalene sulfonic acid anion for the counter ion of Victoria Pure Blue BOH | 0.015 g |
| γ-Butyrolactone | 10 g |
| Methyl ethyl ketone | 10 g |
| 1-Methoxy-2-propanol | 1 g |

Regarding the resulting presensitized plate useful for preparing a lithographic printing plate, the development stability against external defects was evaluated by the following method. The light-sensitive surface of the presensitized plate was damaged by adhering filter paper "No. 5C" (available from Advantec Toyo Co., Ltd.) to a square flat portion (1 cm square) of the scratching tool, which came in contact with the plate surface and was fitted to a continuous loading scratch resistance tester "Model SB62" (available from Shinto Science Co., Ltd.) and moving the scratching tool at a speed of 6 cm/sec while applying a load of 100 g to the tool. Then the presensitized plate was imagewise exposed to laser beam having an output of 500 mW, a wavelength of 830 nm and a beam diameter of 17 μm (1/e$^2$) at a principal scanning speed of 5 m/sec so that a 5% half tone dot pattern was depicted and then developed with a developer DP-4 (1:8) (available from Fuji Photo Film Co., Ltd.) for 30 seconds. The resulting printing plate carried good half tone dot images, the image on the scratched portion was never dissolved out. Thus, it was confirmed that the lithographic printing plate prepared from the presensitized plate of the present invention showed good development stability against external defects of the printing plate.

Moreover, the foaming ability of the light-sensitive liquid was low and the surface condition of the coated layer was also good since the number of pinholes was found to be not more than 5 per 1 m$^2$.

Separately, the whole surface of the presensitized plate (1 m$^2$) was exposed to light, treated with 100 ml of a developer and then the developer after the processing was inspected for the presence of sludge. As a result, there was not observed the formation of any sludge and thus it was confirmed that the presensitized plate was excellent in the solubility in the developer.

Comparative Example 19

The same procedures used in Example 32 were repeated except that any fluorine atom-containing polymer was not used to give a presensitized plate useful for preparing a lithographic printing plate. The resulting film was full of spots and the surface condition was found to be non-uniform. Then the presensitized plate was inspected for the development stability against external defects by the method similar to that used in Example 32. In the scratched portion, the unexposed half tone dot, which, in itself, should remain as an image, was removed through the development.

Comparative Example 20

The same procedures used in Example 32 were repeated except that the fluorine atom-containing polymer (h) was substituted for the polymer used therein to form a presensitized plate useful for preparing a lithographic printing plate. There were observed not less than 15 pinholes per unit area (1 m$^2$) and thus, the surface condition thereof was inferior.

Then the presensitized plate was inspected for the development stability against external defects by the method similar to that used in Example 32. In the scratched portion, the unexposed half tone dot, which, in itself, should remain as an image, was removed through the development.

Separately, the whole surface of the presensitized plate (1 m$^2$) was exposed to light, treated with 100 ml of a developer and then the developer after the processing was inspected for the presence of sludge. As a result, there was distinctly observed the formation of sludge and thus it was confirmed that the presensitized plate was inferior in the solubility and/or dispersibility in the developer.

The results obtained in Example 32 and Comparative Examples 19, 20 clearly indicate that the addition of a specific fluorine atom-containing polymer would permit the preparation of a light-sensitive liquid capable of forming a film showing good surface conditions, the improvement of the stability, to external defects, of the image-forming layer prior to the development, the improvement of the image-forming layer in the solubility and dispersibility in a developer and the prevention of the generation of any sludge.

Then the radical-polymerizable thermal negative presensitized plate useful for preparing a lithographic printing plate will be described below with reference to the following Examples.

Example 33

[Preparation of Substrate]

Molten metal comprising not less than 99.5% of aluminum, 0.30% of Fe, 0.1% of Si, 0.02% of Ti and 0.013% of Cu was subjected to a cleaning treatment and then a casting treatment. In the cleaning treatment, the molten metal was degassed for the removal of undesirable gases such as hydrogen gas present therein and subjected to a ceramic tube filtration treatment. The casting treatment was conducted according to the DC casting technique. The solidified ingot having a thickness of 500 nm was converted into an aluminum rolled plate having a thickness of 10 nm. The central line average surface roughness Ra after the cold rolling was controlled to 0.2 μm by adjusting the surface roughness of the pressure rolls. Thereafter, it was subjected to tension lever processing for the purpose of the improvement of the flatness.

The aluminum plate was subjected to surface-treatments to make a substrate for lithographic printing plates.

First, the plate was degreased at 50° C. for 30 seconds with a 10% sodium aluminate aqueous solution to thus remove the rolling oil present on the aluminum surface and then treated with a 30% aqueous sulfuric acid solution at 50° C. for 30 seconds to neutralize and desmut.

Then the plate was subjected to a surface-roughening treatment or a so-called surface-graining treatment for improving the adhesion of the substrate to the subsequently formed image-forming layer and for imparting water retention characteristics to non-image areas. An aqueous solution containing 1% nitric acid and 0.5% aluminum nitrate was maintained at 45° C. and an aluminum web was electrolytically grained at a current density of 20 A/dm$^2$ using an alternating waved current having a duty ratio of 1:1 in an indirect power supply cell, while feeding the web to the aqueous solution and the quantity of electricity at the anode side was set at 240 C/dm$^2$. Then the web was etched at 50° C. for 30 seconds with a 10% aqueous sodium aluminate solution and treated with a 30% aqueous sulfuric acid solution at 50° C. for 30 seconds to neutralize and desmut the same.

Moreover, the aluminum plate was anodized to form an anodized film thereon in order to improve the wear resistance, resistance to chemicals and water retention characteristics. More specifically, the aluminum web was electrolyzed in an indirect power supply cell by passing a DC current of 14 A/dm$^2$ through the web in a 20% aqueous sulfuric acid solution as an electrolyte, while conveying the web in the electrolyte to thus form 2.5 g/m$^2$ of an anodized film.

[Under Coat]

Then the following under coat liquid 5 was applied onto this aluminum substrate using a wire bar so that the solid content of the film weighed after drying was amounted to 5 mg/m$^2$. and then dried at 90° C. for 30 seconds using a warm air dryer.

| (Under Coat liquid 5) | |
|---|---|
| 2-Aminoethyl-phosphonic acid | 0.1 g |
| Phenyl-phosphonic acid | 0.1 g |
| Methanol | 75 g |
| Water | 25 g |

The following coating solution 6 for image-forming layers was applied onto the substrate on which the under coat layer had been formed using a wire bar and then dried at 115° C. for 45 seconds in a warm air dryer to give a negative presensitized plate useful for preparing a lithographic printing plate. The surface condition of the coated layer was uniform and excellent. The coated amount thereof was found to be 1.3 g/m².

| (Coating solution 6 for image-forming layer) | |
|---|---|
| Light-heat transforming agent (cyanine dye TN-1) | 0.10 g |
| Thermally radical-generating agent (sulfonium salt compound TN-2) | 0.30 g |
| Addition-polymerizable unsaturated compound (dipentaerythritol hexa-acrylate) | 1.00 g |
| Alkali-soluble binder polymer (copolymer of allyl methacrylate with methacrylic acid; copolymerization molar ratio: 83:17, Mw = 125,000) | 1.2 g |
| Coloring agent (naphthalene sulfonic acid salt of Victoria Pure Blue) | 0.04 g |
| Fluorine atom-containing polymer (c) | 0.005 g |
| Methyl ethyl ketone | |
| 1-Methoxy-2-propanol | |

The structures of TN-1 (cyanine dye) and TN-2 (sulfonium salt compound) are as follows, respectively:

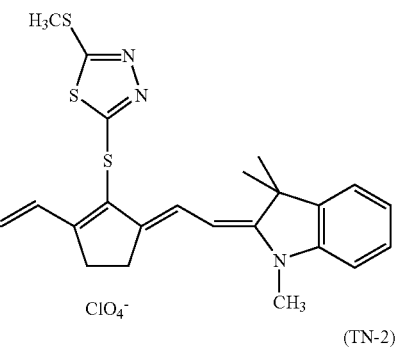

(TN-1)

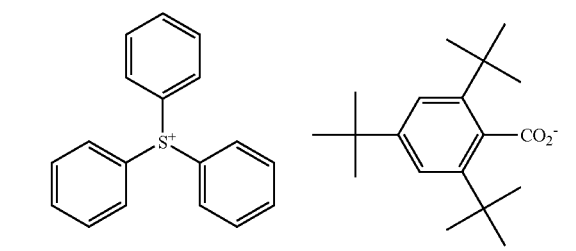

(TN-2)

The resulting negative presensitized plate useful for preparing a lithographic printing plate was subjected to image-wise exposure so as to form 50% half tone dot images using Trendsetter 3244VFS equipped with a water-cooled 40W infrared semiconductor laser at an output of 9W, a rotational number of the outer drum of 210 rpm, a plate surface energy of 100 mJ/cm² and a resolution of 2400 dpi.

Then the exposed plate was developed using an automatic developing machine STABRON 900N (available from Fuji Photo Film Co., Ltd.). The developer and replenisher used had the following compositions. The temperature of the developing bath was set at 30° C. Moreover, the finisher used herein was FN-6 (diluted 1:1 with water, pH=10.8) (available from Fuji Photo Film Co., Ltd.).

| (Developer) | |
|---|---|
| Potassium hydroxide | 3 g |
| Potassium hydrogen carbonate | 1 g |
| Potassium carbonate | 2 g |
| Sodium sulfite | 1 g |
| Polyethylene glycol mono-naphthyl ether | 150 g |
| Sodium salt of dibutyl-naphthalene sulfonic acid | 50 g |
| Tetra-sodium salt of ethylenediaminetetraacetic acid | 8 g |
| Water | 785 g |
| (Replenisher) | |
| Potassium hydroxide | 6 g |
| Potassium carbonate | 2 g |
| Sodium sulfite | 1 g |
| Polyethylene glycol mono-naphthyl ether | 150 g |
| Sodium salt of dibutyl-naphthalene sulfonic acid | 50 g |
| Potassium salt of hydroxy-ethane di-phosphonic acid | 4 g |
| Silicone TSA-731 (available from Toshiba Silicone Co., Ltd.) | 0.1 g |
| Water | 786.9 g |

Thus, the presensitized plate provided uniform and excellent half tone dot images. The resulting lithographic printing plate was installed to a printing press Heidel SOR-M (available from Heidelberg Company) to obtain printed matters. As a result, the printed matters thus obtained were not less than 110,000.

In addition, the light-sensitive liquid of this example had low foaming ability, the time required for disappearing foams was less than 5 minutes and the surface condition was good (the number of pinholes per 1 m² was found to be not more than 5).

Separately, the whole surface of the presensitized plate (1 m²) was exposed to light, treated with 100 ml of a developer and then the developer after the processing was inspected for the presence of sludge. As a result, there was not observed the formation of any sludge and thus it was confirmed that the presensitized plate was excellent in the solubility in the developer.

Comparative Example 21

The same procedures used in Example 33 were repeated except that the fluorine atom-containing polymer was omitted from the light-sensitive liquid to give a presensitized plate useful for preparing a lithographic printing plate. The uniformity of the image-forming layer was found to be insufficient. Moreover, the presensitized plate was exposed to light and developed by the same method used in Example 33 and it was found that defects were formed on the half tone dot images.

Comparative Example 22

The same procedures used in Example 33 were repeated except that a fluorine atom-containing polymer (g) was substituted for the polymer used in the foregoing light-sensitive solution to thus form a presensitized plate useful for preparing a lithographic printing plate. The light-sensitive solution possessed a high foaming ability, it took not less than 30 minutes for disappearing foams and accordingly, this light-sensitive solution was inferior in the production efficiency and cost. The uniformity of the image-forming layer was found to be insufficient. Moreover, the presensitized plate was exposed to light and developed by the same method used in Example 33 and it was found that defects were formed on the half tone dot images.

Separately, the whole surface of the presensitized plate (1 m$^2$) was exposed to light, treated with 100 ml of a developer and then the developer after the processing was inspected for the presence of sludge. As a result, there was distinctly observed the formation of sludge and thus it was confirmed that the presensitized plate was inferior in the solubility and/or dispersibility in the developer.

The results obtained in Example 33 and Comparative Examples 21, 22 clearly indicate that the use of a particular fluorine atom-containing polymer specified in the present invention permits the preparation of a thermal negative lithographic printing plate, which possesses good or uniform surface conditions and has image area showing an improved resistance to developer, and it also permits the improvement of the image-forming layer in the solubility and dispersibility in a developer and the prevention of the generation of any sludge.

[Effects of the Invention]

The use of the fluorine atom-containing polymer of the present invention in a light-sensitive liquid permits the simultaneous achievement of the ability to wet the surface of a substrate, the ability of uniform coating upon the application thereof and the post-processing aptitude such as re-coating ability after the coating and the developing ability as well as anti-foaming ability. Moreover, the use of such a polymer permits the preparation of a presensitized plate useful for preparing a lithographic printing plate, which is characterized in that it comprises an image-forming layer comprising a fluoroaliphatic group-containing copolymer obtained by copolymerizing at least monomers (A) and (B), whose image-forming layer can be formed without accompanied by any drawbacks such as foaming and thus has uniform surface conditions and which can provide a lithographic printing plate excellent in the developing ability and ink-receptivity.

The fluorine atom-containing polymer of the present invention may suitably used in fields of coating, for instance, photolithography processes, which make use of photo resists sensitive to radiant rays such as ultraviolet rays, far ultraviolet rays, excimer laser light and X-rays and more specifically, processes for manufacturing semiconductors such as LSI and IC, processes for producing substrate for liquid crystals and thermal heads, processes for producing PS plates and other photo fabrication processes. Moreover, the fluorine atom-containing polymer of the present invention may likewise be suitably used in cosmetics, fiber-processing agents, medical supplies, oxygen-rich films and additives for a variety of lubricants, or as various agents such as paint removers, resist-peeling agents, foaming agents for washing and surface-modifiers.

What is claimed is:

1. A presensitized plate useful for preparing a lithographic printing plate comprising a substrate provided thereon with an image-forming layer formed from an image-forming composition comprising a copolymer, which consists essentially of repeating units derived from monomers (A), (B) and (C) wherein (A) is at least one fluoroalkyl (meth) acrylate represented by the following general formula (I) or (II):

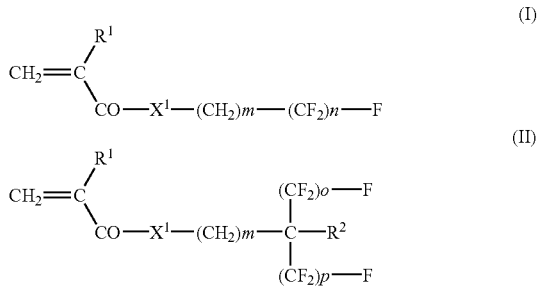

wherein, $X^1$ represents —O— or —NR$^3$—; R$^1$ represents —H or —CH$_3$; R$^3$ represents a hydrogen atom, a substituted or unsubstituted alkyl group having 1 to 12 carbon atoms, a substituted or unsubstituted cycloalkyl group having 3 to 12 carbon atoms, a substituted or unsubstituted aryl group having 6 to 12 carbon atoms or a substituted or unsubstituted aralkyl group having 7 to 24 carbon atoms; R$^2$ represents H or F; m is an integer ranging from 0 to 10; n is an integer of 2 or 3; and o and p each represents an integer of 1 or 2, (B) is at least one polyoxyalkylene group-containing ethylenically unsaturated monomer represented by the following general formula (III):

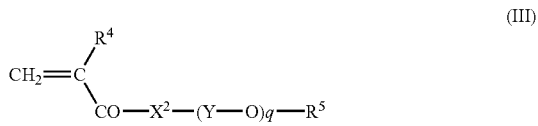

wherein $X^2$ represents —O— or —NR$^6$—, Y represents a linear or branched alkylene group having 2 to 4 carbon atoms, R$^4$ represents —H or —CH$_3$, R$^5$ represents a hydrogen atom, a substituted or unsubstituted alkyl group having 1 to 12 carbon atoms, a substituted or unsubstituted cycloalkyl group having 3 to 12 carbon atoms, a substituted or unsubstituted aryl group having 6 to 12 carbon atoms or a substituted or unsubstituted aralkyl group having 7 to 24 carbon atoms, R$^6$ represents a substituted or unsubstituted alkyl group having 1 to 12 carbon atoms, a substituted or unsubstituted cycloalkyl group having 3 to 12 carbon atoms, a substituted or unsubstituted aryl group having 6 to 12 carbon atoms or a substituted or unsubstituted aralkyl group having 7 to 24 carbon atoms, g ranges from 2 to 50, a plurality of substituents Y are the same or different, and (C) is selected from the group consisting of: acrylic acid; methacrylic acid; acrylic acid esters selected from the group consisting of methyl acrylate, ethyl acrylate, propyl acrylate, chloroethyl acrylate, 2-hydroxyethyl acrylate, trimethylol propane monoacrylate, benzyl acrylate, methoxybenzyl acrylate, furfuryl acrylate and tetrahydrofurfuryl acrylate; methacrylic acid esters selected from the group consisting of methyl methacrylate, ethyl methacrylate, propyl methacrylate, chloroethyl methacrylate, 2-hydroxyethyl methacrylate, trimethylol propane monomethacrylate, benzyl methacrylate, methoxybenzyl methacrylate, furfuryl methacrylate and tetrahydrofurfuryl methacrylate; acrylamides selected from the group consisting of acrylamide, N-alkyl acrylamide wherein the alkyl group has 1 to 3 carbon atoms, N,N-dialkyl acrylamide wherein the alkyl group has 1 to 3 carbon atoms, N-hydroxyethyl-N-methyl acrylamide and N-2-acetamidoethyl-N-acetyl acrylamide; methacrylamides selected from the group consisting of methacrylamide, N-alkyl methacrylamide wherein the alkyl group has 1 to 3 carbon atoms, N,N-dialkyl methacrylamide wherein the alkyl group has 1 to 3 carbon atoms, N-hydroxyethyl-N-methyl methacrylamide and N-2-acetamidoethyl-N-acetyl methacrylamide; allyl compounds selected from the group consisting of allyl acetate, allyl caproate, allyl caprylate, allyl laurate, allyl palmitate, allyl stearate, allyl benzoate, allyl acetoacetate, allyl lactate and allyl oxyethanol; vinyl ethers selected from the group consisting of hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether; vinyl esters selected from the group consisting of vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxy acetate, vinyl butoxy acetate, vinyl lactate, vinyl-β-phenyl butyrate and vinyl cyclohexyl carboxylate; dialkyl itaconates selected from the group consisting of dimethyl itaconate, diethyl itaconate and dibutyl itaconate; dibutyl fumarate; crotonic acid; itaconic acid; acrylonitrile; methacrylonitrile; maleylonitrile; and styrene.

2. The presensitized plate of claim 1, wherein the repeating units derived from copolymerizable monomers other than derived from monomers (A) and (B) are present in a rate of not more than 30% by weight on the basis of the total weight of the fluorine atom-containing polymer.

3. The presensitized plate of claim 1, wherein the amount of the monomer (A) ranges from 5 to 90% by weight on the basis of the total weight of the fluorine atom-containing polymer.

4. The presensitized plate of claim 1, wherein the weight average molecular weight of the copolymer ranges from 3,000 to 200,000.

* * * * *